(12) United States Patent
Ikeda et al.

(10) Patent No.: US 12,165,049 B2
(45) Date of Patent: Dec. 10, 2024

(54) IMAGING DEVICE, IMAGING MODULE, ELECTRONIC DEVICE, AND IMAGING SYSTEM

(71) Applicant: Semiconductor Energy Laboratory Co., Ltd., Atsugi (JP)

(72) Inventors: Takayuki Ikeda, Atsugi (JP); Takahiro Fukutome, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/201,217

(22) Filed: May 24, 2023

(65) Prior Publication Data

US 2023/0297822 A1    Sep. 21, 2023

Related U.S. Application Data

(63) Continuation of application No. 16/831,085, filed on Mar. 26, 2020, now Pat. No. 11,699,068, which is a (Continued)

(30) Foreign Application Priority Data

Aug. 3, 2016 (JP) ................... 2016-153192
Aug. 3, 2016 (JP) ................... 2016-153194

(51) Int. Cl.
*G06N 3/067* (2006.01)
*G06N 3/04* (2023.01)
(Continued)

(52) U.S. Cl.
CPC ............. *G06N 3/0675* (2013.01); *G06N 3/04* (2013.01); *G06N 3/065* (2023.01);
(Continued)

(58) Field of Classification Search
CPC ........ G06N 3/0675; G06N 3/04; G06N 3/065; G06N 3/08; H01L 27/14609;
(Continued)

(56) References Cited

U.S. PATENT DOCUMENTS 5,161,014 A * 11/1992 Pearson ................ G06N 3/049
                                                                380/216
5,331,422 A    7/1994 Nishida
(Continued)

FOREIGN PATENT DOCUMENTS

CN    102726037 A    10/2012
CN    103548042 A    1/2014
(Continued)

OTHER PUBLICATIONS

International Search Report (Application No. PCT/IB2017/054457) Dated Nov. 7, 2017.
(Continued)

*Primary Examiner* — Ahmed A Berhan
(74) *Attorney, Agent, or Firm* — Eric J. Robinson; Robinson Intellectual Property Law Office, P.C.

(57) ABSTRACT

An imaging device connected to a neural network is provided. An imaging device having a neuron in a neural network includes a plurality of first pixels, a first circuit, a second circuit, and a third circuit. Each of the plurality of first pixels includes a photoelectric conversion element. The plurality of first pixels is electrically connected to the first circuit. The first circuit is electrically connected to the second circuit. The second circuit is electrically connected to the third circuit. Each of the plurality of first pixels generates an input signal of the neuron. The first circuit, the second circuit, and the third circuit function as the neuron. The third circuit includes an interface connected to the neural network.

5 Claims, 31 Drawing Sheets

Related U.S. Application Data continuation of application No. 15/661,318, filed on Jul. 27, 2017, now abandoned.

(51) Int. Cl.

| | | |
|---|---|---|
| *G06N 3/065* | (2023.01) | |
| *H01L 27/146* | (2006.01) | |
| *H01L 29/786* | (2006.01) | |
| *H04N 23/57* | (2023.01) | |
| *H04N 25/75* | (2023.01) | |
| *H04N 25/77* | (2023.01) | |
| *H01L 27/12* | (2006.01) | |

(52) U.S. Cl.
CPC .. *H01L 27/14609* (2013.01); *H01L 27/14616* (2013.01); *H01L 27/14618* (2013.01); *H04N 23/57* (2023.01); *H04N 25/75* (2023.01); *H04N 25/77* (2023.01); *H01L 27/1225* (2013.01); *H01L 27/14627* (2013.01); *H01L 27/14636* (2013.01); *H01L 27/1464* (2013.01); *H01L 27/14689* (2013.01); *H01L 29/78633* (2013.01); *H01L 29/78648* (2013.01); *H01L 29/7869* (2013.01); *H01L 29/78696* (2013.01); *H01L 2224/48091* (2013.01)

(58) Field of Classification Search
CPC ......... H01L 27/14616; H01L 27/14618; H01L 27/1225; H01L 27/14627; H01L 27/14636; H01L 27/1464; H01L 27/14689; H01L 29/78633; H01L 29/78648; H01L 29/7869; H01L 29/78696; H01L 2224/48091; H01L 27/14614; H04N 23/57; H04N 25/75; H04N 25/77; H04N 23/54; H04N 25/70; H04N 25/79; H04N 25/78

See application file for complete search history.

(56) References Cited

U.S. PATENT DOCUMENTS

| | | |
|---|---|---|
| 5,497,196 A | 3/1996 | Nishida |
| 5,577,178 A | 11/1996 | Curry et al. |
| 5,815,608 A | 9/1998 | Lange et al. |
| 5,901,246 A | 5/1999 | Hoffberg et al. |
| 5,926,057 A | 7/1999 | Ogawa et al. |
| 6,040,860 A | 3/2000 | Tamura et al. |
| 6,084,981 A * | 7/2000 | Horiba ............... G06N 3/04 706/20 |
| 6,310,987 B1 | 10/2001 | Koyama |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 8,154,640 B2 | 4/2012 | Cha et al. |
| 8,274,077 B2 | 9/2012 | Akimoto et al. |
| 8,378,391 B2 | 2/2013 | Koyama et al. |
| 8,466,463 B2 | 6/2013 | Akimoto et al. |
| 8,583,577 B2 | 11/2013 | Aparin |
| 8,629,069 B2 | 1/2014 | Akimoto et al. |
| 8,669,550 B2 | 3/2014 | Akimoto et al. |
| 8,698,906 B2 | 4/2014 | Imade |
| 8,790,959 B2 | 7/2014 | Akimoto et al. |
| 8,796,069 B2 | 8/2014 | Akimoto et al. |
| 8,916,869 B2 | 12/2014 | Koyama et al. |
| 8,926,933 B2 | 1/2015 | Zhang et al. |
| 9,007,503 B2 | 4/2015 | Oike |
| 9,099,562 B2 | 8/2015 | Akimoto et al. |
| 9,197,825 B2 | 11/2015 | Oike |
| 9,236,408 B2 | 1/2016 | Yamazaki |
| 9,331,112 B2 | 5/2016 | Koyama et al. |
| 9,443,893 B2 | 9/2016 | Yamazaki |
| 9,615,043 B2 | 4/2017 | Oike |
| 9,711,675 B2 | 7/2017 | Kim et al. |
| 9,748,292 B2 | 8/2017 | Yamazaki |
| 9,773,814 B2 | 9/2017 | Koyama et al. |
| 9,781,374 B2 | 10/2017 | Hashimoto et al. |
| 9,848,144 B2 | 12/2017 | Okamoto. et al. |
| 9,900,482 B2 | 2/2018 | Oike |
| 10,129,444 B2 | 11/2018 | Oike |
| 10,506,189 B2 | 12/2019 | Yoo et al. |
| 10,904,471 B2 | 1/2021 | Matsumoto et al. |
| 2004/0223391 A1* | 11/2004 | Erten ............... G06N 3/065 365/202 |
| 2007/0202797 A1 | 8/2007 | Ishibashi |
| 2008/0308805 A1 | 12/2008 | Akimoto et al. |
| 2009/0295938 A1 | 12/2009 | Nikkanen |
| 2011/0104851 A1 | 5/2011 | Akimoto et al. |
| 2011/0121290 A1 | 5/2011 | Akimoto et al. |
| 2012/0091340 A1 | 4/2012 | Young |
| 2012/0113119 A1 | 5/2012 | Massie |
| 2012/0303566 A1 | 11/2012 | Aparin |
| 2015/0332126 A1 | 11/2015 | Hikida |
| 2015/0340513 A1 | 11/2015 | Akimoto et al. |
| 2016/0006917 A1* | 1/2016 | Endo ............... H04N 25/75 348/296 |
| 2016/0014362 A1 | 1/2016 | Kurokawa |
| 2016/0037113 A1 | 2/2016 | Hashimoto et al. |
| 2016/0093273 A1 | 3/2016 | Wang et al. |
| 2016/0191833 A1 | 6/2016 | Higashi et al. |
| 2016/0343452 A1 | 11/2016 | Ikeda et al. |
| 2017/0063351 A1 | 3/2017 | Kurokawa |
| 2017/0116512 A1 | 4/2017 | Kurokawa |
| 2017/0118479 A1 | 4/2017 | Kurokawa |
| 2017/0263291 A1 | 9/2017 | Kurokawa |
| 2017/0270405 A1 | 9/2017 | Kurokawa |
| 2017/0366775 A1 | 12/2017 | Hashimoto et al. |
| 2019/0034748 A1* | 1/2019 | Matsumoto ............ G06N 3/045 |
| 2020/0077042 A1 | 3/2020 | Yoo et al. |
| 2021/0105426 A1 | 4/2021 | Matsumoto et al. |

FOREIGN PATENT DOCUMENTS

| | | |
|---|---|---|
| DE | 4310092 | 9/1993 |
| EP | 0725357 B | 6/2002 |
| EP | 1804300 A | 7/2007 |
| EP | 2528320 A | 11/2012 |
| EP | 3439288 A | 2/2019 |
| JP | 02-242488 A | 9/1990 |
| JP | 04-067259 A | 3/1992 |
| JP | 04-216160 A | 8/1992 |
| JP | 06-139361 A | 5/1994 |
| JP | 07-135293 A | 5/1995 |
| JP | 08-153194 A | 6/1996 |
| JP | 08-178637 A | 7/1996 |
| JP | 10-031551 A | 2/1998 |
| JP | 10-300165 A | 11/1998 |
| JP | 10-340349 A | 12/1998 |
| JP | 11-175653 A | 7/1999 |
| JP | 11-177889 A | 7/1999 |
| JP | 2001-094888 A | 4/2001 |
| JP | 2007-123861 A | 5/2007 |
| JP | 2010-283787 A | 12/2010 |
| JP | 2011-119711 A | 6/2011 |
| JP | 2013-009172 A | 1/2013 |
| JP | 2013-243355 A | 12/2013 |
| JP | 2014-032542 A | 2/2014 |
| JP | 2014-517973 | 7/2014 |
| JP | 2015-056700 A | 3/2015 |
| JP | 2016-028469 A | 2/2016 |
| JP | 2016-034102 A | 3/2016 |
| JP | 2016-139420 A | 8/2016 |
| KR | 2009-0107254 A | 10/2009 |
| KR | 2012-0023547 A | 3/2012 |
| KR | 2014-0027415 A | 3/2014 |
| KR | 2015-0052665 A | 5/2015 |
| KR | 2015-0142238 A | 12/2015 |
| KR | 2016-0010317 A | 1/2016 |
| KR | 2016-0038693 A | 4/2016 |
| TW | 200919210 | 5/2009 |
| TW | 200926033 | 6/2009 |
| WO | WO-2006/035610 | 4/2006 |

(56) References Cited

FOREIGN PATENT DOCUMENTS

| WO | WO-2012/162663 | 11/2012 |
| WO | WO-2015/037689 | 3/2015 |
| WO | WO-2017/168665 | 10/2017 |

OTHER PUBLICATIONS

Written Opinion (Application No. PCT/IB2017/054457) Dated Nov. 7, 2017.
Chinese Office Action (Application No. 202010129736.4) Dated Feb. 10, 2021.
Taiwanese Office Action (Application No. 106125618) Dated Mar. 4, 2021.
Chinese Office Action (Application No. 201780045424.1) Dated Nov. 11, 2022.

* cited by examiner 44a  45a  600

44a  660  45a  115

130

130a 130b
130

173 120 130c 170
160

140 130b 150
145 155

171 172
170

IMAGING DEVICE, IMAGING MODULE, ELECTRONIC DEVICE, AND IMAGING SYSTEM

TECHNICAL FIELD

One embodiment of the present invention relates to an imaging device, an imaging module, an electronic device, and an imaging system.

Note that one embodiment of the present invention is not limited to the above technical field. The technical field of one embodiment of the invention disclosed in this specification and the like relates to an object, a method, or a manufacturing method. The present invention relates to a process, a machine, manufacture, or a composition of matter. In particular, one embodiment of the present invention relates to a semiconductor device, a display device, a light-emitting device, a power storage device, a memory device, a driving method thereof, or a manufacturing method thereof.

In this specification and the like, a semiconductor device refers to an element, a circuit, a device, or the like that can function by utilizing semiconductor characteristics. An example of the semiconductor device is a semiconductor element such as a transistor or a diode. Another example of the semiconductor device is a circuit including a semiconductor element. Another example of the semiconductor device is a device provided with a circuit including a semiconductor element.

BACKGROUND ART

As a semiconductor material applicable to a transistor, an oxide semiconductor has been attracting attention. For example, a technique for forming transistors using zinc oxide or an In—Ga—Zn-based oxide semiconductor as an oxide semiconductor is disclosed in Patent Document 1.

Patent Document 2 discloses an imaging device in which a transistor including an oxide semiconductor is used in part of a pixel circuit.

Patent Document 3 discloses an imaging device in which a transistor including silicon, a transistor including an oxide semiconductor, and a photodiode including a crystalline silicon layer are stacked.

A neural network, which has learning ability, is excellent in nonlinearity and pattern matching performance and applied to a variety of fields of, for example, control, a forecast, and diagnosis. Many types of structure of the neural network have been proposed. Most of the neural networks that have been put into practical use have a three-layer hierarchical architecture in which two layers (intermediate layer and output layer) of neuron elements each having the sigmoid function are stacked. This is because there is evidence that the three-layer hierarchical architecture can model any function with arbitrary accuracy.

Patent Document 4 proposes an information system that extracts and detects an object from an image obtained with an imaging device.

REFERENCES

Patent Documents

[Patent Document 1] Japanese Published Patent Application No. 2007-123861
[Patent Document 2] Japanese Published Patent Application No. 2011-119711
[Patent Document 3] Japanese Published Patent Application No. 2013-243355
[Patent Document 4] Japanese Published Patent Application No. 2014-032542

DISCLOSURE OF INVENTION

A semiconductor integrated circuit with high density and large capacity has been developed; meanwhile, miniaturization of the semiconductor integrated circuit is required. Thus, two-dimensional integration has shifted to three-dimensional integration. Although a manufacturing process of three-dimensional integration structure might be complicated, the degree of freedom of the materials and the design rule of layers can be increased. In view of the above, it is an object to manufacture a highly functional semiconductor integrated circuit that is difficult to manufacture by two-dimensional integration.

A pixel of an imaging device includes a photoelectric conversion element and a transistor. The photoelectric conversion element needs to have high optical sensitivity, and the transistor needs to have a small off-state current and low noise characteristics. It is an object to manufacture a more highly functional imaging element in which a photoelectric conversion element and a transistor are integrated three-dimensionally and which is manufactured using materials suitable for the photoelectric conversion element and the transistor in manufacturing steps.

Peripheral circuits such as driver circuits are preferably manufactured in the same process as the pixels so that a connection step and the like are simplified.

Recognition and determination by artificial intelligence (AI) of an image taken with an imaging device has been studied. Artificial intelligence aims to realize several characteristics of human brain functions by a neural network, and requires a large amount of arithmetic operations. In view of the above, it is an object to efficiently perform an arithmetic operation with a neural network in hardware.

An object of one embodiment of the present invention is to compress and convert a plurality of pieces of pixel data into one piece of data including one feature. Another object is to increase the arithmetic operation speed of an imaging device. Another object is to provide an imaging device that is integrated three-dimensionally. Another object is to provide an imaging device in which deterioration of a signal generated through conversion by a photoelectric conversion element can be reduced. Another object is to provide a novel imaging device or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

Note that the objects of one embodiment of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention is to achieve at least one of the aforementioned objects and the other objects.

One embodiment of the present invention is an imaging device, which has a neuron in a neural network, including a plurality of first pixels, a first circuit, a second circuit, and a third circuit. Each of the plurality of first pixels includes a photoelectric conversion element. The photoelectric conversion element is electrically connected to the first circuit. The first circuit is electrically connected to the second circuit. The second circuit is electrically connected to the third circuit. Each of the plurality of first pixels generates an input signal of the neuron in the neural network. The first circuit, the second circuit, and the third circuit have functions as the neuron. The third circuit includes an interface connected to the neural network.

In the above structure, each of the plurality of first pixels is preferably configured to convert received light into an analog signal. The first circuit is preferably configured to amplify the analog signal. The second circuit is preferably configured to add the analog signals that are amplified. The third circuit is preferably configured to convert the analog signals that are added into feature data by using an activation function. The third circuit is preferably configured to determine the feature data.

In the above structure, the first circuit preferably includes an amplifier circuit, a first memory circuit, and a first adder circuit. The second circuit preferably includes a second adder circuit. The third circuit preferably includes a first arithmetic circuit and a second memory circuit. The first pixel is preferably configured to convert light into a first signal to output. The amplifier circuit is preferably configured to amplify the first signal at an amplification factor held in the first memory circuit. The first adder circuit is preferably configured to add an offset voltage to the first signal that is amplified. The first adder circuit is preferably configured to output the result of addition of the offset voltage as a second signal. The second adder circuit is preferably configured to add the second signals. The second adder circuit is preferably configured to output a signal that is obtained by adding the second signals as a third signal that is an analog signal. The first arithmetic circuit is preferably configured to determine and binarize the third signal. The first arithmetic circuit is preferably configured to supply the signal that is binarized to the second memory circuit as the feature data. The second memory circuit preferably outputs the feature data to the neural network.

In the above structure, each of the plurality of first pixels is preferably configured to convert received light into an analog signal and output the analog signal as a fourth signal. The first circuit is preferably configured to convert the analog signal into a digital signal. The first circuit is configured to generate a fifth signal having a feature by classifying a level of the digital signal using bit shift. The second circuit is preferably configured to extract and count the feature of the fifth signal. The third circuit is preferably configured to convert a result of count into the feature data by using an activation function. The third circuit is preferably configured to determine the feature data.

In the above structure, the first circuit preferably includes a first input selection circuit, an analog-to-digital converter circuit, a first determination circuit, and a first memory circuit. The second circuit preferably includes a second input selection circuit and a feature extraction circuit. The third circuit preferably includes a second determination circuit and a second memory circuit. The first input selection circuit is preferably configured to select any of a plurality of fourth signals. The analog-to-digital converter circuit is preferably configured to convert the fourth signal that is a selected analog signal into a digital signal. The first determination circuit is preferably configured to amplify the digital signal by a power of two in accordance with an amount of bit shift that is selected. The first determination circuit is preferably configured to determine a level of the signal that is amplified, in accordance with the amount of bit shift. The first determination circuit is preferably configured to supply the determination result to the first memory circuit as the fifth signal. The second input selection circuit is preferably configured to sequentially select the fifth signal held in the first memory circuit and output the selected holding data to the feature extraction circuit. The feature extraction circuit is preferably configured to count the fifth signal with a feature. The second determination circuit preferably compares the count result with a supplied condition. The second determination circuit is preferably configured to supply the comparison result to the second memory circuit as feature data. The second memory circuit preferably outputs the feature data to the neural network.

In the above structure, it is preferable that the imaging device having the neuron in the neural network further comprise a signal line and a second analog-to-digital converter circuit. Each of the plurality of first pixels is preferably configured to convert received light into an analog signal. The analog signal is preferably supplied to the second analog-to-digital converter circuit through the signal line from each of the plurality of first pixels.

In the above structure, the third circuit preferably includes a selection circuit. The feature data is preferably divided into pieces of data each having a selected length and output to the neural network.

In the above structure, the first pixel preferably includes a first transistor. The first transistor preferably includes a metal oxide in a semiconductor layer.

In the above structure, the first transistor included in the first pixel preferably includes the metal oxide in the semiconductor layer. A second transistor included in a circuit preferably comprises polycrystalline silicon in a semiconductor layer.

In the above structure, the first transistor including the metal oxide in the semiconductor layer preferably includes a back gate.

In the above structure, the first transistor preferably includes a region overlapping with the photoelectric conversion element.

According to one embodiment of the present invention, a plurality of pieces of pixel data can be compressed and converted into one piece of data including one feature. The arithmetic operation speed of an imaging device can be increased. An imaging device that is integrated three-dimensionally can be provided. An imaging device in which deterioration of a signal generated through conversion by a photoelectric conversion element can be reduced can be provided. A novel imaging device or the like can be provided.

Note that the effects of one embodiment of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention is to have at least one of the aforementioned effects and the other effects. Therefore, one embodiment of the present invention does not have the effects described above in some cases.

BEST MODE FOR CARRYING OUT THE INVENTION

Figure 1:
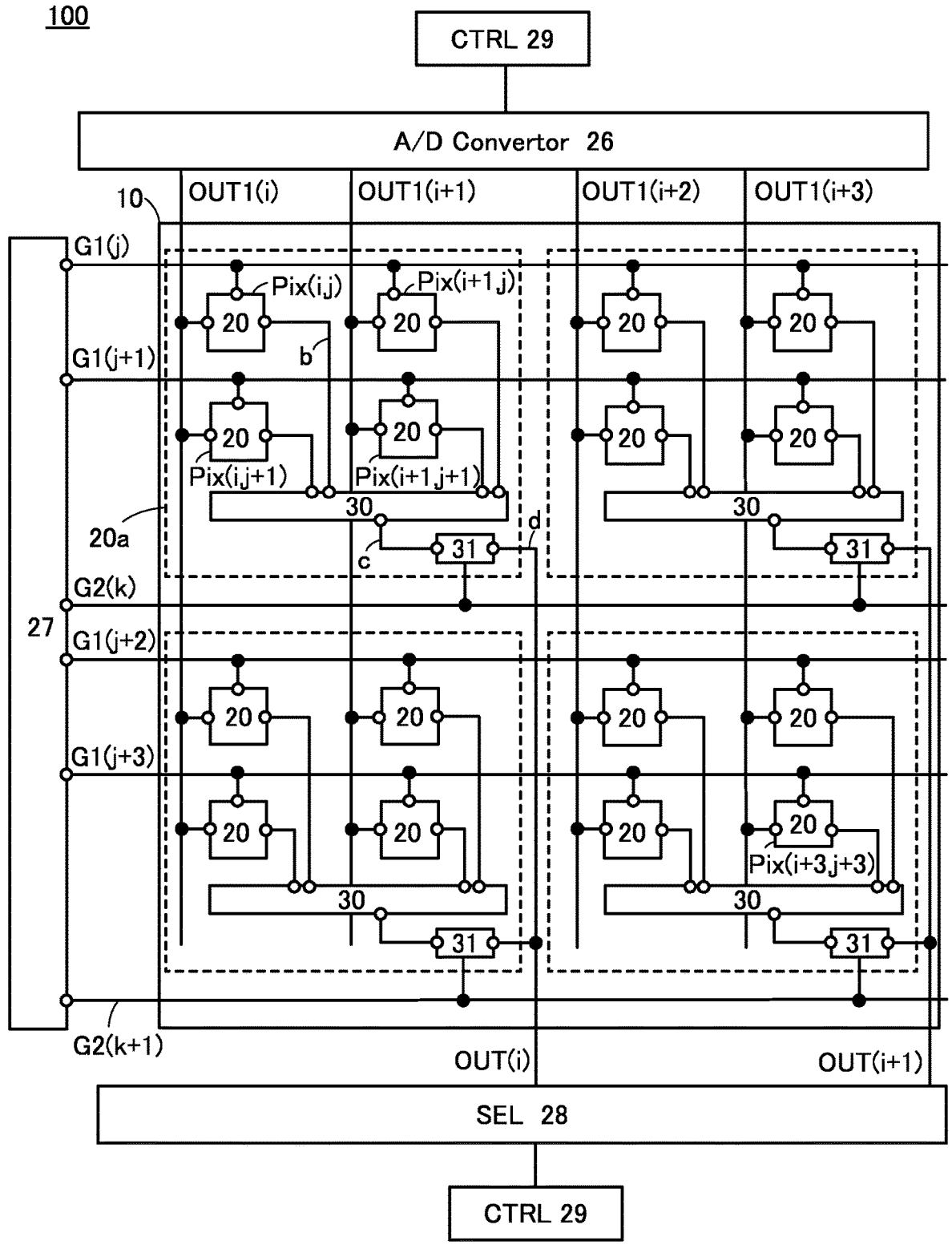
FIG. 1 is a block diagram illustrating an imaging element.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

In this specification, terms for describing arrangement, such as "over", "above", "under", and "below", are used for convenience in describing a positional relation between components with reference to drawings. Furthermore, the positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. The transistor has a channel formation region between a drain (a drain terminal, a drain region, or a drain electrode) and a source (a source terminal, a source region, or a source electrode), and current can flow between the source and the drain through the channel formation region. Note that in this specification and the like, a channel formation region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that in this specification and the like, the term "electrically connected" includes the case where components are connected through an "object having any electric function". There is no particular limitation on the "object having any electric function" as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly also includes the case where the angle is greater than or equal to 85° and less than or equal to 95°.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

Unless otherwise specified, off-state current in this specification and the like refers to drain current of a transistor in an off state (also referred to as a non-conducting state and a cutoff state). Unless otherwise specified, the off state of an n-channel transistor means that the voltage between its gate and source ($V_{gs}$: gate-source voltage) is lower than the threshold voltage $V_{th}$, and the off state of a p-channel transistor means that the gate-source voltage $V_{gs}$ is higher than the threshold voltage $V_{th}$. For example, the off-state current of an n-channel transistor sometimes refers to drain current that flows when the gate-source voltage $V_{gs}$ is lower than the threshold voltage $V_{th}$.

The off-state current of a transistor depends on $V_{gs}$ in some cases. Therefore, "the off-state current of a transistor is I or smaller" may mean that the off-state current of the transistor is I or smaller at a certain $V_{gs}$. The off-state current of a transistor may refer to off-state current at a given $V_{gs}$, at $V_{gs}$ in a given range, at $V_{gs}$ at which sufficiently small off-state current is obtained, or the like.

As an example, an assumption is made that an n-channel transistor has a threshold voltage $V_{th}$ of 0.5 V and a drain current of $1\times10^{-9}$ A at $V_{gs}$ of 0.5 V, $1\times10^{-13}$ A at $V_{gs}$ of 0.1 V, $1\times10^{-19}$ A at $V_{gs}$ of −0.5 V, and $1\times10^{-22}$ A at $V_{gs}$ of −0.8 V. The drain current of the transistor is $1\times10^{-19}$ A or smaller at $V_{gs}$ of −0.5 V or at $V_{gs}$ in the range of −0.8 V to −0.5 V; therefore, it may be said that the off-state current of the transistor is $1\times10^{-19}$ A or smaller. Since the drain current of the transistor is $1\times10^{-22}$ A or smaller at a certain $V_{gs}$, it may be said that the off-state current of the transistor is $1\times10^{-22}$ A or smaller.

In this specification and the like, the off-state current of a transistor with a channel width W is sometimes represented by a current value per channel width W or by a current value per given channel width (e.g., 1 μm). In the latter case, the off-state current may be represented by current per length (e.g., A/μm).

The off-state current of a transistor depends on temperature in some cases. Unless otherwise specified, the off-state current in this specification may be off-state current at room temperature, 60° C., 85° C., 95° C., or 125° C. Alternatively, the off-state current may be off-state current at a temperature at which the reliability of a semiconductor device or the like including the transistor is ensured or a temperature at which the semiconductor device or the like including the transistor is used (e.g., a temperature in the range of 5° C. to 35° C.). The state in which the off-state current of a transistor is I or smaller may indicate that the off-state current of the transistor at room temperature, 60° C., 85° C., 95° C., 125° C., a temperature at which the reliability of a semiconductor device or the like including the transistor is ensured, or a temperature at which the semiconductor device or the like including the transistor is used (e.g., a temperature in the range of 5° C. to 35° C.) is I or smaller at a certain $V_{gs}$.

The off-state current of a transistor depends on the voltage Vas between its drain and source in some cases. Unless otherwise specified, the off-state current in this specification may be off-state current at Vas of 0.1 V, 0.8 V, 1 V, 1.2 V, 1.8 V, 2.5 V, 3 V, 3.3 V, 10 V, 12 V, 16 V, or 20 V. Alternatively, the off-state current may be off-state current at Vas at which the reliability of a semiconductor device or the like including the transistor is ensured or at Vas used in the semiconductor device or the like including the transistor. The state in which the off-state current of a transistor is I or smaller may indicate that the off-state current of the transistor at Vas of 0.1 V, 0.8 V, 1 V, 1.2 V, 1.8 V, 2.5 V, 3 V, 3.3 V, 10 V, 12 V, 16 V, or 20 V, at Vas at which the reliability of a semiconductor device or the like including the transistor is ensured, or at Vas used in the semiconductor device or the like including the transistor is I or smaller at a certain $V_{gs}$.

In the above description of the off-state current, a drain may be replaced with a source. That is, the off-state current sometimes refers to current that flows through a source of a transistor in the off state.

In this specification and the like, the term "leakage current" sometimes expresses the same meaning as "off-state current". In this specification and the like, the off-state current sometimes refers to current that flows between a source and a drain of a transistor in the off state, for example.

Note that a voltage refers to a difference between potentials of two points, and a potential refers to electrostatic energy (electric potential energy) of a unit charge at a given point in an electrostatic field. Note that in general, a difference between a potential of one point and a reference potential (e.g., a ground potential) is merely called a potential or a voltage, and "potential" and "voltage" are used as synonymous words in many cases. Therefore, in this specification, "potential" can be replaced with "voltage" and vice versa, unless otherwise specified.

Embodiment 1

In this embodiment, an imaging device that includes an interface connected to a neural network is described with reference to FIG. 1, FIGS. 2A and 2B, FIGS. 3A to 3C, and FIGS. 4A and 4B.

One embodiment of the present invention is a structure and an operating method of an imaging device in which determination circuits for signals output from pixels are distributed in an imaging element.

FIG. 1 is a block diagram illustrating a configuration example of an imaging device 100. The imaging device 100 includes an imaging element 10, an analog-to-digital converter circuit (hereinafter referred to as A/D converter circuit) 26, a decoder circuit 27, a selector circuit 28, and a control portion 29.

The imaging element 10 includes a plurality of determination circuits 20a, a plurality of scan lines G1, a plurality of scan lines G2, a plurality of signal lines OUT, and a plurality of signal lines OUT1.

The determination circuit 20a includes a plurality of pixels 20, a feature extraction circuit 30, and a determination output circuit 31. The pixel 20 includes a light-receiving circuit 21 having a photoelectric conversion element PD (see FIG. 3A).

The imaging element 10 includes the pixels 20 arranged in m rows and n columns. FIG. 1 illustrates part of the imaging device 10. A structure in which the pixels 20 (Pix(i, j) to Pix(i+3, j+3)) are arranged is described as an example. Note that i is a natural number of 1 or more and m or less, j is a natural number of 1 or more and n or less, m is a natural number of 2 or more, n is a natural number of 2 or more, and k is a natural number of 1 or more and n or less.

The determination circuit 20a includes four pixels 20, the feature extraction circuit 30, and the determination output circuit 31. The determination output circuit 31 includes an arithmetic circuit 31a and a memory circuit 31b (see FIG. 3B).

The pixels 20 are electrically connected to the feature extraction circuit 30. The feature extraction circuit 30 is electrically connected to the determination output circuit 31.

Note that the number of pixels 20 included in the determination circuit 20a is preferably determined as appropriate in accordance with a region to be determined. A light-receiving circuit 21 may be connected to a plurality of amplifier circuits 22 (see FIG. 2B).

The pixels Pix(i, j) and Pix(i, j+1) are electrically connected to the signal line OUT1(i), and the pixels Pix(i+1, j) and Pix(i+1, j+1) are electrically connected to the signal line OUT1(i+1). The pixels Pix(i, j) and Pix(i+1, j) are electrically connected to the scan line G1(j), and the pixels Pix(i, j+1) and Pix(i+1, j+1) are electrically connected to the scan line G1(j+1). The determination output circuit 31 is electrically connected to the signal line OUT(i).

The pixels 20 and the determination circuit 20a can each be formed using transistors with the same conductivity and can be manufactured in parallel without an increase in the number of steps.

The photoelectric conversion element PD included in the pixel 20 can convert received light into current and then convert the current into voltage. The pixel 20 can amplify the voltage of an analog signal and output the resulting voltage as an output signal b.

A plurality of output signals b is subjected to arithmetic operation in the feature extraction circuit 30. Addition or multiplication is preferably performed as the arithmetic operation. In this embodiment, the feature extraction circuit 30 is an adder circuit. The feature extraction circuit 30 can output an output signal c that is an analog signal.

In the determination output circuit 31, the output signal c supplied to an input terminal can be determined and binarized by the arithmetic circuit 31a. The binarized signal can be held in the memory circuit 31b as a digital signal (see FIG. 3B).

The memory circuit 31b outputs an output signal d. The output signal d is supplied to the selector circuit 28 through the signal line OUT (see FIG. 1). The selector circuit 28 can sort the determination results of the determination circuits 20a in order of required data length and transfer them to the control portion 29. The data length of the output signal d can be determined in accordance with a communication method, such as parallel communication, serial communication (e.g., I2C), or differential communication (e.g., MIPI).

Figure 2A:
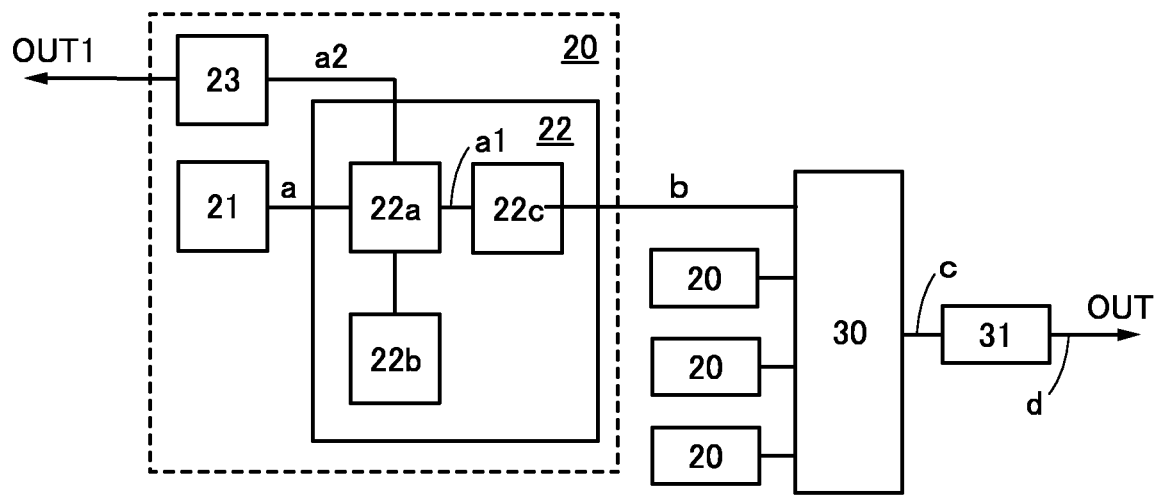
FIGS. 2A and 2B are block diagrams illustrating an imaging element.

The pixel 20 can supply an output signal a to the A/D converter circuit 26 through the signal line OUT1 (see FIG. 2A). The A/D converter circuit 26 can perform digital conversion on the output signal a and output the resulting signal to the control portion 29. The signal can be transmitted from the A/D converter circuit 26 to the control portion 29 by an optimal method.

The control portion 29 includes two input interfaces. One of the input interfaces includes a digital interface and covers parallel input or serial input. The data length of input data is fixed. The output signal a is supplied to the digital interface of the control portion 29 through the A/D converter circuit 26.

The other input interface covers input of a neural network. Input data is directly input to the neural network, so that the data length of the input data is preferably changed to a data length which can be easily handled in the neural network. The data length of the output signal d can be changed by the selector circuit 28. The output signal d is processed to have an appropriate data length and then supplied to the neural network interface of the control portion 29.

The type of photoelectric conversion element in the imaging device 100 can be freely selected. For example, over a single crystal silicon substrate provided with a photodiode, the pixels 20 and the determination circuits 20a can be formed using transistors each including an oxide semiconductor in a semiconductor layer.

The transistor including an oxide semiconductor in a semiconductor layer has a small off-state current and therefore facilitates construction of a floating node, a latch, and a memory for retaining data in the pixel 20 and the determination circuit 20a. Thus, the semiconductor layer of the transistor can be selected depending on the required function.

Although the imaging device can be formed only using transistors having the same conductivity, the area of the imaging device might be large. For this reason, transistors each including an oxide semiconductor in a semiconductor layer are preferably used for a pixel or a memory circuit. Transistors each including single crystal silicon in a semiconductor layer can be used for circuits that require current supply capability, such as the amplifier circuit, the determination circuit 20a, the A/D converter circuit 26, and the decoder circuit 27. A transistor including an oxide semiconductor in a semiconductor layer may be stacked over a transistor including single crystal silicon in a semiconductor layer. Note that an example of the oxide semiconductor will be described in Embodiment 6 in detail.

FIG. 2A is a block diagram illustrating the determination circuit 20a in detail. As an example, the determination circuit 20a includes four pixels 20. The pixel 20 includes the light-receiving circuit 21, the amplifier circuit 22, and a memory circuit 23. The amplifier circuit 22 includes an amplifier circuit 22a, a memory circuit 22b, and an adder circuit 22c.

An input terminal of the amplifier circuit 22a is electrically connected to an output terminal of the light-receiving circuit 21 and an output terminal of the memory circuit 22b. An output terminal of the amplifier circuit 22a is electrically connected to the adder circuit 22c. The light-receiving circuit 21 is electrically connected to the memory circuit 23 through the amplifier circuit 22a. The memory circuit 23 is electrically connected to the signal line OUT1.

The photoelectric conversion element PD converts generated current into voltage, and the light-receiving circuit 21 outputs the voltage as the output signal a. The output signal a is supplied to the amplifier circuit 22a. The memory circuit 22b can set the amplification factor of the amplifier circuit 22a. The adder circuit 22c can add an offset voltage B to an output signal a1 of the amplifier circuit 22a. The adder circuit 22c outputs the output signal b from its output terminal to an input terminal of the feature extraction circuit 30. Note that the output signal a1 may be supplied to the feature extraction circuit 30 without the adder circuit 22c.

The determination circuit 20a in the block diagram of FIG. 2A functions as a neuron in the neural network. The neuron functions as a synapse and an activation function. A synapse circuit that functions as a synapse can multiply each of a plurality of input signals by a weight coefficient and add the products of the input signals and the weight coefficient. In other words, the neuron has a function of executing a product-sum operation of a plurality of input signals. An activation function circuit that functions as an activation function has a determination function for extracting a feature from the result of a product-sum operation.

Figure 2B:
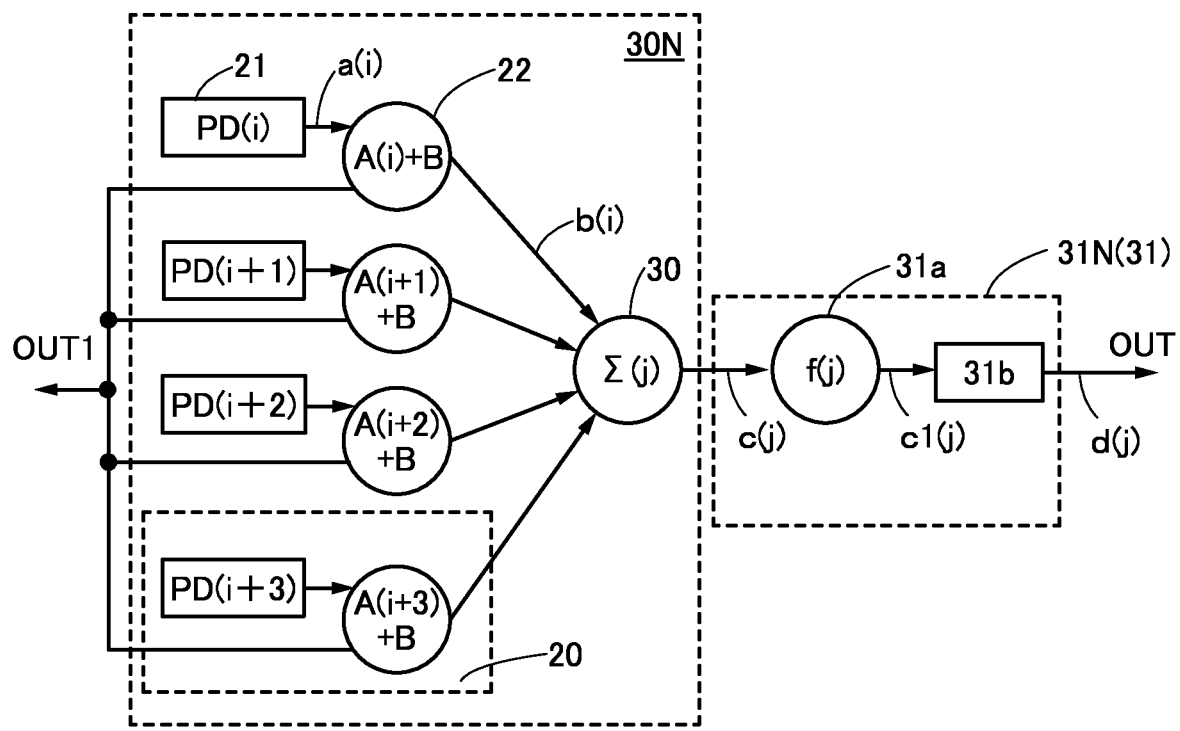

FIG. 2B represents the block diagram of FIG. 2A as a schematic view of a neuron. A synapse circuit 30N includes the pixels 20 and the feature extraction circuit 30. An activation function circuit 31N includes the determination output circuit 31.

FIG. 2B illustrates an example in which four light-receiving circuits 21 are connected to the feature extraction circuit 30; however, the number of connected light-receiving circuits 21 is not limited to four. For simplicity, the four light-receiving circuits 21 are denoted by PD(i), PD(i+1), PD(i+2), and PD(i+3) in FIG. 2B. Note that i and j are each a natural number of 1 or more.

The amplifier circuit 22 can multiply the output signal a by a weight coefficient A. The weight coefficient A is set in the memory circuit 22b in FIG. 2A. The weight coefficient A may be replaced with the amplification factor. Thus, the feature extraction circuit 30 is supplied with the output signal b that is obtained in such a manner that the output signal a is multiplied by the weight coefficient A and the offset voltage B or the like is further added for correction.

The feature extraction circuit 30 can add a plurality of output signals b. Thus, the output signal c of the feature extraction circuit 30 can be expressed by the following formula. The weight coefficients A of the amplifier circuits 22 may be the same or different from each other.

Under the above conditions, the total output of the feature extraction circuit 30 is expressed by the following formula 1.

$$c(j) = \Sigma(PD(i) \cdot A(i) + B) \quad \text{(formula 1)}$$

An output signal $c1(j)$ output from the arithmetic circuit 31a in the activation function circuit 31N is expressed by the following formula 2.

$$c1(j) = f(c(j)) \quad \text{(formula 2)}$$

Note that the output function $f(c(j))$ of the activation function circuit 31N means the sigmoid function. The determination output circuit 31 included in the activation function circuit 31N may be supplied with a threshold potential from the outside as a determination condition or a fixed threshold potential. Thus, the determination output circuit 31 can create a condition called firing in the neural network and output a binarized digital signal.

Figure 3A:
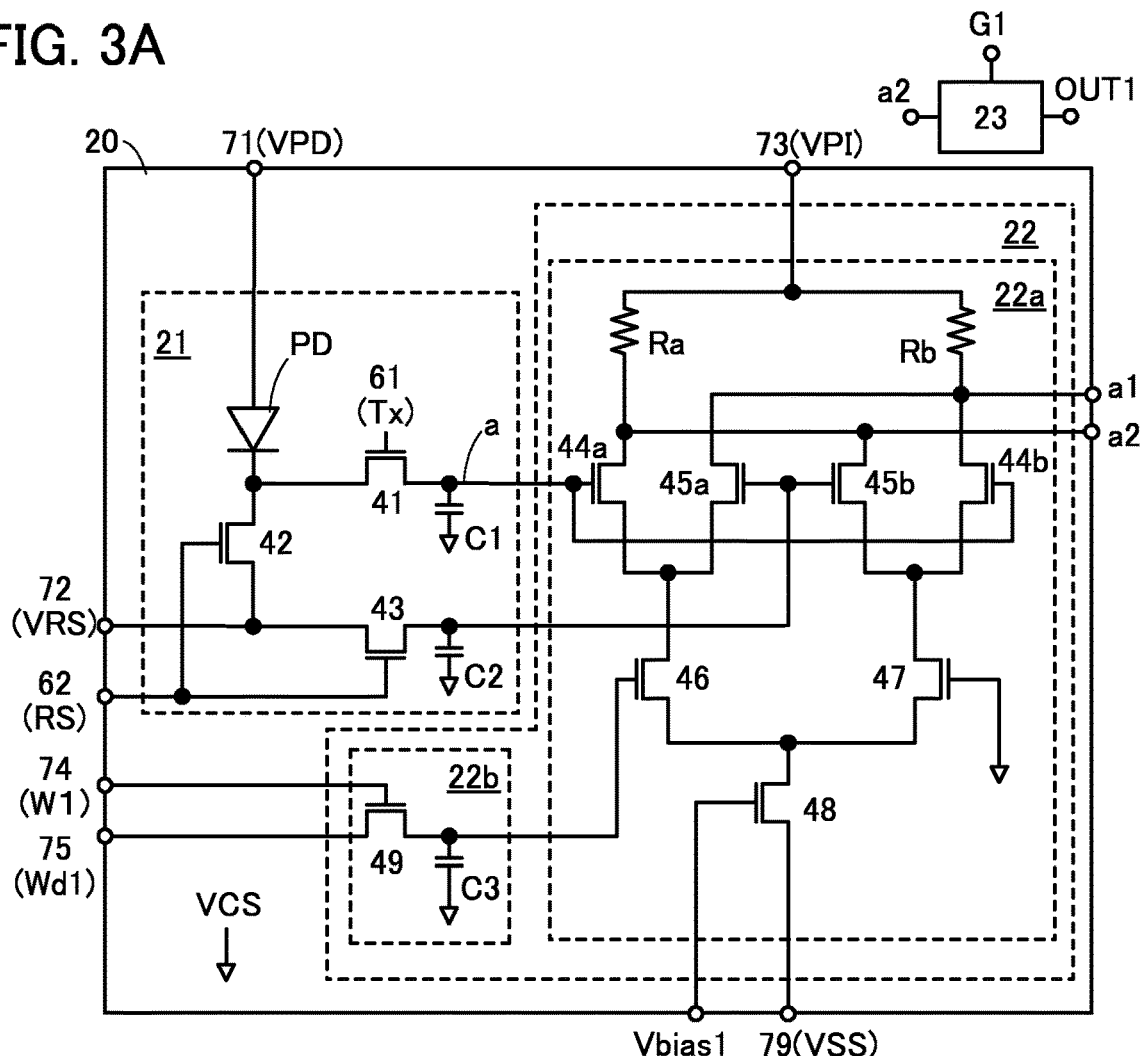
FIGS. 3A to 3C are circuit diagrams illustrating an imaging element.
Figure 3B:
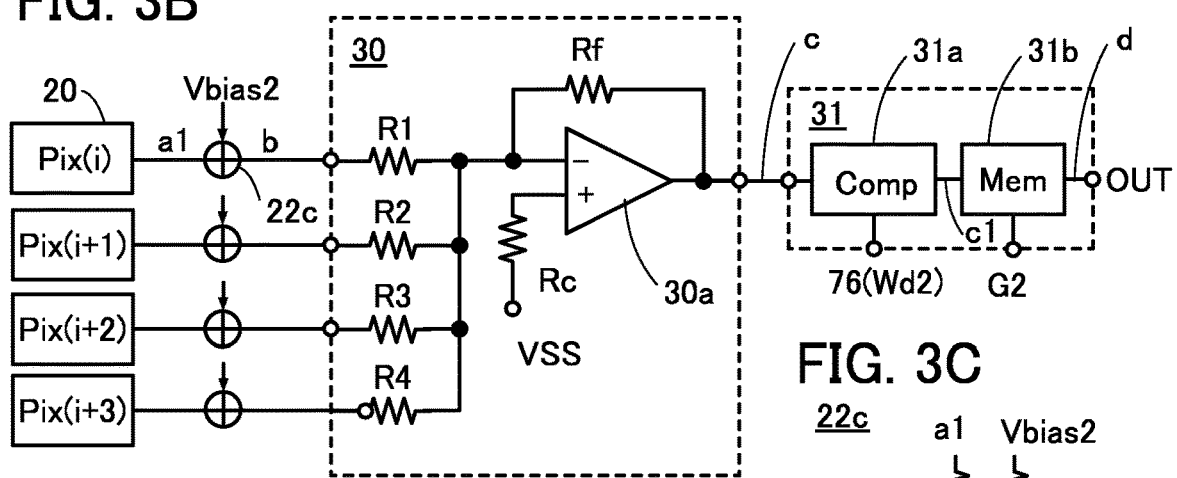
Figure 3C:
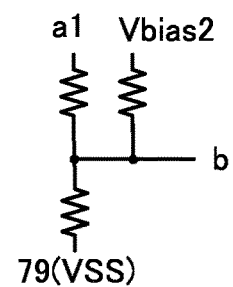

FIGS. 3A to 3C illustrate examples of the circuits in FIG. 2A. FIG. 3A illustrates a circuit example of the pixel 20, and FIG. 3B illustrates a circuit example of the determination circuit 20a. FIG. 3C illustrates a circuit example of the adder circuit 22c included in the amplifier circuit 22.

FIG. 3A illustrates the pixel 20 in detail. The pixel 20 includes the light-receiving circuit 21 and the amplifier circuit 22. The amplifier circuit 22 includes the amplifier circuit 22a and the memory circuit 22b. The light-receiving circuit 21 includes the photoelectric conversion element PD, capacitors C1 and C2, and transistors 41 to 43. One electrode of the photoelectric conversion element PD is electrically connected to a terminal VPD 71. The other electrode of the photoelectric conversion element PD is electrically connected to one of a source and a drain of the transistor 41 and one of a source and a drain of the transistor 42. The other of the source and the drain of the transistor 41 is electrically connected to one electrode of the capacitor CA. A gate of the transistor 41 is electrically connected to a terminal Tx 61. The other of the source and the drain of the transistor 42 is electrically connected to one of a source and a drain of the transistor 43 and a terminal VRS 72. A gate of the transistor 42 is electrically connected to a gate of the transistor 43 and a terminal RS 62. The other of the source and the drain of the transistor 43 is electrically connected to one electrode of the capacitor C2. The elements in the light-receiving circuit 21 may be connected to each other in different manners, which are illustrated in FIGS. 18A to 18C and FIGS. 19A and 19B. FIG. 19B illustrates an example in which the transistor 43 is not provided.

The capacitor C1 can hold a potential generated by the photoelectric conversion element PD as the output signal a. The capacitor C2 can hold a reference potential whose magnitude is to be compared with that of the output signal a. The transistors 41 to 43 can control timings of holding and resetting signals.

The Gilbert cell circuit can be used for the amplifier circuit 22a. The amplifier circuit 22a includes a transistor 44a, a transistor 45a, a transistor 44b, a transistor 45b, a transistor 46, a transistor 47, a transistor 48, a resistor Ra, and a resistor Rb. One electrode of the resistor Ra is electrically connected to one electrode of the resistor Rb and a terminal VPI 73. The other electrode of the resistor Ra is electrically connected to one of a source and a drain of the transistor 44a and one of a source and a drain of the transistor 45b. The other of the source and the drain of the transistor 44a is electrically connected to one of a source and a drain of the transistor 45a and one of a source and a drain of the transistor 46. The other of the source and the drain of the transistor 45a is electrically connected to the other electrode of the resistor Rb and one of a source and a drain of the transistor 44b. The other of the source and the drain of the transistor 44b is electrically connected to the other of the source and the drain of the transistor 45b and one of a source and a drain of the transistor 47. The other of the source and the drain of the transistor 46 is electrically connected to the other of the source and the drain of the transistor 47 and one of a source and a drain of the transistor 48. A gate of the transistor 47 is electrically connected to a terminal VCS. A gate of the transistor 48 is electrically connected to a terminal Vbias1. The other of the source and the drain of the transistor 48 is electrically connected to a terminal VSS 79. A gate of the transistor 44a is electrically connected to a gate of the transistor 44b and the one electrode of the capacitor C1. A gate of the transistor 45a is electrically connected to a gate of the transistor 45b and the one electrode of the capacitor C2.

The transistors 44a and 45a form a differential amplifier circuit, and the transistors 44b and 45b form another differential amplifier circuit. The differential amplifier circuits each compare the output signal a of the capacitor C1 with the referential potential of the capacitor C2 and perform amplification.

The memory circuit 22b includes a transistor 49 and a capacitor C3. One of a source and a drain of the transistor 49 is electrically connected to a terminal Wd1 75. The other of the source and the drain of the transistor 49 is electrically connected to one electrode of the capacitor C3 and a gate of the transistor 46. A gate of the transistor 49 is electrically connected to a terminal W1 74.

In the memory circuit 22b, a potential is supplied as the amplification factor from a signal line Wd1 to the capacitor C3 through the transistor 49. The amplification factor is calculated in the outside and supplied to the memory circuit 22b. The amplifier circuit 22 amplifies an analog circuit. Accordingly, the circuit size can be reduced. In addition, the amplifier circuit 22 has the trackablity to the output signal a and a noise smoothing function. Although not illustrated in FIG. 3A, a column driver or a row driver may be additionally provided to supply the amplification factor to the capacitor C3. Alternatively, the decoder circuit 27 shown in FIG. 1 may be used.

The memory circuit 22b can control the amplification factor of the amplifier circuit 22a. The amplification factor corresponds to the weight coefficient A in the synapse circuit. In the case where the same weight coefficient A is set for the output signals a of all the light-receiving circuits 21, all the output signals a1 are uniformly amplified, leading to an improvement in the light-receiving accuracy in low gray level. In the case where different weight coefficients A are set, the output signals a1 emphasize patterns depending on the weight coefficients A, facilitating extraction of a specific pattern.

The transistor 48 controls the total amount of current in the amplifier circuit 22a. A gate of the transistor 48 is controlled through a terminal Vbias1 in the case where the imaging element 10 is not used or the imaging element 10 is intentionally not operated. Thus, the transistor 48 can stop the operation of the amplifier circuit 22, leading to a reduction in power consumption. The use of an oxide semiconductor in a semiconductor layer of the transistor 48 can reduce its off-state current, in which case the standby current of the amplifier circuit 22 in an off state can be reduced.

The memory circuit 23 can hold an output signal a2 of the amplifier circuit 22a. The output signal a2 held in the memory circuit 23 is transferred to the A/D converter circuit 26 through the signal line OUT1 when a scan signal is supplied to the scan line G1. The capacitor C1 can hold the output signal a when "Low" is supplied to the terminal Tx 61. Note that the pixel 20 does not necessarily include the memory circuit 23.

FIG. 3B illustrates a circuit example of the determination circuit 20a. Note that the adder circuit 22c is included in the amplifier circuit 22. FIG. 3C illustrates an example of the adder circuit 22c formed using passive elements. The adder circuit 22c includes a plurality of resistors.

An addition parameter can be supplied as voltage from a terminal Vbias2. The same addition parameter may be supplied to all the pixels in the imaging element 10. Alternatively, different voltages may be supplied to the pixels, in which case a memory circuit is additionally provided. The addition parameter can be used to correct an output of the amplifier circuit 22 and thus can be used for offset adjustment. The structure of the adder circuit 22c is not limited to the structure illustrated in FIG. 3C as long as it can perform addition to a signal.

Next, the feature extraction circuit 30 and the determination output circuit 31 included in the determination circuit 20a are described. An example in which an operational amplifier is used for the adder circuit in the feature extraction circuit 30 is described. The feature extraction circuit 30 includes an operational amplifier 30a and resistors R1, R2, R3, R4, Rc, and Rf.

One terminal of each of the resistors R1, R2, R3, and R4 is electrically connected to the corresponding amplifier circuit 22. The other terminal of each of the resistors R1, R2, R3, and R4 is electrically connected to a negative input terminal of the operational amplifier 30a. One terminal of the resistor Rf is electrically connected to the negative input terminal of the operational amplifier 30a, and the other terminal of the resistor Rf is electrically connected to an output terminal of the operational amplifier 30a. The resistors can each have an appropriate resistivity as needed.

The negative input terminal of the operational amplifier 30a is a reference point at which a virtual short exists, so that the resistor Rf can perform current-voltage conversion. Accordingly, the result obtained by addition of the output signals b of the pixels 20 is output to the output terminal of the operational amplifier 30a as a voltage value. An output terminal of the feature extraction circuit 30 is supplied with the output signal c that is an analog signal.

Next, the determination output circuit 31 is described. The determination output circuit 31 includes the arithmetic circuit 31a and the memory circuit 31b. The arithmetic circuit 31a may include a memory for holding a voltage of the determination condition.

An input terminal of the arithmetic circuit 31a is electrically connected to the output terminal of the operational amplifier 30a. An output terminal of the arithmetic circuit 31a is connected to an input terminal of the memory circuit 31b. In the case where the arithmetic circuit 31a includes a memory circuit, a column driver and a row driver for writing a voltage of the determination condition may be additionally provided. Alternatively, the decoder circuit 27 shown in FIG. 1 may be used.

The arithmetic circuit 31a can determine the output signal c of the feature extraction circuit 30 using the output function f. In the case of software processing, processing can be performed with the sigmoid function or the like. In the case of hardware processing, the same processing can be performed using the arithmetic circuit 31a.

The amplifier circuit 31a is supplied with a voltage of the determination condition through a signal line Wd2. The arithmetic circuit 31a compares the output signal c of the feature extraction circuit 30 with the voltage of the determination condition. In the case where the voltage of the output signal c is higher than the voltage of the determination condition, the arithmetic circuit 31a outputs a signal "High". In the case where the voltage of the output signal c is lower than the voltage of the determination condition, the arithmetic circuit 31a outputs a signal "Low". In this manner, the output signals a of the plurality of pixels are processed by the neuron and can be converted into a binarized digital signal using the output function f.

The binarized signal is held in the memory circuit 31b and can be read as needed. The signal is read with a scan signal supplied to the scan line G2, and output to the selector circuit 28 through the signal line OUT. For reading of data from the memory circuit 31b, a column driver and a row driver may be additionally provided. Alternatively, the decoder circuit 27 may be used.

Figure 4A:
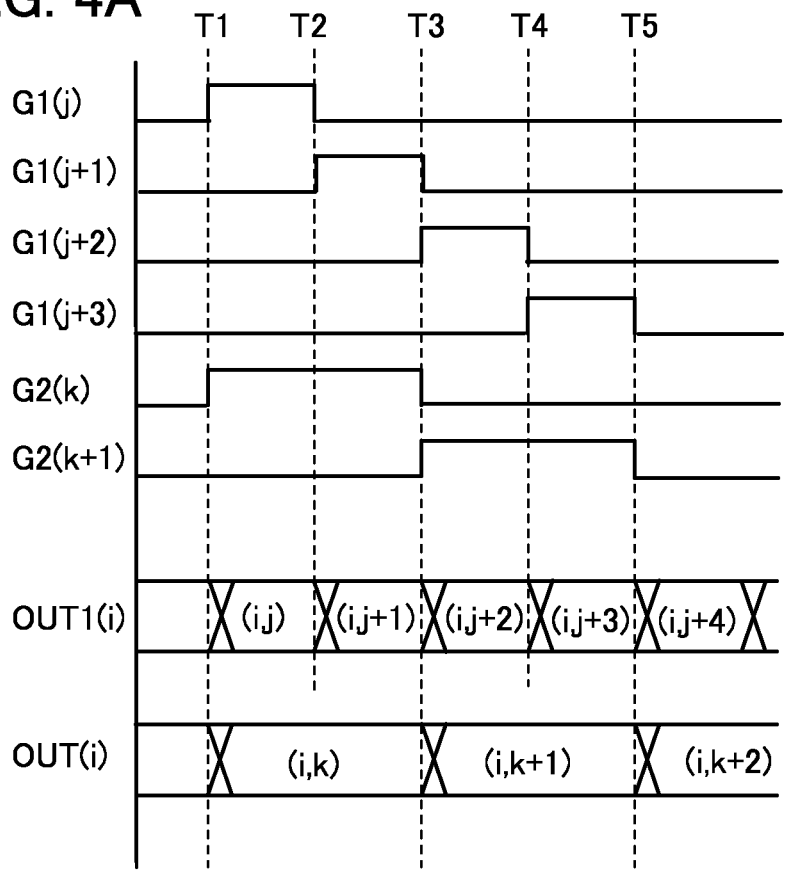
FIG. 4A is a timing chart showing an operation of an imaging element.

FIG. 4A is a timing chart of the imaging device 100 in FIG. 1. A scan signal is supplied to the pixel 20 from the decoder circuit 27 through the scan line G1(j), and data held in the memory circuit 23 is transferred to the A/D converter circuit 26. A scan signal is supplied to the determination circuit 20a from the decoder circuit 27 through the scan line G2(k), and data held in the memory circuit 31b is transferred to the selector circuit 28. The memory circuits 23 and 31b can each change its operation between data acquisition and data transfer. Thus, the memory circuit 31b may be formed using a transfer gate. The scan signal supplied from the decoder circuit can be used as a signal for controlling the transfer gate.

Figure 4B:
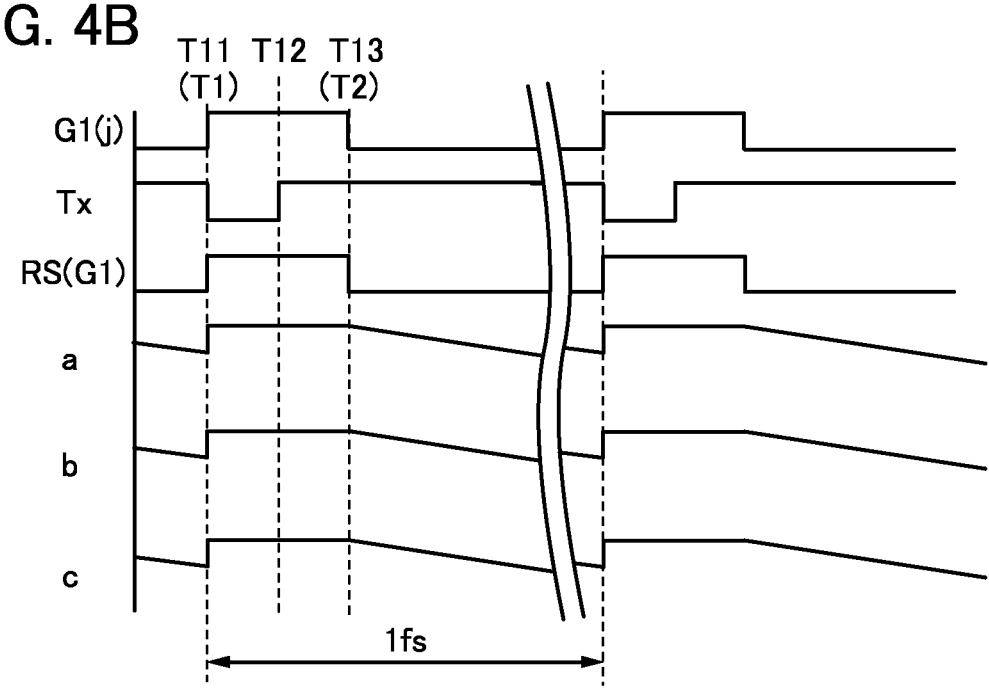
FIG. 4B is a timing chart showing an operation of a pixel.

FIG. 4B is a timing chart of the light-receiving circuit 21 included in the pixel 20 in FIG. 3A. The operation of the light-receiving circuit 21 is controlled through the scan line G1(j). The scan signal supplied through the scan line G1(j) is also supplied to the terminal RS 62. A period from T1 to T2 in FIG. 4A corresponds to a period from T11 to T13 in FIG. 4B.

In a period from T11 to T12, a holding potential of the capacitor C2 is refreshed with a potential supplied to the terminal VRS 72. In the period from T11 to T12, "Low" is supplied to the terminal Tx 61 and the transistor 41 remains off. The transistor 41 remains off for a period of time needed for data to be stored in the memory circuit 23 and the memory circuit 31b. Since the memory circuit 23 and the memory circuit 31b may each be formed using a transfer gate, the period from T11 to T12 can be shortened by using a transistor with high mobility. The transistor 41 is preferably a transistor including a CAC-OS to be described in Embodiment 6.

In a period from T12 to T13, the terminal Tx 61 is set to "High", and the transistors 41 to 43 are turned on. Accordingly, the holding potential of the capacitor C1 is refreshed with a voltage supplied to the terminal VRS 72.

At T13, the scan signal supplied to the scan line G1(j) is set to "Low". The terminal RS 62 is also set to "Low". Consequently, the transistors 42 and 43 are turned off and the transistor 41 remains on. Accordingly, the photoelectric conversion element PD acquires data. Data is acquired until the scan line G1(j) is selected in the next frame. Note that the decoder circuit included in the imaging device 100 may be divided into a plurality of regions and may perform parallel processing. In this case, the data acquisition period can be shorter than one frame.

The imaging element 10, which includes the determination circuits 20a, can perform analog arithmetic processing using analog data in a manner similar to analog data processing of a neuron in the brain. The imaging element 10 can perform arithmetic processing while the frequency of conversion of analog data into digital data is kept as low as possible.

The neural network requires an enormous amount of arithmetic processing and hierarchical processing. However, with the structure in this embodiment, the determination circuit 20a can perform processing corresponding to processing in an input layer of the multilayer perceptron in the neural network. Accordingly, the determination circuit 20a corresponding to the input layer can obtain two kinds of output result, i.e., a signal of data of received light and a signal obtained by analog arithmetic processing using the data of received light in the pixels 20. Thus, in the imaging device, the amount of arithmetic processing by software can be reduced and power consumption of the arithmetic processing can be reduced. Moreover, time required for the arithmetic processing can be shortened.

In this embodiment, the imaging device 100 can output normal image data and data compatible with the neural network. Since dealing with different kinds of data, the imaging device 100 preferably performs processing in synchronization with a frame. The timing of imaging is synchronized with the selection order of scan lines, so that a time lag is caused. Therefore, a global shutter system is preferably employed when the imaging device 100 takes an image of a fast moving object.

In the global shutter system, it is preferable that the terminals Tx 61 and the terminals RS 62 of all the light-receiving circuits 21 included in the imaging element 10 be controlled simultaneously. In this manner, the imaging device 100 can simultaneously acquire all the data of received light of the light-receiving circuits 21. The memory circuits 31b included in the determination circuits 20a are simultaneously supplied with data processed arithmetically by the multi-layer perceptron.

The structure and method described in this embodiment can be implemented by being combined as appropriate with any of the other structures and methods described in the other embodiments.

Embodiment 2

In this embodiment, an imaging device that includes an interface connected to a neural network is described with reference to FIG. 5, FIGS. 6A and 6B, FIG. 7, and FIGS. 8A and 8B.

One embodiment of the present invention is a structure and an operating method of an imaging device different from that in Embodiment 1.

Figure 5:
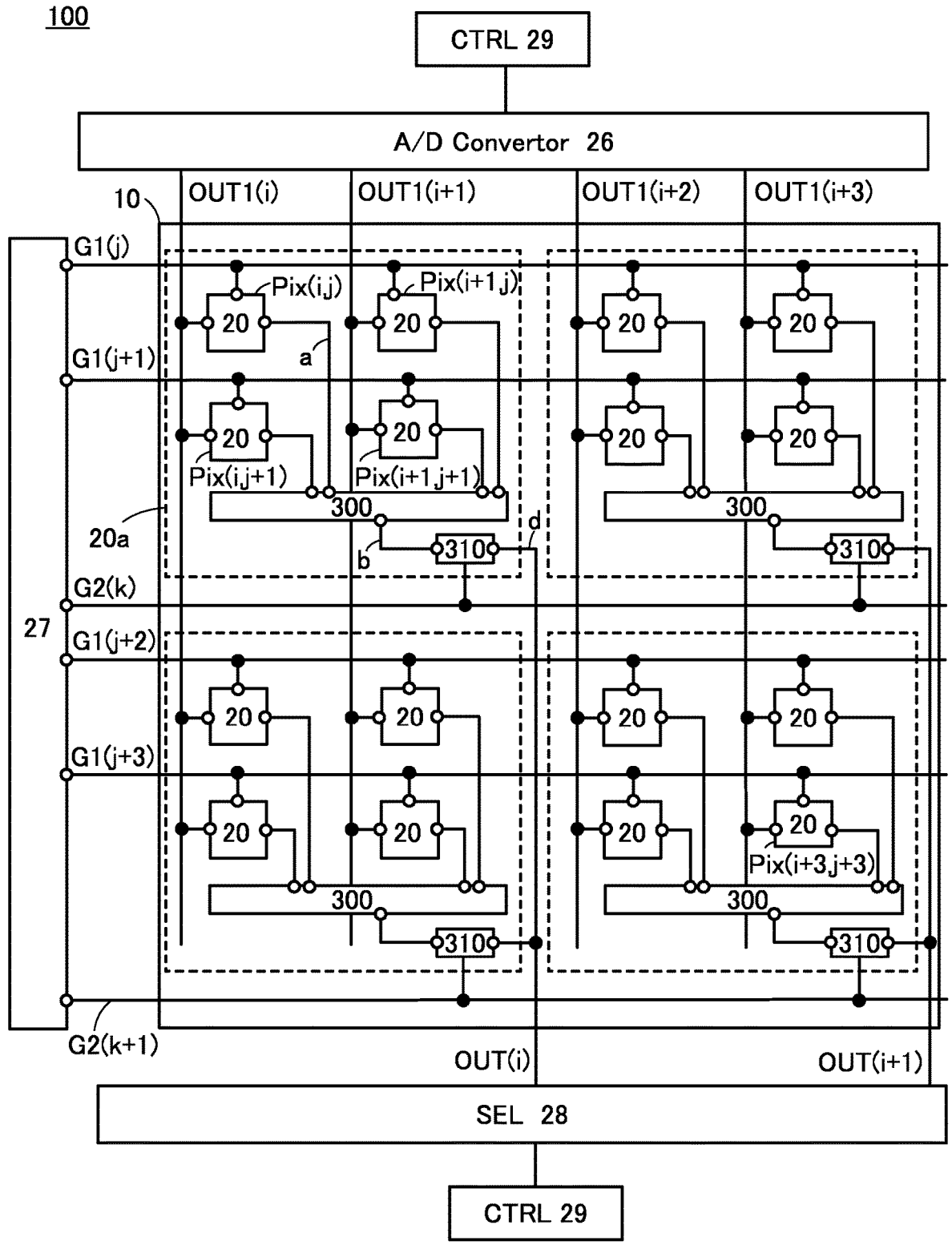
FIG. 5 is a block diagram illustrating an imaging element.

FIG. 5 is a block diagram illustrating a structure example of the imaging device 100 different from that in FIG. 1. The determination circuit 20a having a structure different from the structure illustrated in FIG. 1 is described. The determination circuit 20a in FIG. 5 is different from that in FIG. 1 in including an amplifier circuit 300 and a determination output circuit 310.

Four pixels 20 included in the determination circuit 20a is described with reference to FIG. 5.

The pixels 20 are electrically connected to the amplifier circuit 300. The amplifier circuit 300 is electrically connected to the determination output circuit 310.

Note that the number of pixels 20 included in the determination circuit 20a is preferably determined as appropriate in accordance with a region to be determined. A light-receiving circuit 21a in the pixel 20 may be connected to a plurality of amplifier circuits 300.

The photoelectric conversion element PD included in the light-receiving circuit 21a in the pixel 20 can convert received light into voltage. The pixel 20 outputs an output signal a. The amplifier circuit 300 can convert an analog signal to a digital signal and output an output signal b that is an amplified digital signal.

The output signal b is subjected to arithmetic operation in the determination output circuit 310. Addition or multiplication is preferably performed as the arithmetic operation. In this embodiment, the determination output circuit 310 is an adder circuit.

The determination output circuit 310 can extract a feature of data from the output signal b. The extracted data is determined and the determination result can be output as an output signal d.

Figure 6A:
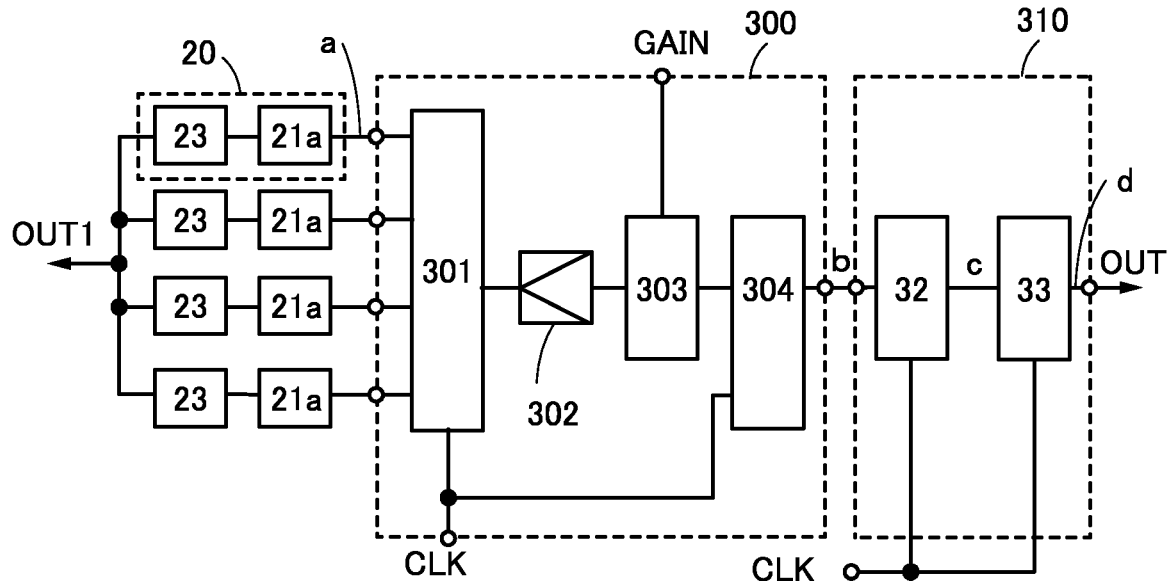
FIGS. 6A and 6B are block diagrams illustrating an imaging element.

FIG. 6A is a block diagram illustrating the determination circuit 20a in detail. As in FIG. 5, the determination circuit 20a includes the four pixels 20, for example. Each of the pixels 20 includes the light-receiving circuit 21a and the memory circuit 23. The determination circuit 20a includes the amplifier circuit 300, a feature extraction circuit 32, and an output circuit 33.

The amplifier circuit 300 includes an input selection circuit 301, an A/D converter circuit 302, a determination circuit 303, and a memory circuit 304. The determination circuit 303 includes logic circuits 306 and a selection circuit 305.

The light-receiving circuit 21a is electrically connected to the memory circuit 23. The memory circuit 23 is electrically connected to the signal line OUT1. An output terminal of the light-receiving circuit 21a is electrically connected to an input terminal of the input selection circuit 301 included in the amplifier circuit 300.

The photoelectric conversion element PD included in the light-receiving circuit 21a converts generated current into voltage, and the light-receiving circuit 21a can output the voltage as the output signal a. The output signal a can be supplied to an input terminal of the amplifier circuit 300.

The input selection circuit 301 is electrically connected to the A/D converter circuit 302. The A/D converter circuit 302 is electrically connected to the determination circuit 303. The determination circuit 303 is electrically connected to the memory circuit 304.

The input selection circuit 301 can select one of the four output signals a by using a signal generated from a clock signal applied to a terminal CLK. The A/D converter circuit 302 can convert the selected output signal a, which is voltage, into a digital signal and output the digital signal to an input terminal of the determination circuit 303. The determination circuit 303 can amplify a digital signal by bit shift. A high-order bit is extracted by bit shift, and thus the level of high-order bit can be determined. The determination result of the high-order bit can be held in the memory circuit 304. The held signal can be supplied to an input terminal of the feature extraction circuit 32 as the output signal b.

The feature extraction circuit 32 is electrically connected to the output circuit 33. The feature extraction circuit 32 extracts a feature of data from the output signal b supplied to its input terminal. The extracted data is counted as a count value and supplied to an input terminal of the output circuit 33 as an output signal c. The output signal c is determined by the output circuit 33, and the determination result can be output as the output signal d.

The determination circuit 20a in the block diagram of FIG. 6A functions as a neuron in the neural network. The neuron functions as a synapse and an activation function. A synapse circuit that functions as a synapse can multiply each of a plurality of input signals by a weight coefficient and add the products of the input signals and the weight coefficient. In other words, the neuron has a function of executing a product-sum operation of a plurality of input signals. An activation function circuit that functions as an activation function has a determination function for extracting a feature from the result of a product-sum operation.

Figure 6B:
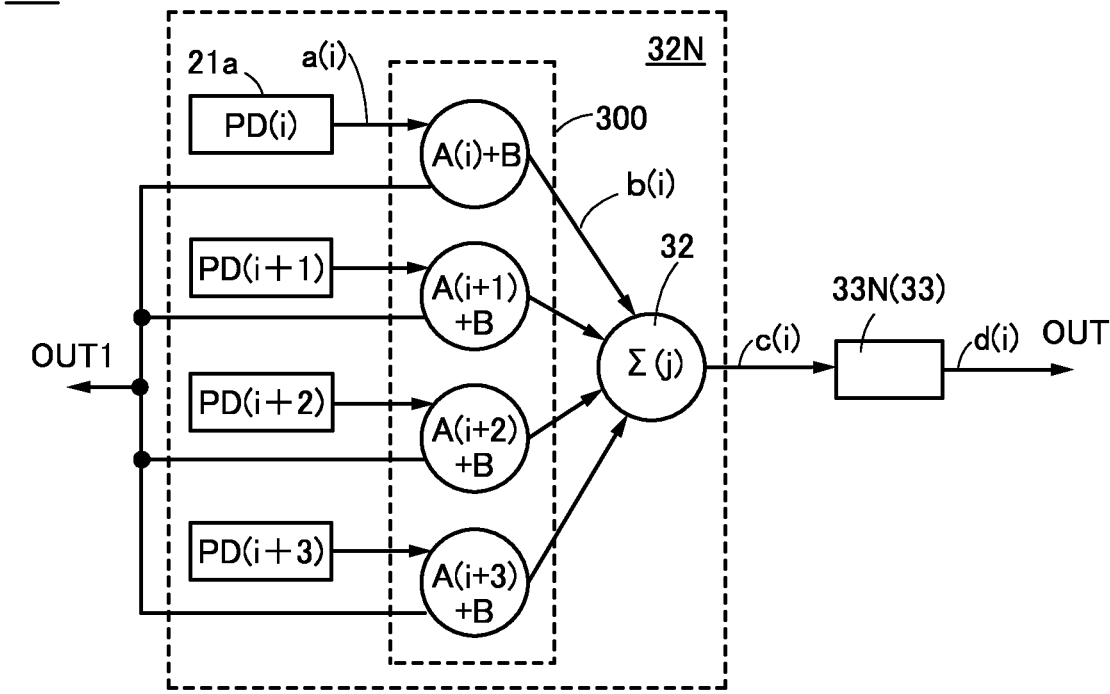

FIG. 6B represents the block diagram of FIG. 6A as a schematic view of a neuron. A synapse circuit 32N includes the amplifier circuit 300 and the feature extraction circuit 32. An activation function circuit 33N includes the output circuit 33.

FIG. 6B illustrates an example in which four light-receiving circuits 21a are connected to the amplifier circuit 300; however, the number of connected light-receiving circuits 21a is not limited to four. For simplicity, the four light-receiving circuits 21a are denoted by PD(i), PD(i+1), PD(i+2), and PD(i+3) in FIG. 6B. Note that i and j are each a natural number of 1 or more.

The amplifier circuit 300 can multiply the output signal a by the weight coefficient A. The weight coefficient A is set in the determination circuit 303 in FIG. 6A. The weight coefficient A may be replaced with the amplification factor. Thus, the feature extraction circuit 32 is supplied with data that is obtained in such a manner that the output signal a is multiplied by the weight coefficient A, as the output signal b.

Note that the weight coefficients A of the determination circuit 303 may be the same or different from each other.

Under the above conditions, the total output of the feature extraction circuit 32 can be expressed by the formula 1 in Embodiment 1. The formula 2 in Embodiment 1 can be used to obtain an output signal d(i) output from the activation function circuit 33N.

The output function $f(c(i))$ of the activation function circuit 33N means the sigmoid function. In the output circuit 33 included in the activation function circuit 33N, the determination condition may be updated or fixed. Thus, a condition called firing in the neural network can be created using the output circuit 33 and a binarized digital signal can be output.

Figure 7:
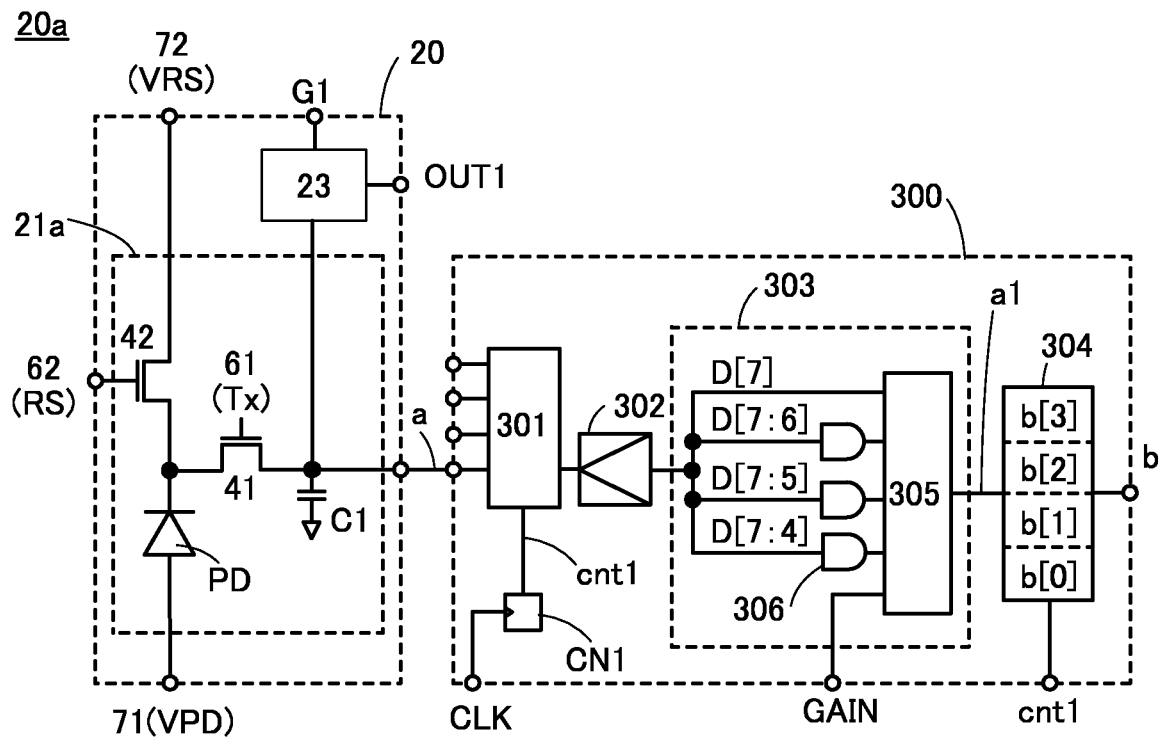
FIG. 7 is a circuit diagram illustrating an imaging element.
Figure 7:
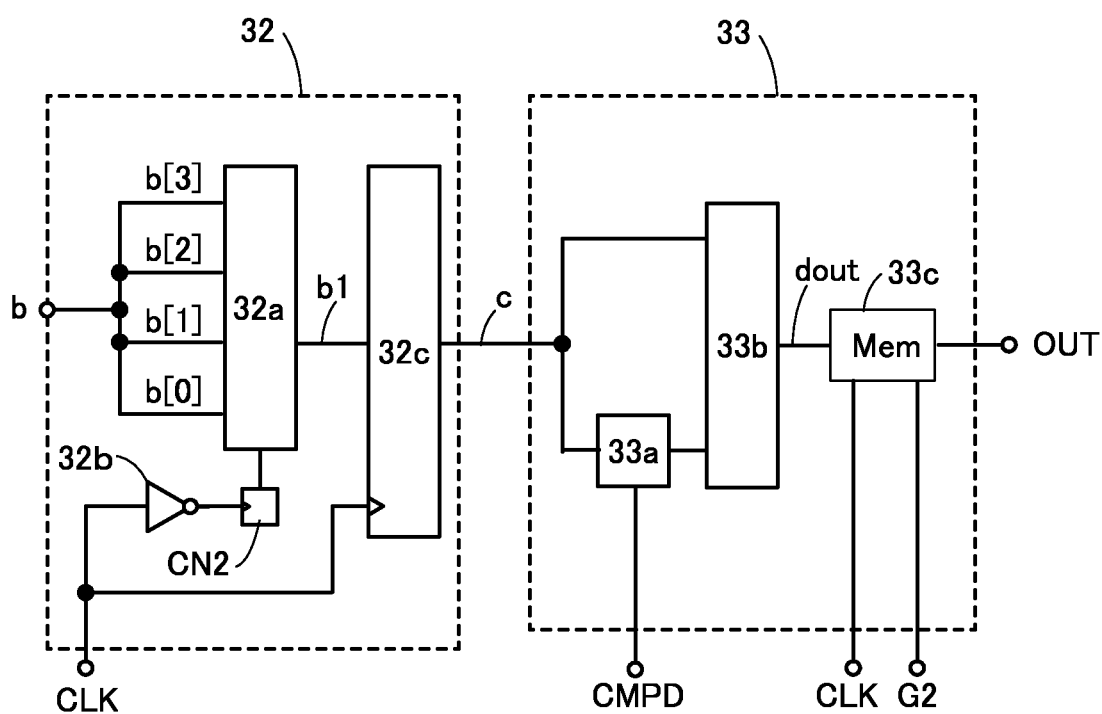

FIG. 7 illustrates examples of the circuits in FIG. 6A. FIG. 7 illustrates circuit examples of the pixel 20, the amplifier circuit 300, the feature extraction circuit 32, and the output circuit 33.

First, the pixel 20 is described. The pixel 20 includes the light-receiving circuit 21a and the memory circuit 23. The light-receiving circuit 21a includes the photoelectric conversion element PD, the capacitor C1, the transistor 41, and the transistor 42.

The capacitor C1 can hold a potential generated by the photoelectric conversion element PD as the output signal a. The transistors 41 and 42 can control timings of holding and resetting signals.

The output signal a is held in the memory circuit 23 and can be read as needed. The signal is read with a scan signal supplied to the scan line G1, and transferred to the A/D converter circuit 26 through the signal line OUT1. A column driver or a row driver for reading a signal from the memory circuit 23 may be additionally provided. Alternatively, the decoder circuit 27 may be used.

Next, the amplifier circuit 300 is described. The amplifier circuit 300 includes the input selection circuit 301, the A/D converter circuit 302, the memory circuit 304, the selection circuit 305, the logic circuits 306, and a counter circuit CN1. Assume that the four light-receiving circuits 21a are electrically connected to the amplifier circuit 300. The clock signal is supplied to the amplifier circuit 300 from the terminal CLK. The clock signal, which is a reference for a circuit operation, is also supplied to the determination output circuit 310.

The input selection circuit 301 can select one of the four output signals a. In one of selection methods, the counter circuit CN1 can be used. The counter circuit CN1 can supply an output signal cnt1 to the input selection circuit 301. The counter circuit CN1 can have a size depending on the number of light-receiving circuits 21a connected to the amplifier circuit 300. The counter circuit CN1 performs a count operation in synchronization with the clock signal supplied to the terminal CLK; therefore, the input selection circuit 301 can sequentially select the output signal a in synchronization with the clock signal.

The input selection circuit 301 can supply the output signal a selected in accordance with the output signal cnt1 to the A/D converter circuit 302. As an example, the A/D converter circuit 302 converts the output signal a, which is voltage, into an 8-bit digital signal D[7:0]. The A/D converter circuit 302 preferably select the data width as necessary.

As a method for amplifying a digital signal, a method in which arithmetic operation is performed in such a way that a bit is shifted out by bit shift is employed. In the determination circuit 303, the digital signal D[7:0] is amplified by bit shift, and the level of the digital signal can be classified into one of a plurality of ranges.

In bit shift, bit shift(s) to the left can amplify a value by a power of two (e.g., double, quadruple, or eight times). Thus, the case where the highest-order bit D[7] of the digital signal D[7:0] is "High" by one left bit-shift means that the digital signal is greater than 128 LSB. The case where the two highest-order bits D[7:6] are "High" means that the digital signal is greater than 192 LSB. In this manner, the selection circuit 305 can amplify a digital signal and the level of the digital signal can be classified into one of a plurality of ranges.

A signal for selecting the range of level of the digital signal is supplied to the selection circuit 305 from a terminal GAIN. The selection circuit 305 can supply, to the memory circuit 304, a signal "High" in the case where the digital signal is within the specified selection range and a signal "Low" in the case where the digital signal is not within the specified range. The signal output to the memory circuit 304 is referred to as an output signal a1.

Note that the amount of bit shift, which is the amplification factor, is calculated in the outside and supplied from the terminal GAIN. Therefore, in the amplifier circuit 300, all the determinations may be performed under the same condition or different conditions. The determination conditions of the logic circuits 306 may be reconfigured using a programmable logic array depending on processing.

A latch circuit can be used for the memory circuit 304. The use of a latch circuit for the memory circuit 304 can reduce the circuit size and the number of signals to be controlled, which is preferable. The timing of writing to the memory circuit 304 can be determined in accordance with the output signal cnt1 of the counter circuit CN1. For example, in the case where a period during which the output signal cnt1 is "High" is a selection period of the input selection circuit 301, the output signal a1 is held in the memory circuit 304 in synchronization with the timing of the fall of the output signal cnt1. The held signal is supplied to the input terminal of the feature extraction circuit 32 as the output signal b.

The feature extraction circuit 32 can extract a feature of data from the output signal b. The feature indicates whether the output signal a extracted by the determination circuit 303 is within the specified range.

The feature extraction circuit 32 includes an input selection circuit 32a, a counter circuit 32c, a counter circuit CN2, and an inverter 32b. The output circuit 33 includes a determination circuit 33a, a switch circuit 33b, and a memory circuit 33c.

The input selection circuit 32a can select one of four output signals b. As a method for selection, for example, a method in which the counter circuit CN2 is used can be employed. The counter circuit CN2 takes in data after the output signal b of the memory circuit 304 is determined, and thus the clock signal supplied to the amplifier circuit 300 can be inverted by the inverter 32b to be supplied to the counter circuit CN2. The input selection circuit 32a can sequentially output the output signals b as output signals b1.

The counter circuit 32c can count the number of output signals b1 that are within the specified range supplied from the terminal GAIN. In the case where the level of the output signal a is within the specified range, the output signal b1 is "High", whereas in the case where the level is not within the range, the output signal b1 is "Low".

Thus, the counter circuit 32c can count the number of signals including the feature of data. The count result can be supplied to the output circuit 33 of the determination output circuit 310 as the output signal c.

A determination value is supplied to the determination circuit 33a from a terminal CMPD. The determination circuit 33a determines whether the output signal c including the feature of data is higher than the determination value or not. An output signal dout is supplied to the memory circuit 33c as a determination result. Note that the output signal c may be directly supplied to the memory circuit 33c. The switch circuit 33b can change the determination methods.

Although a variety of memory circuits can be used as the memory circuit 33c, a circuit that can make output to have high impedance is preferably used. For example, a memory including a transistor in which silicon is included in a semiconductor layer can be used. Alternatively, a memory including a transistor in which an oxide semiconductor is included in a semiconductor layer may be used. Note that the details of the oxide semiconductor will be described in Embodiment 6.

It is preferable that the output signal dout held in the memory circuit 33c be read as needed. The signal is read with a scan signal supplied to the scan line G2 and transferred to the selector circuit 28 through the signal line OUT. For reading data from the memory circuit 33c, a column driver and a row driver may be additionally provided. Alternatively, the decoder circuit 27 in FIG. 1 may be used.

Figure 8A:
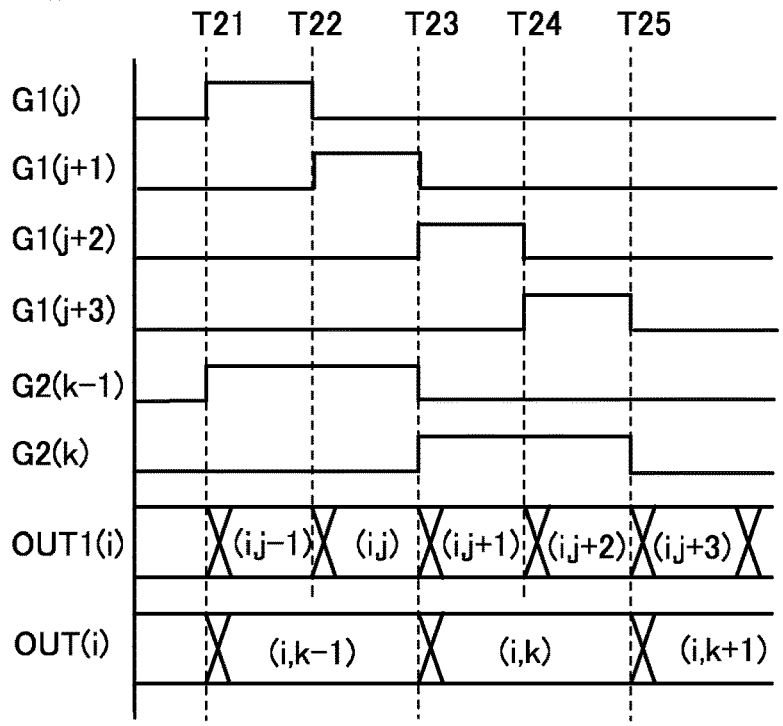
FIG. 8A is a timing chart showing an operation of an imaging element.

FIG. 8A is a timing chart of the imaging device 100 in FIG. 5. In a period from T21 to T22, a scan signal is supplied to the pixel 20 from the decoder circuit 27 through the scan line G1 (j), and data held in the memory circuit 23 is transferred to the A/D converter circuit 26. A scan signal is supplied to the determination circuit 20a from the decoder circuit 27 through the scan line G2(k), and data held in the memory circuit 33c is transferred to the selector circuit 28.

Figure 8B:
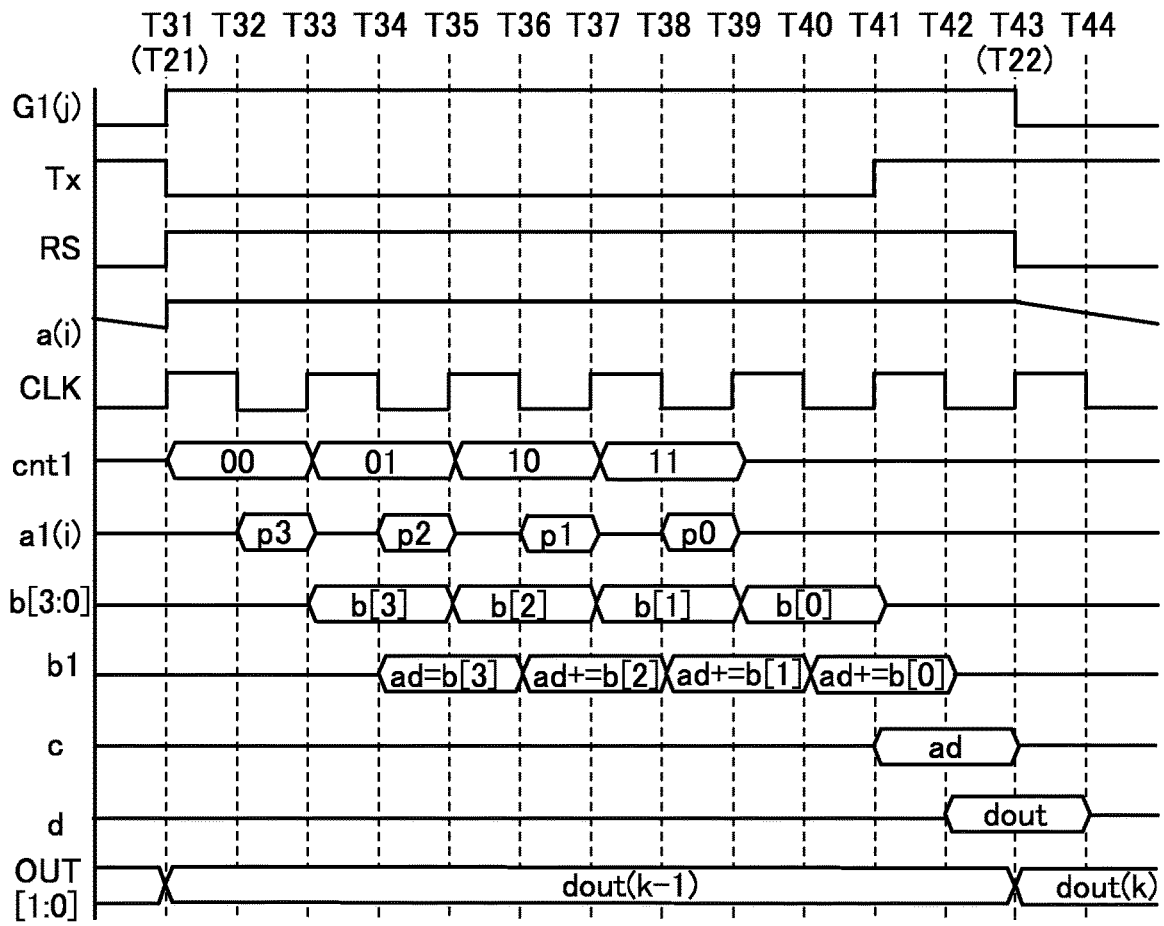
FIG. 8B is a timing chart showing an operation of a pixel.

FIG. 8B is a timing chart of the determination circuit 20a in FIG. 7. The operation of the light-receiving circuit 21a is controlled through the scan line G1(j). The scan signal supplied through the scan line G1(j) is also supplied to the terminal RS 62. The period from T21 to T22 in FIG. 8A correspond to a period from T31 to T43 in FIG. 8B.

In a period from T31 to T41, "Low" is supplied to the terminal Tx 61, and the transistor 41 remains off. In addition, "High" is supplied to the terminal RS 62, and the transistor 42 remains on. Accordingly, the holding potential of the capacitor C1 is supplied to the amplifier circuit 300 as the output signal a. The output signal a is subjected to arithmetic processing in the amplifier circuit 300 and the determination output circuit 310.

In a period from T41 to T43, the terminal Tx 61 and the terminal RS 62 are set to "High", and the transistors 41 and 42 are turned on. Accordingly, the holding potential of the capacitor C1 is refreshed with a voltage supplied to the terminal VRS 72.

At T43, the scan signal supplied to the scan line G1(j) is set to "Low". The terminal RS 62 is also set to "Low". Consequently, the transistor 42 is turned off and the transistor 41 remains on. Accordingly, the photoelectric conversion element PD acquires data. Data is acquired until the scan line G1(j) is selected in the next frame. Note that the decoder circuit included in the imaging device 100 may be divided into a plurality of regions and may perform parallel processing. In this case, the data acquisition period can be shorter than one frame.

FIG. 8B shows an example in which the scan signal supplied to the scan line G1(j) and the scan signal supplied to the scan line G2(k−1) are supplied at the same timing. Note that the timing of reading data from the memory circuit 33c may be independently controlled with the scan signal supplied to the scan line G2.

The imaging element 10 illustrated in FIG. 7, which includes the determination circuits 20a, can convert analog data into digital data and perform arithmetic processing in a manner similar to processing executed by a neuron in the brain. With the above structure, the imaging element 10 can extract a feature of data from analog data and perform compression arithmetic processing on digital data. Thus, the imaging element 10 can perform parallel multiprocessing.

The neural network requires an enormous amount of arithmetic processing and hierarchical processing. However, with the structure in this embodiment, the determination circuit 20a can perform processing corresponding to processing in an input layer of the multilayer perceptron in the neural network. Accordingly, the determination circuit 20a corresponding to the input layer can obtain two kinds of output result, i.e., a signal of data of received light and a signal obtained by digital arithmetic processing using the data of received light in the pixels 20. Thus, in the imaging device, the amount of arithmetic processing by software can be reduced and power consumption of the arithmetic processing can be reduced. Moreover, time required for the arithmetic processing can be shortened.

The structure and method described in this embodiment can be implemented by being combined as appropriate with any of the other structures and methods described in the other embodiments.

Embodiment 3

In this embodiment, the structures of the imaging device in Embodiment 1 are described with reference to FIG. 9, FIG. 10, FIGS. 11A to 11E, FIGS. 12A to 12D, FIG. 13, FIGS. 14A to 14C, FIG. 15, FIGS. 16A and 16B, FIG. 17, FIGS. 18A to 18C, FIGS. 19A and 19B, and FIGS. 20A and 20B.

Figure 9:
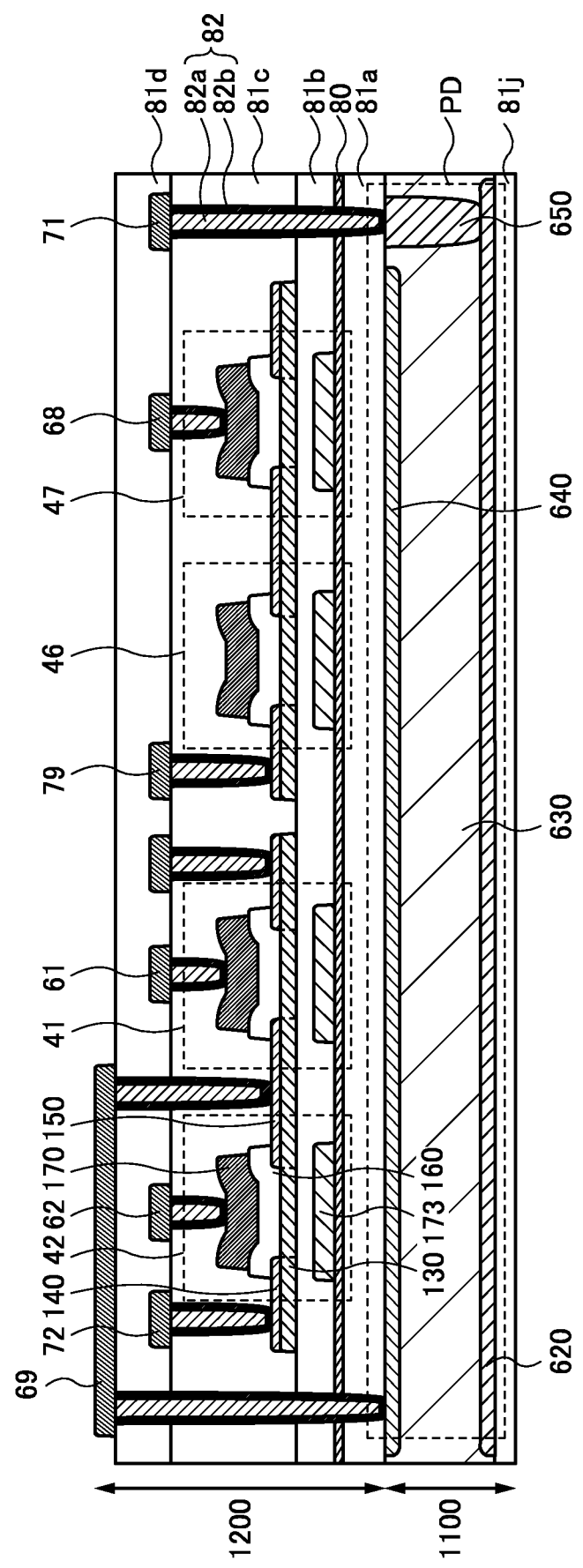
FIG. 9 is a cross-sectional view illustrating a structure of an imaging device.

FIG. 9 illustrates an example of a specific structure of the pixel 20 and is a cross-sectional view in the channel length direction of the transistors 41 and 42 included in the light-receiving circuit 21 and the transistors 46 and 47 included in the amplifier circuit 22a.

Although wirings, electrodes, metal layers, and contact plugs (conductors 82) are shown as independent components in cross-sectional views in this embodiment, some of them are provided as one component in some cases when they are electrically connected to each other. In addition, a structure in which components such as wirings, electrodes, and metal layers are connected to each other through the conductors 82 is only an example, and the components may be directly connected to each other not through the conductor 82.

As illustrated in FIG. 9, FIG. 10, FIGS. 11A to 11E, FIGS. 12A to 12D, FIG. 13, FIGS. 14A to 14C, FIG. 15, and FIG. 17, insulating layers 81a to 81g, 81j, and the like that function as protective films, interlayer insulating films, or planarization films are provided over a substrate and components such as transistors. For example, an inorganic insulating film such as a silicon oxide film or a silicon oxynitride film can be used as the insulating layers 81a to 81g. Alternatively, an organic insulating film such as an acrylic resin film or a polyimide resin film may be used. Top surfaces of the insulating layers 81a to 81g and the like may be subjected to planarization treatment as necessary by chemical mechanical polishing (CMP) or the like.

In some cases, some of wirings, transistors, and the like illustrated in drawings are not provided, or a wiring, a transistor, or the like that is not illustrated in drawings is included in each layer.

As illustrated in FIG. 9, the pixel 20 can include a layer 1100 and a layer 1200.

The layer 1100 can include the photoelectric conversion element PD. A photodiode with two terminals can be used for the photoelectric conversion element PD, for example. The photodiode can be a PN photodiode using a single crystal silicon substrate, a PIN photodiode using an amorphous silicon thin film, a microcrystalline silicon thin film, or a polycrystalline silicon thin film, or a photodiode using selenium, a selenium compound, or an organic compound, for example.

In FIG. 9, the photoelectric conversion element PD included in the layer 1100 is a PN photodiode using a single crystal silicon substrate. The photoelectric conversion element PD can include the insulating layer 81j, a $p^+$ region 620, a $p^-$ region 630, an n-type region 640, and a $p^+$ region 650.

In the layer 1200, the transistors included in the light-receiving circuit 21, the amplifier circuit 22a, and the memory circuit 22b can include an oxide semiconductor in their semiconductor layers. In FIG. 9, the transistors 41 and 42 included in the light-receiving circuit 21 and the transistors 46 and 47 included in the amplifier circuit 22a are illustrated as examples.

As shown in FIG. 9, the photoelectric conversion element PD can overlap with the light-receiving circuit 21 and the amplifier circuit 22a; thus, the area where the photoelectric conversion element PD receives light can be widened. Note that an example of the oxide semiconductor will be described in detail in Embodiment 6.

An insulating layer 80 is provided between a region including OS transistors and a region including Si devices (e.g., Si transistors or Si photodiodes).

An insulating layer provided near a Si device preferably contains hydrogen to terminate dangling bonds of silicon. Meanwhile, hydrogen in insulating layers provided near oxide semiconductor layers that are semiconductor layers of the transistors 41, 42, and the like causes generation of carriers in the oxide semiconductor layers. Thus, the hydrogen might reduce the reliability of the transistors 41, 42, and the like. For this reason, the insulating layer 80 that has a function of preventing diffusion of hydrogen is preferably provided between one layer including the Si device and another layer that includes the OS transistors and is stacked over the one layer. Diffusion of hydrogen can be prevented by the insulating layer 80; thus, reliability of both the Si device and the OS transistors can be improved.

The insulating layer 80 can be formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ), for example.

One electrode (the n-type region 640) of the photoelectric conversion element PD can be electrically connected to the transistor 41 and the transistor 42 through two conductors 82 and a wiring 69, for example.

Here, the conductor 82 is provided to penetrate the insulating layer 80; hence, the conductor 82 also preferably has a function of preventing diffusion of hydrogen. For example, the conductor 82 has the following structure illustrated in FIG. 9: a conductor 82b with a barrier property against hydrogen is provided at least on the outer side in contact with a sidewall of an opening, and a conductor 82a with low resistance is provided on the inner side. For instance, tungsten can be used for the conductor 82a, and tantalum nitride or the like can be used for the conductor 82b. Note that the conductor 82 can also be formed only of the conductor 82a. When a layer containing impurities such as hydrogen is not in contact with the conductor 82, the conductor 82 may be formed only of the conductor 82b.

In FIG. 9, top-gate OS transistors are provided in the layer 1200. For example, each of the OS transistors is provided over a stack including insulating layers (the insulating layers 81a, 80, and 81b) formed over the layer 1100, and includes an oxide semiconductor layer 130, conductive layers 140 and 150 serving as a source electrode and a drain electrode, an insulating layer 160 serving as a gate insulating layer, and a conductive layer 170 serving as a gate electrode. Note that the insulating layer 81b can also function as a gate insulating layer.

FIG. 9 illustrates an example of a structure where the OS transistors are each provided with a conductive layer 173 serving as a back gate electrode. In the structure of FIG. 9, back gate electrodes that double as light-blocking layers are preferably provided because light that passes through the layer 1100 might change the electrical characteristics of the transistors. Moreover, providing the back gates enables control of the threshold voltages and the like of the OS transistors.

Figure 10:
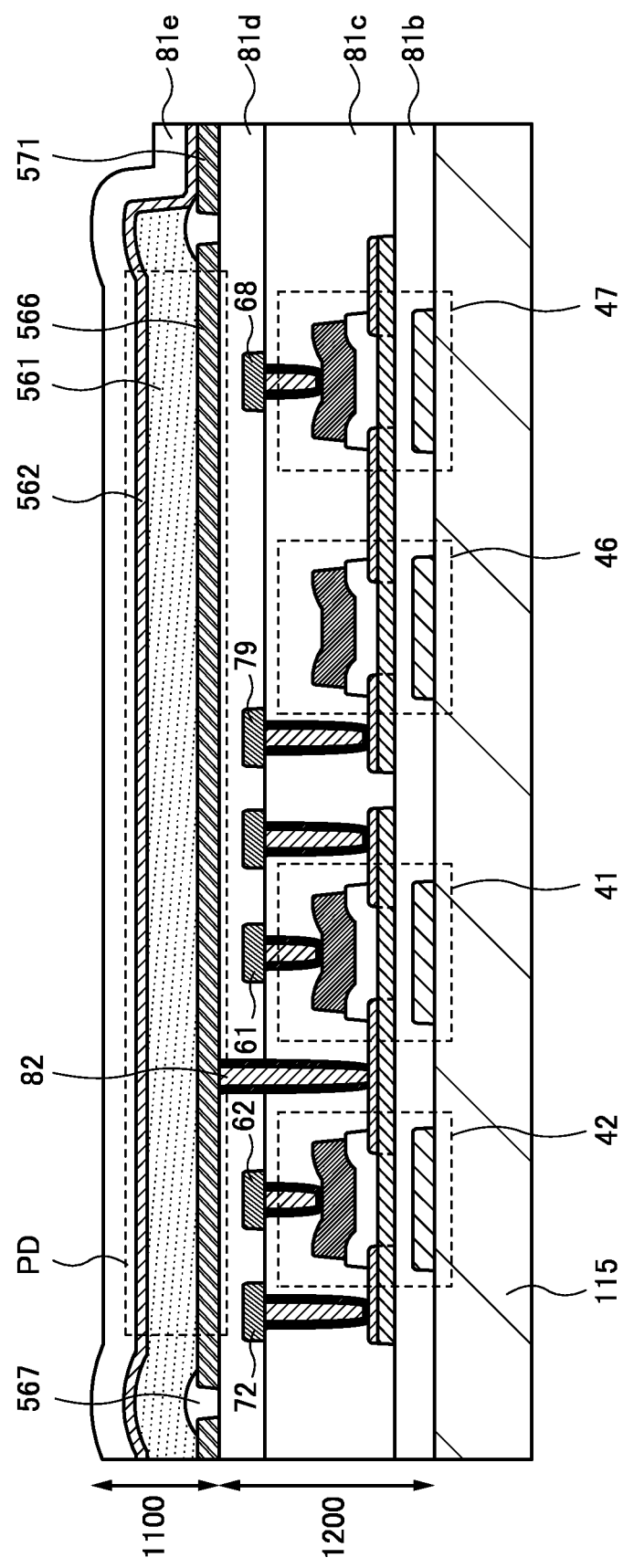
FIG. 10 is a cross-sectional view illustrating a structure of an imaging device.

Alternatively, the pixel 20 can employ a stacked structure illustrated in FIG. 10. In the pixel 20 in FIG. 10, the layer 1200 and the layer 1100 are provided over a substrate 115. The photoelectric conversion element PD is provided over the OS transistors, which facilitates electrical connection between the OS transistors and one electrode of the photoelectric conversion element PD.

FIG. 10 illustrates the photoelectric conversion element PD using a selenium-based material for a photoelectric conversion layer 561. The photoelectric conversion element PD containing a selenium-based material has high external quantum efficiency with respect to visible light. Furthermore, a selenium-based material has a high light-absorption coefficient, making the photoelectric conversion layer 561 thin easily. The photoelectric conversion element PD containing a selenium-based material can be a highly sensitive sensor in which the amount of amplification of signals is large because of avalanche multiplication. In other words, the use of a selenium-based material for the photoelectric conversion layer 561 allows a sufficient amount of photocurrent to be obtained even when the pixel area is reduced. Thus, the photoelectric conversion element PD containing a selenium-based material is also suitable for imaging in a low-illuminance environment.

As a selenium-based material, amorphous selenium or crystalline selenium can be used. Crystalline selenium can be obtained, for example, by depositing amorphous selenium and then performing heat treatment. When the crystal grain size of crystalline selenium is smaller than a pixel pitch, variations in characteristics between pixels can be reduced. Moreover, crystalline selenium has higher spectral sensitivity and light-absorption coefficient for visible light than amorphous selenium.

Figure 11A:
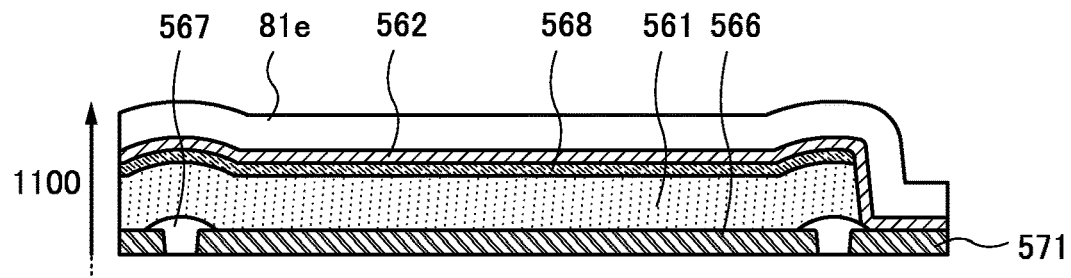
FIGS. 11A to 11E are cross-sectional views each illustrating connection of a photoelectric conversion element.
Figure 11B:
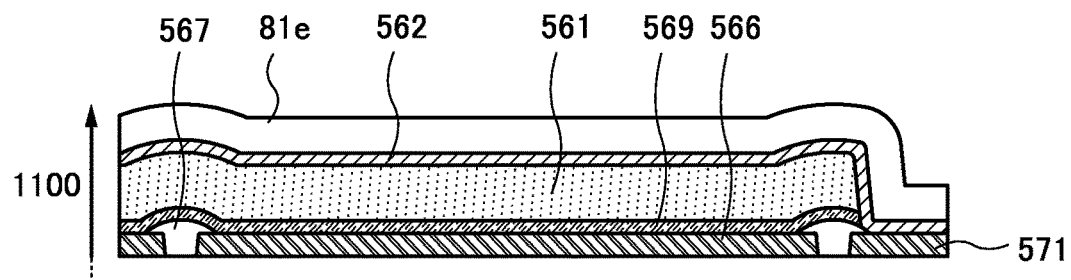
Figure 11C:
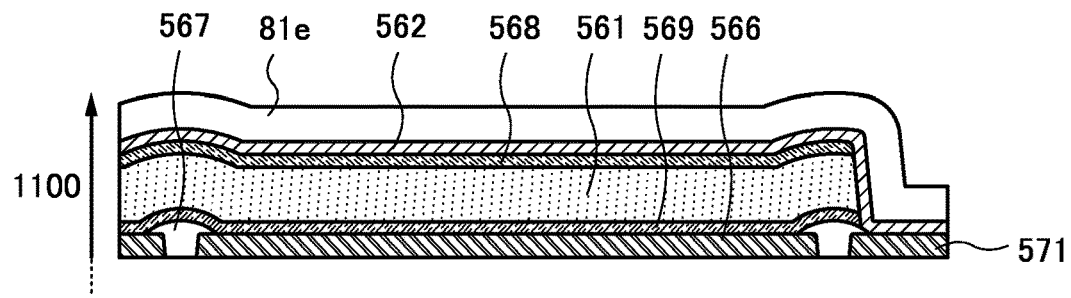

Although the photoelectric conversion layer 561 is a single layer in FIG. 10, a layer of gallium oxide, cerium oxide, In—Ga—Zn oxide, or the like may be provided as a hole-injection blocking layer 568 on a light-receiving surface side as illustrated in FIG. 11A. Alternatively, as illustrated in FIG. 11B, a layer of nickel oxide, antimony sulfide, or the like may be provided as an electron-injection blocking layer 569 on an electrode 566 side. Further alternatively, the hole-injection blocking layer 568 and the electron-injection blocking layer 569 may be provided as illustrated in FIG. 11C.

The photoelectric conversion layer 561 may be a layer containing a compound of copper, indium, and selenium (CIS); or a layer containing a compound of copper, indium, gallium, and selenium (CIGS). The use of CIS or CIGS makes it possible to form a photoelectric conversion element that utilizes avalanche multiplication as in the case of using a single layer of selenium.

In the photoelectric conversion element PD using a selenium-based material, for example, the photoelectric conversion layer 561 can be provided between a light-transmitting conductive layer 562 and the electrode 566 formed using a metal material or the like. Furthermore, CIS and CIGS are p-type semiconductors, and an n-type semiconductor such as cadmium sulfide or zinc sulfide may be provided in contact with the p-type semiconductor in order to form a junction.

Figure 11D:
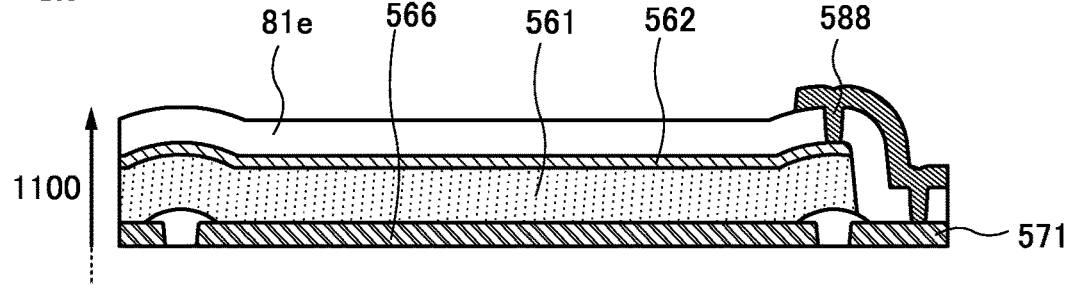
Figure 11E:
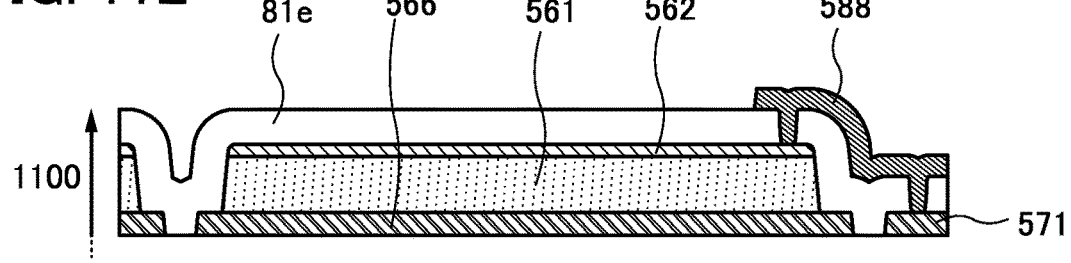
Figure 12A:
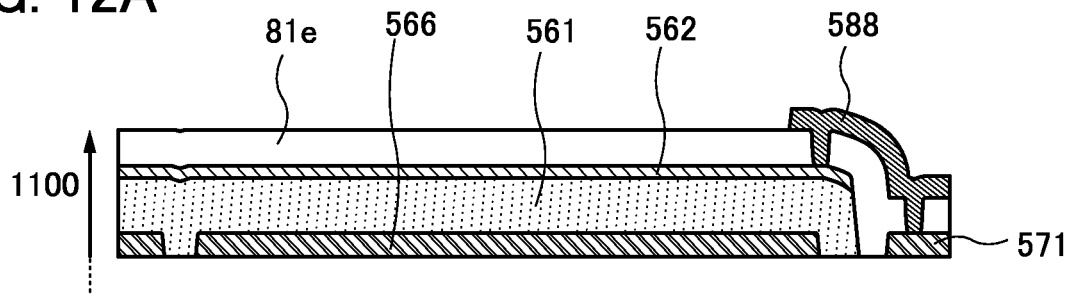
FIGS. 12A to 12D are cross-sectional views each illustrating connection of a photoelectric conversion element.
Figure 12B:
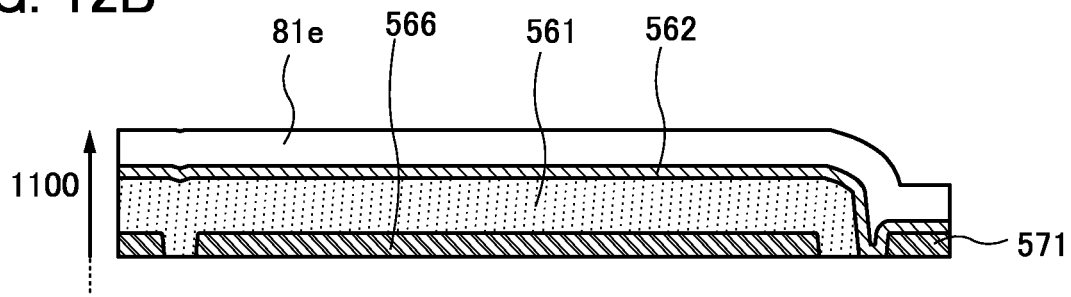

Although the light-transmitting conductive layer 562 is directly in contact with a wiring 571 in FIG. 10, they may be in contact with each other through a wiring 588 as illustrated in FIG. 11D. Although the photoelectric conversion layer 561 and the light-transmitting conductive layer 562 are not divided between pixels in FIG. 10, they may be divided between circuits as illustrated in FIG. 11E. In a region between pixels where the electrode 566 is not provided, a partition wall 567 formed of an insulator is preferably provided, thereby preventing generation of a crack in the photoelectric conversion layer 561 and the light-transmitting conductive layer 562. However, the partition wall 567 is not necessarily provided as illustrated in FIGS. 12A and 12B.

Figure 12C:
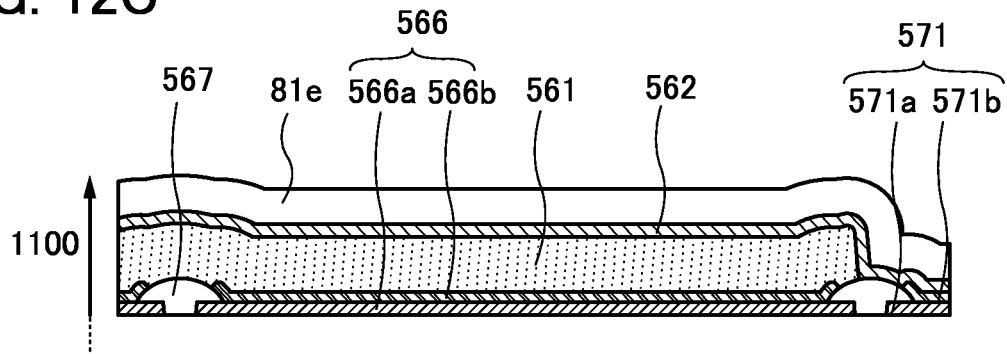

The electrode 566, the wiring 571, and the like may be a multilayer. For example, as illustrated in FIG. 12C, the electrode 566 can include two conductive layers 566a and 566b and the wiring 571 can include two conductive layers 571a and 571b. In the structure in FIG. 12C, it is preferred that, for example, the conductive layers 566a and 571a be made of a low-resistance metal or the like, and the conductive layers 566b and 571b be made of a metal or the like that exhibits an excellent contact property with the photoelectric conversion layer 561. Such a structure improves the electrical properties of the photoelectric conversion element PD. Note that some kinds of metal may cause electrochemical corrosion by being in contact with the light-transmitting conductive layer 562; even when such a metal is used for the conductive layer 571a, electrochemical corrosion can be prevented by the conductive layer 571lb.

The conductive layers 566b and 571b can be formed using molybdenum or tungsten, for example. The conductive layers 566a and 571a can be formed using, for example, aluminum, titanium, or a stack of titanium, aluminum, and titanium that are stacked in this order.

Figure 12D:
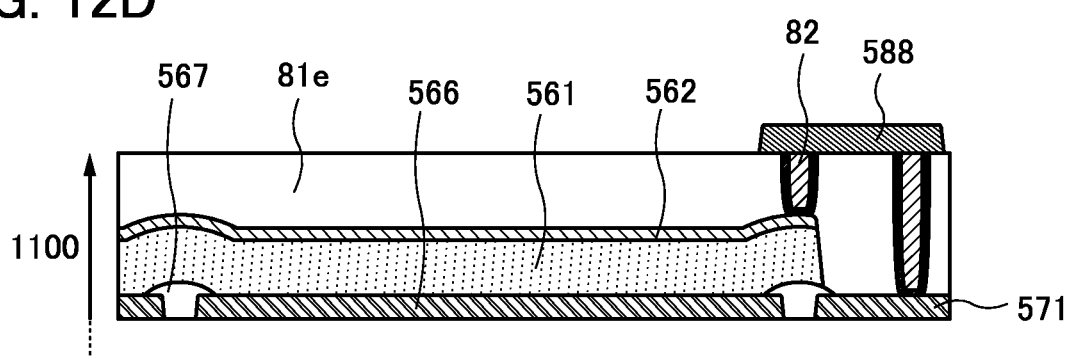

As illustrated in FIG. 12D, the light-transmitting conductive layer 562 may be connected to the wiring 571 through the conductor 82 and the wiring 588.

The partition wall 567 can be formed using an inorganic insulator, an insulating organic resin, or the like. The partition wall 567 may be colored black or the like in order to shield the transistors and the like from light and/or to determine the area of a light-receiving portion in each pixel.

Figure 13:
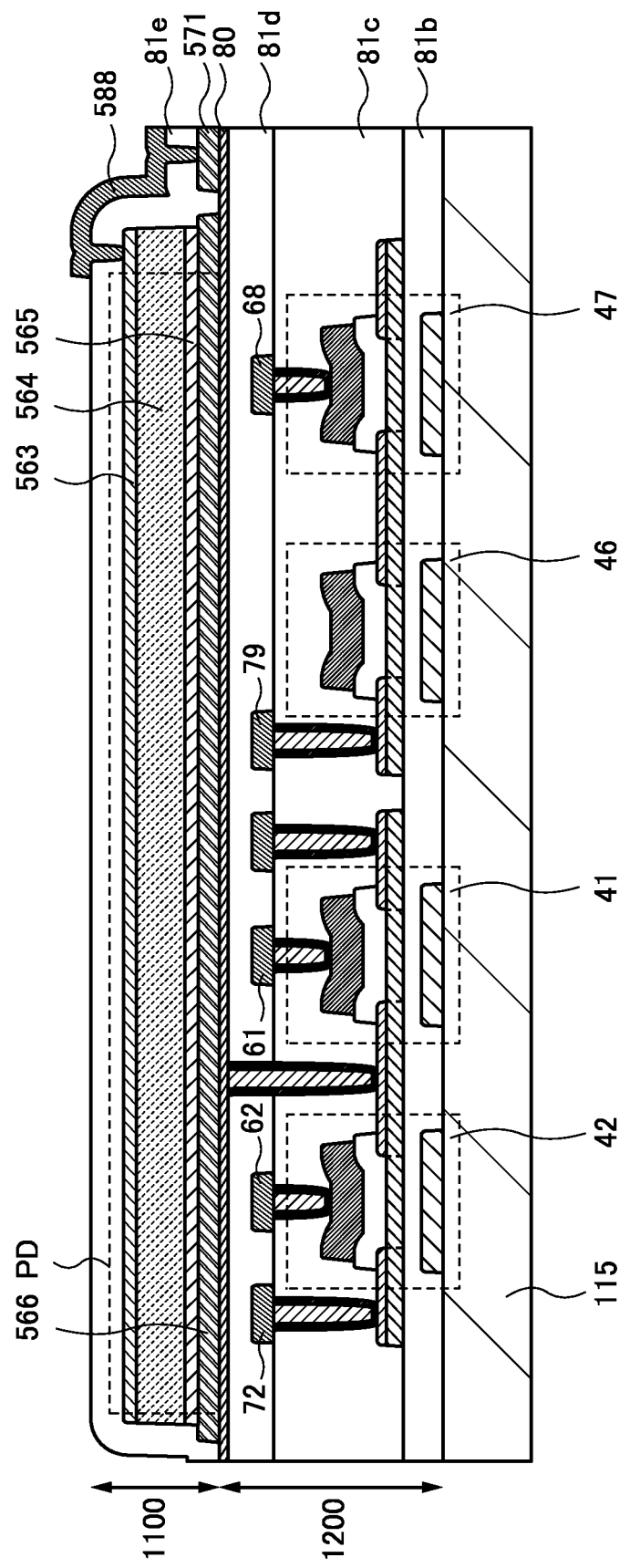
FIG. 13 is a cross-sectional view illustrating a structure of an imaging device.

Alternatively, the pixel 20 can employ a stacked structure illustrated in FIG. 13. The pixel 20 in FIG. 13 is different from the pixel 20 in FIG. 10 only in the structure of the layer 1100; the other structures are the same.

In FIG. 13, the photoelectric conversion element PD included in the layer 1100 is a PIN photodiode using an amorphous silicon film, a microcrystalline silicon film, or the like as a photoelectric conversion layer. The photoelectric conversion element PD can include an n-type semiconductor layer 565, an i-type semiconductor layer 564, a p-type semiconductor layer 563, the electrode 566, the wiring 571, and the wiring 588.

The electrode 566 is in contact with the insulating layer 80. The p-type semiconductor layer 563 is electrically connected to the electrode 566 through the wiring 588. The wiring 588 is provided to penetrate the insulating layer 81e.

The i-type semiconductor layer 564 is preferably formed using amorphous silicon. The p-type semiconductor layer 563 and the n-type semiconductor layer 565 can each be formed using amorphous silicon, microcrystalline silicon, or the like that includes a dopant imparting the corresponding conductivity type. A photodiode in which a photoelectric conversion layer is formed using amorphous silicon has high sensitivity in a visible light wavelength region, and thus can easily sense weak visible light.

Figure 14A:
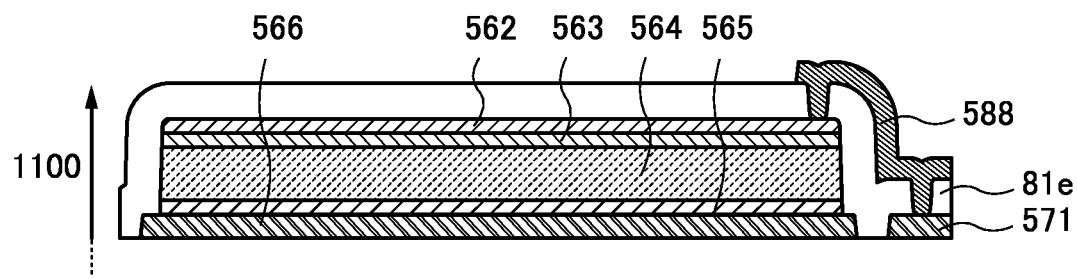
FIGS. 14A to 14C are cross-sectional views each illustrating connection of a photoelectric conversion element.
Figure 14B:
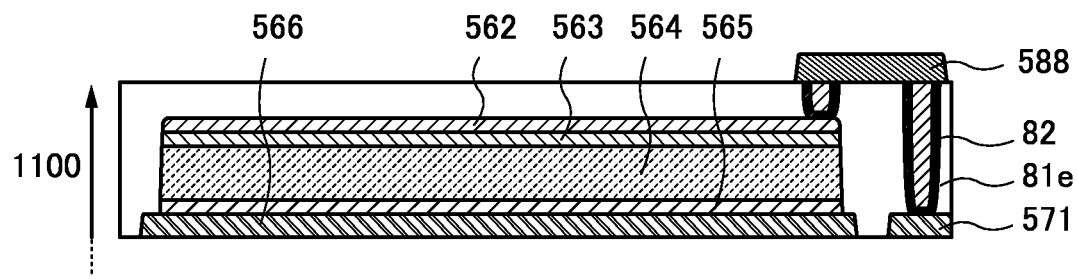
Figure 14C:
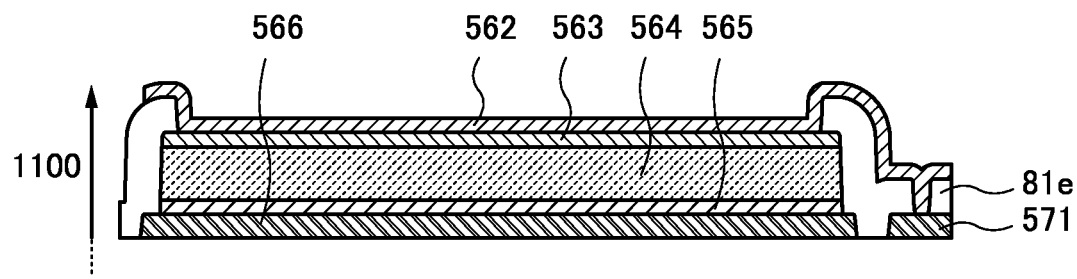

FIGS. 14A to 14C show other examples of the structure of the photoelectric conversion element PD having a structure of a PIN thin film photodiode and the connection between the photoelectric conversion element PD and the wirings. Note that the structure of the photoelectric conversion element PD and the connection between the photoelectric conversion element PD and the wirings are not limited thereto, and other structures may be employed.

In FIG. 14A, the photoelectric conversion element PD includes the light-transmitting conductive layer 562 in contact with the p-type semiconductor layer 563. The light-transmitting conductive layer 562 serves as an electrode and can increase the output current of the photoelectric conversion element PD.

The light-transmitting conductive layer 562 can be formed using, for example, indium tin oxide, indium tin oxide containing silicon, indium oxide containing zinc, zinc oxide, zinc oxide containing gallium, zinc oxide containing aluminum, tin oxide, tin oxide containing fluorine, tin oxide containing antimony, graphene, or graphene oxide. The light-transmitting conductive layer 562 is not limited to a single layer and may be a stack of different films.

In FIG. 14B, the light-transmitting conductive layer 562 and the wiring 571 are connected to each other through the conductor 82 and the wiring 588. Note that the p-type semiconductor layer 563 of the photoelectric conversion element PD and the wiring 571 can be connected to each other through the conductor 82 and the wiring 588. In the structure of FIG. 14B, the light-transmitting conductive layer 562 is not necessarily provided.

In FIG. 14C, an opening that exposes the p-type semiconductor layer 563 is provided in an insulating layer 81e covering the photoelectric conversion element PD, and the light-transmitting conductive layer 562 covering the opening is electrically connected to the wiring 571.

The photoelectric conversion element PD containing the selenium-based material, amorphous silicon, or the like can be manufactured through general semiconductor manufacturing processes such as a deposition process, a lithography process, and an etching process. Since the resistance of the selenium-based material is high, the photoelectric conversion layer 561 does not need to be divided between circuits as illustrated in FIG. 10. Thus, the photoelectric conversion element PD can be manufactured with a high yield at low cost.

Figure 15:
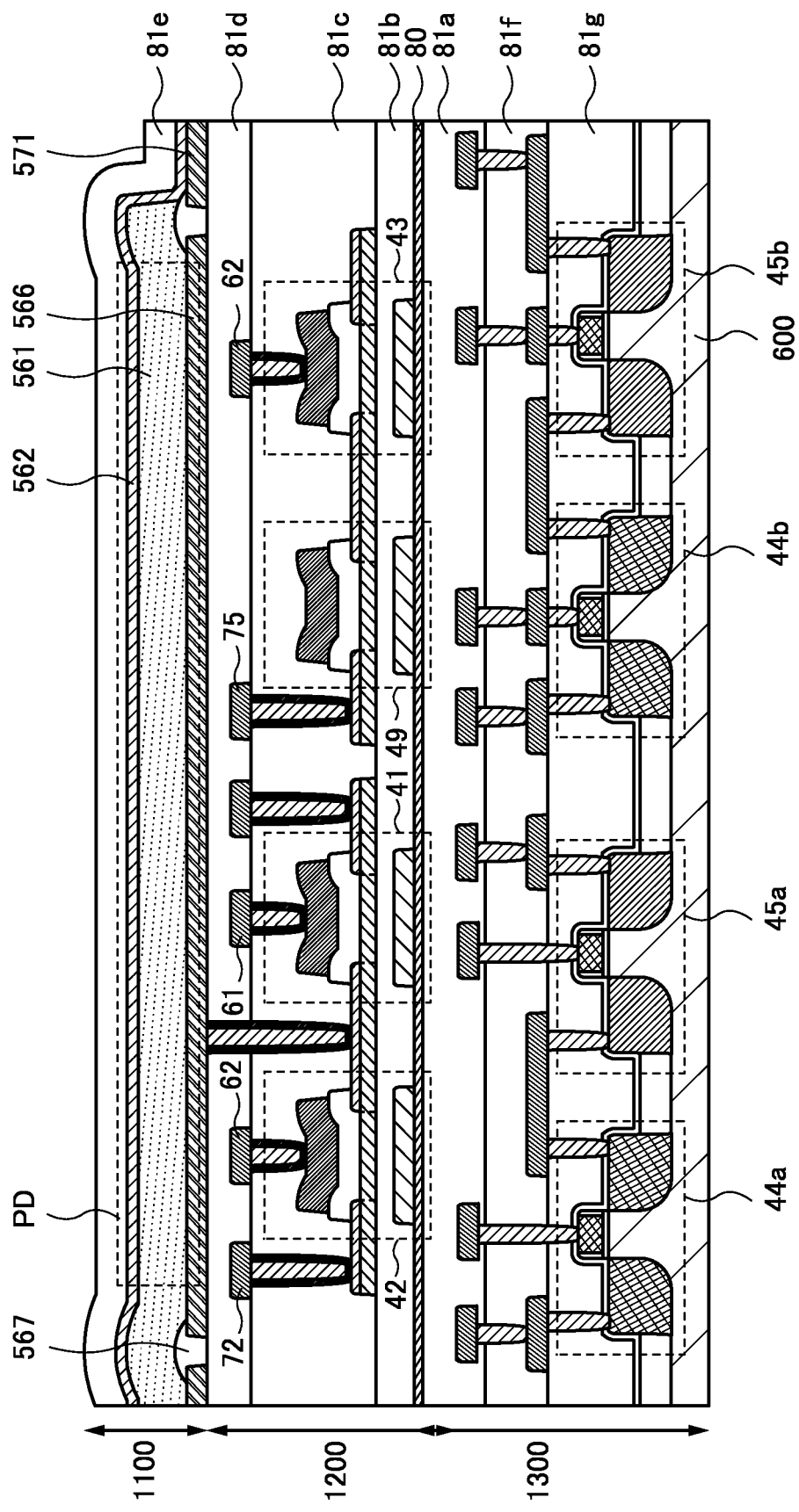
FIG. 15 is a cross-sectional view illustrating a structure of an imaging device.

Alternatively, the pixel 20 may have a stacked structure illustrated in FIG. 15. In the pixel 20 in FIG. 15, the layer 1200 and the layer 1100 are provided over a layer 1300. In the layer 1300, for example, the product-sum circuit, the adder circuit, the memory circuit such as a latch, the data converter circuit such as an A/D converter circuit, the buffer circuit, and the control circuit for the entire imaging device, which are illustrated in FIGS. 3A to 3C, can be provided.

Figure 16A:
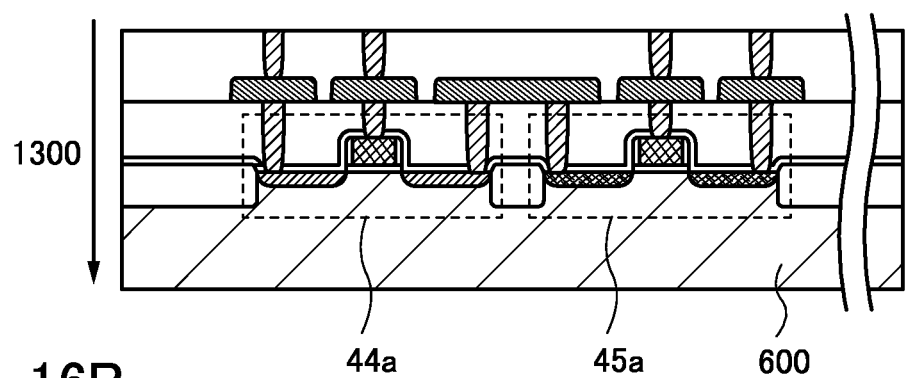
FIGS. 16A and 16B are cross-sectional views each illustrating a structure of an imaging device.
Figure 16B:
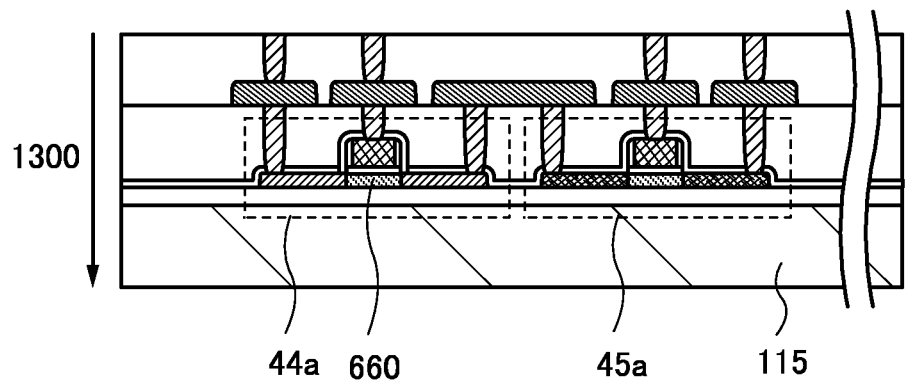

The layer 1300 can include Si transistors used in the amplifier circuit 22a, the memory circuit 22b, the feature extraction circuit 30, and the determination output circuit 31 (e.g., the transistors 44 to 48 included in the amplifier circuit 22a). Although FIG. 15 illustrates an example of FIN-type transistors 44 to 48 provided on a silicon substrate 600, the transistors 44a, 44b, 45a, and 45b may be planar transistors as illustrated in FIG. 16A. Alternatively, as illustrated in FIG. 16B, transistors each including a semiconductor layer 660 formed using a silicon thin film may be used. The semiconductor layer 660 can be formed using polycrystalline silicon or single crystal silicon of a silicon-on-insulator (SOI) structure.

FIG. 15 illustrates the structure obtained by adding the layer 1300 to the structure shown in FIG. 10; it is also possible to add the layer 1300 to the structure shown in FIG. 13.

Figure 17:
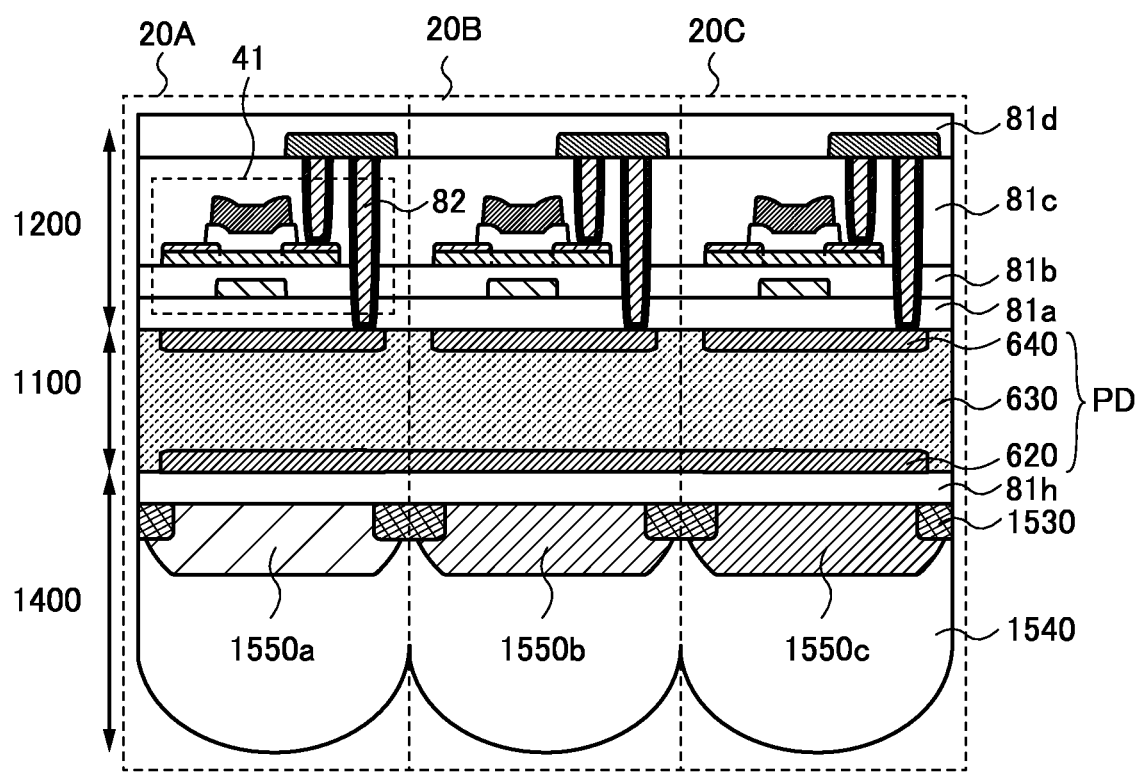
FIG. 17 is a cross-sectional view illustrating a structure of an imaging device.

FIG. 17 is a cross-sectional view of a structure obtained by adding a layer 1400 to the structure shown in FIG. 9, and illustrates three pixels (pixels 20A, 20B, and 20C).

In the layer 1400, a light-blocking layer 1530, optical conversion layers 1550a, 1550b, and 1550c, a microlens array 1540, and the like can be provided.

An insulating layer 81h is formed in a region in contact with the layer 1100. As the insulating layer 81h, a silicon oxide film with a high visible-light transmitting property can be used, for example. In addition, a silicon nitride film may be stacked as a passivation film. A dielectric film of hafnium oxide or the like may be stacked as an anti-reflection film.

The light-blocking layer 1530 can be provided on the insulating layer 81h. The light-blocking layer 1530 is provided at a boundary between adjacent pixels and has a function of blocking stray light that enters from oblique directions. The light-blocking layer 1530 can be formed of a metal layer of aluminum, tungsten, or the like, or a stack including the metal layer and a dielectric film functioning as an anti-reflection film.

The optical conversion layers 1550a to 1550c can be provided on the insulating layer 81h and the light-blocking layer 1530. Color images are obtained, for example, when color filters of red (R), green (G), blue (B), yellow (Y), cyan (C), magenta (M), and/or the like are assigned to the optical conversion layers 1550a to 1550c.

Note that when a filter that blocks light with a wavelength shorter than or equal to that of visible light is used as the optical conversion layer, an infrared imaging device is obtained. When a filter that blocks light with a wavelength shorter than or equal to that of near infrared light is used as the optical conversion layer, a far-infrared imaging device is obtained. When a filter that blocks light with a wavelength longer than or equal to that of visible light is used as the optical conversion layer, an ultraviolet imaging device is obtained.

When a scintillator is used as the optical conversion layer, it is possible to obtain an imaging device that takes an image visualizing the intensity of radiation and is used for an X-ray imaging device or the like. Radiations such as X-rays that pass through an object to enter a scintillator are converted into light (fluorescence) such as visible light or ultraviolet light owing to photoluminescence. Then, the photoelectric conversion element PD detects the light to obtain image data. Moreover, the imaging device having the above structure may be used in a radiation detector or the like.

A scintillator contains a substance that, when irradiated with radiation such as X-rays or gamma rays, absorbs energy of the radiation to emit visible light or ultraviolet light. For example, it is possible to use a resin or ceramics in which any of $Gd_2O_2S$:Tb, $Gd_2O_2S$:Pr, $Gd_2O_2S$:Eu, $BaFCl$:Eu, NaI, CsI, $CaF_2$, $BaF_2$, $CeF_3$, LiF, LiI, and ZnO is dispersed.

The microlens array 1540 can be provided on the optical conversion layers 1550a to 1550c. Light that passes through lenses of the microlens array 1540 passes the optical conversion layers 1550a to 1550c that are placed directly on the microlens array 1540, and is applied to the photoelectric conversion element PD.

Figure 18A:
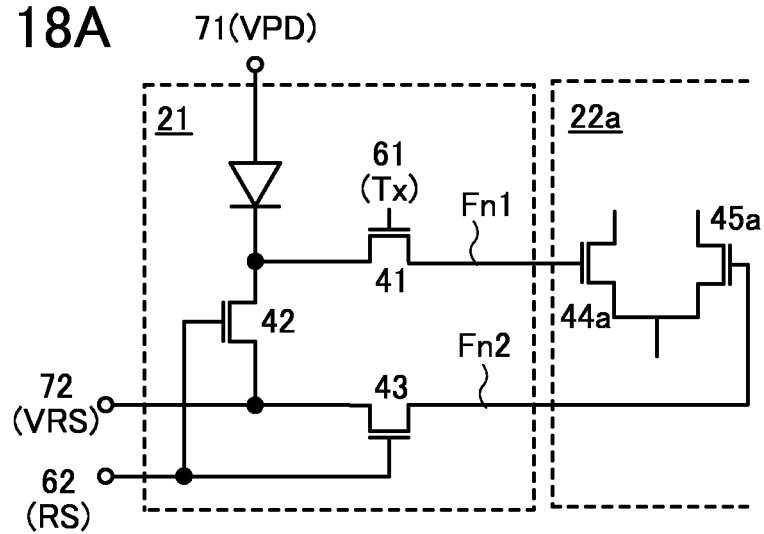
FIGS. 18A to 18C are circuit diagrams each illustrating a pixel.

As illustrated in FIG. 18A, the light-receiving circuit 21 may have a structure including floating nodes Fn1 and Fn2 without the capacitors C1 and C2. The floating node Fn1 holds charge using the gate capacitances of the transistors 41 and 44a and the parasitic capacitance between wirings.

Figure 18B:
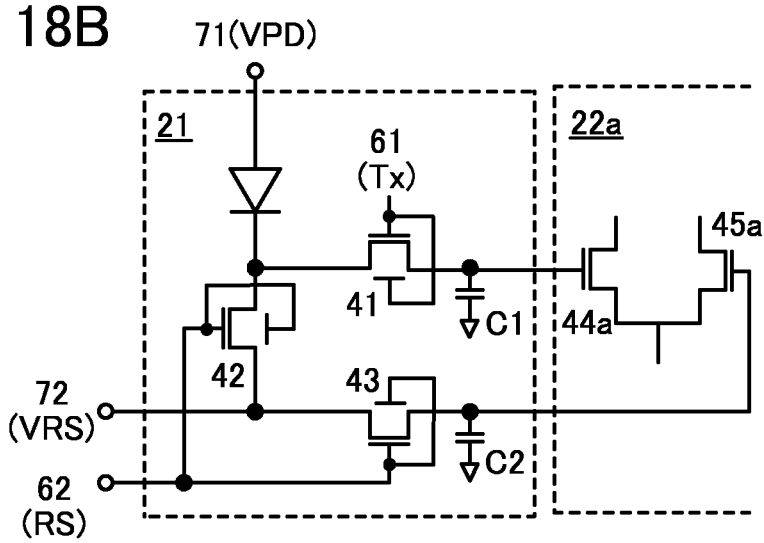

The transistors 41 to 43 included in the light-receiving circuit 21 may each have a structure with a back gate as illustrated in FIG. 18B. FIG. 18B illustrates a structure in which a constant potential is applied to the back gates, which enables control of the threshold voltages. Although an example in which transistors with back gates are used for the transistors 41 to 43 is shown, all or some of the transistors used in the image device 100 may have back gates.

As illustrated in FIG. 18B, wirings connected to the back gates of the transistors 41 to 43 may be electrically connected to the gates of the corresponding transistors.

In an n-channel transistor, the threshold voltage is shifted in the positive direction when a potential lower than a source potential is applied to the back gate. In contrast, the threshold voltage is shifted in the negative direction when a potential higher than a source potential is applied to the back gate. Accordingly, in the case where the on/off state of each transistor is controlled with a predetermined gate voltage, the off-state current can be reduced when a potential lower than a source potential is supplied to a back gate, and the on-state current can be increased when a potential higher than a source potential is supplied to the back gate.

It is preferred that the floating nodes Fn1 and Fn2 in the light-receiving circuit 21 be highly capable of retaining a potential; thus, OS transistors with a small off-state current are preferably used as the transistors 41 to 43 as described above. When a potential lower than a source potential is supplied to the back gates of the transistors 41 to 43, the off-state current can be further reduced; thus, the potential retention capability of the floating nodes Fn1 and Fn2 can be enhanced.

Figure 18C:
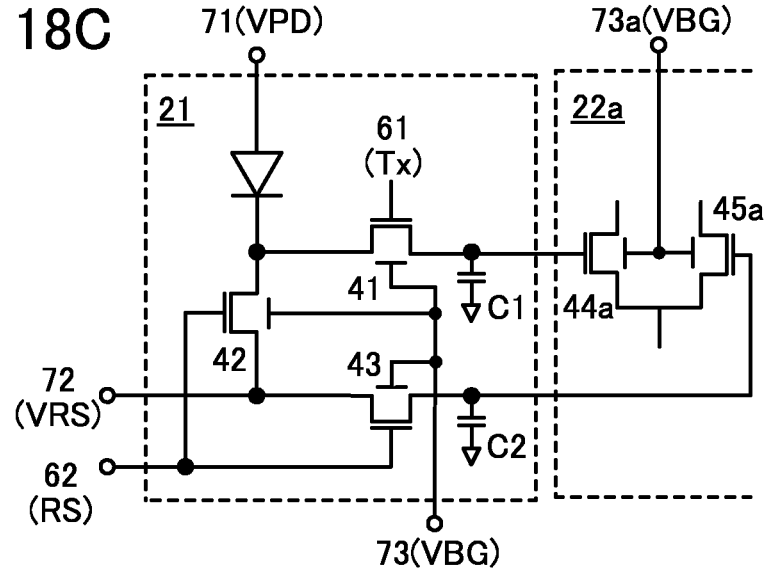

As described above, for example, transistors with a large on-state current are preferably used as the transistors 44a and 45a included in the amplifier circuit 22a as illustrated in FIG. 18C. The on-state current can be increased when a potential higher than a source potential is applied to back gates of the transistors 44a and 45a. FIG. 18C illustrates an example in which a terminal VBG 73 is connected to the back gates of the transistors included in the light-receiving circuit 21 and a terminal VBG 73a is connected to the back gates of the transistors included in the amplifier circuit 22a; however, the back gates of the transistors can be supplied with different potentials. Thus, an increase in on-state current can improve response characteristics of the amplifier circuit 22a, and the amplifier circuit 22a can operate at high frequency.

In order to increase the light sensitivity of an imaging device, the amount of current flowing through photodiodes can be controlled by changing voltage applied between the photodiodes; thus, an appropriate light sensitivity can be set in accordance with detection data of an environmental sensor (e.g., an illumination sensor, a temperature sensor, or a humidity sensor) that senses and supervises the use environment.

In addition to power supply potentials, a plurality of potentials such as a signal potential and a potential applied to the back gate are used inside an imaging device. Supply of a plurality of potentials from the outside of an imaging device increases the number of terminals; thus, an imaging device preferably has a power supply circuit generating a plurality of potentials inside the imaging device.

Figure 19A:
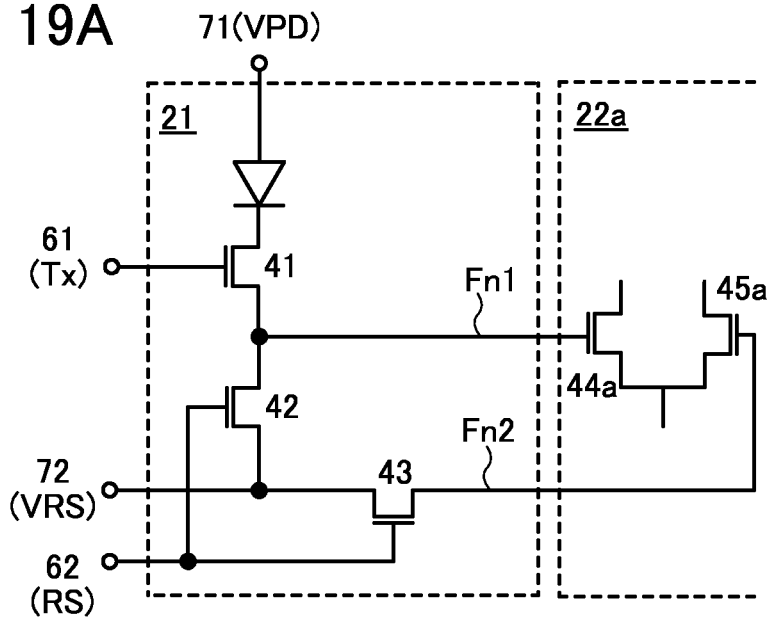
FIGS. 19A and 19B are circuit diagrams each illustrating a pixel.
Figure 19B:
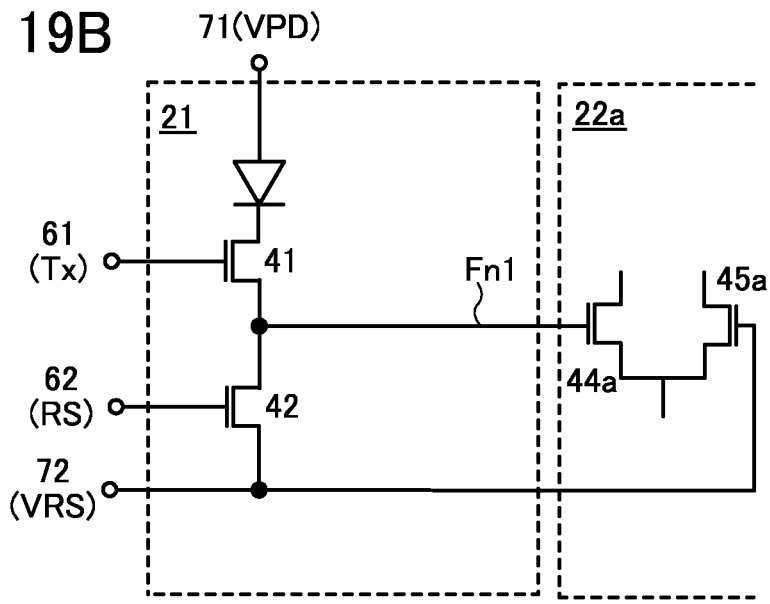

As illustrated in FIG. 19A, the transistors 41 and 42 included in the light-receiving circuit 21 may be connected to each other. One of a source and a drain of the transistor 41, one of a source and a drain of the transistor 42, and a gate of the transistor 44a are electrically connected to each other to form the floating node Fn1.

As illustrated in FIG. 19B, the terminal VRS 72 in FIG. 19A may be directly connected to a gate of the transistor 45a.

Figure 20A:
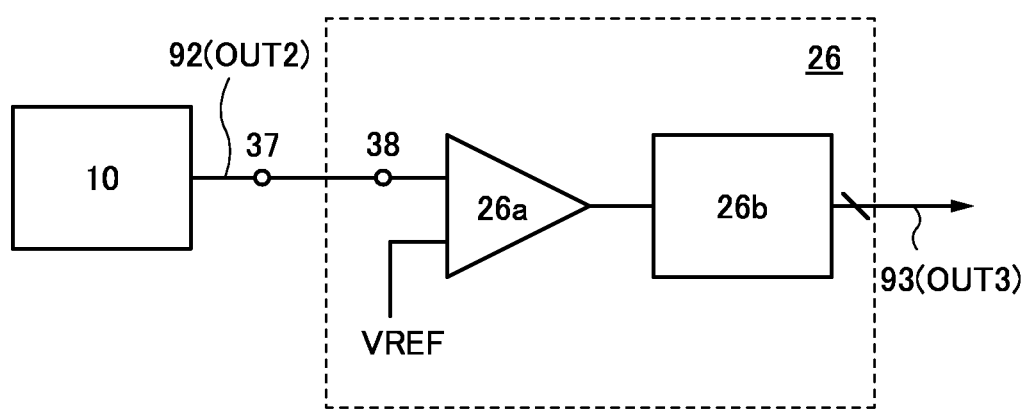
FIG. 20A is a block diagram of an analog-to-digital converter circuit.
Figure 20B:
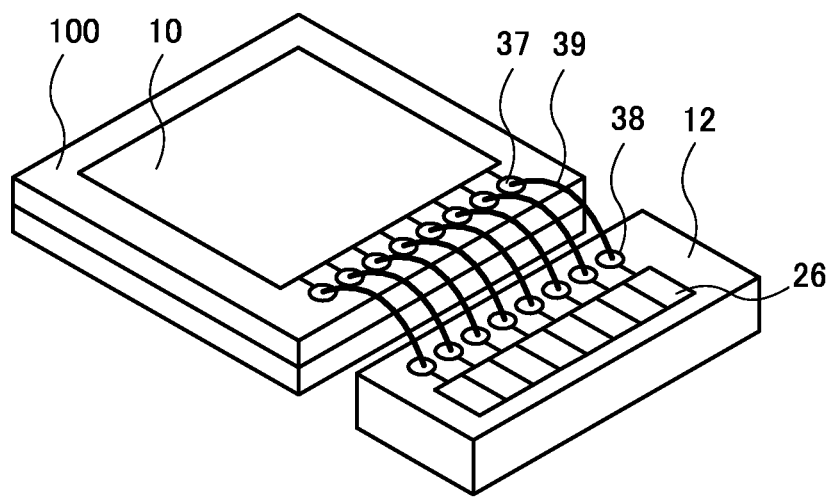
FIG. 20B illustrates connection between an imaging element and the analog-to-digital converter circuit.

FIG. 20A is a block diagram illustrating an example of the A/D converter circuit 26. The A/D converter circuit 26 can include a comparator 26a, a counter circuit 26b, and the like and output digital data of two bits or more to a wiring 93 (OUT3).

The comparator 26a compares a signal potential that is input from a terminal 37 to a terminal 38 and a reference potential (VREF) that is swept up or down. Then, the counter circuit 26b operates in accordance with the output of the comparator 26a and outputs a digital signal to the wiring 93 (OUT3).

To achieve high-speed operation and power saving, the A/D converter circuit 26 is preferably constituted by Si transistors capable of forming a CMOS circuit.

Figure 25A:
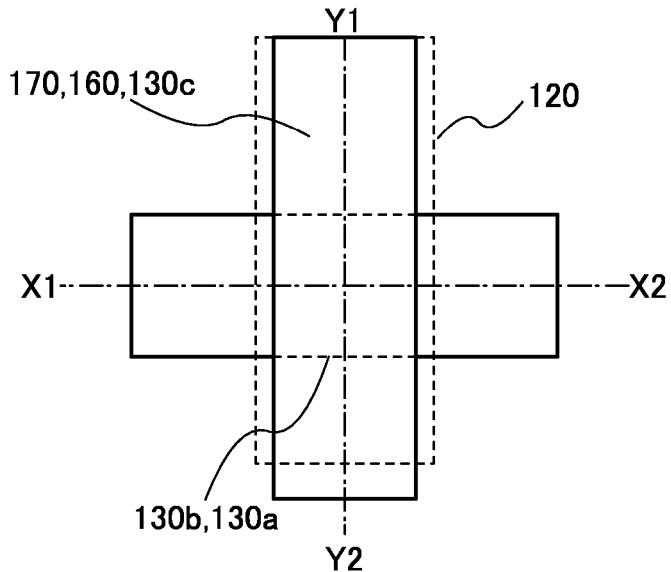
FIG. 25A is a top view of a transistor.
Figure 25B:
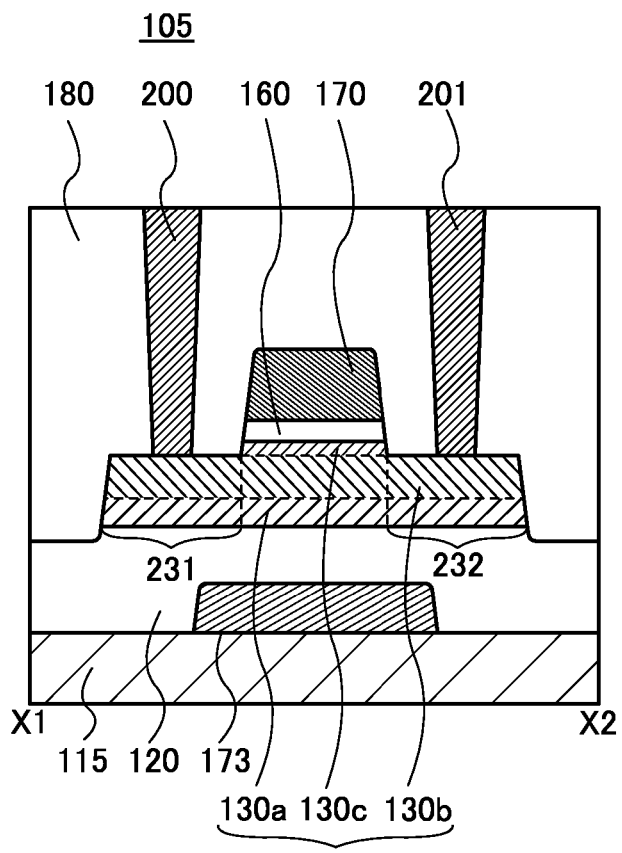
FIGS. 25B and 25C are cross-sectional views thereof.

The imaging element 10 and the A/D converter circuit 26 can be connected in such a manner, for example, that the terminals 37 and the terminals 38 are connected through wires by a wire bonding method or the like as illustrated in FIG. 25B.

In Embodiment 3, one embodiment of the present invention has been described. Other embodiments of the present invention will be described in Embodiments 1, 2, and 4 to 8. Note that one embodiment of the present invention is not limited to these embodiments. In other words, various embodiments of the invention are described in this embodiment and Embodiments 1, 2, and 4 to 8, and one embodiment of the present invention is not limited to a particular embodiment. Although an example in which one embodiment of the present invention is applied to an imaging device is described, one embodiment of the present invention is not limited thereto. Depending on circumstances or conditions, one embodiment of the present invention is not necessarily applied to an imaging device. One embodiment of the present invention may be applied to a semiconductor device with another function, for example. Although an example in which a channel formation region, a source region, a drain region, and the like of a transistor contain an oxide semiconductor is described as one embodiment of the present invention, one embodiment of the present invention is not limited thereto. Depending on circumstances or conditions, various transistors or a channel formation region, a source region, a drain region, and the like of a transistor in one embodiment of the present invention may contain a variety of semiconductors. Depending on circumstances or conditions, various transistors or a channel formation region, a source region, a drain region, and the like of a transistor in one embodiment of the present invention may contain at least one of silicon, germanium, silicon germanium, silicon carbide, gallium arsenide, aluminum gallium arsenide, indium phosphide, gallium nitride, and an organic semiconductor, for example, or alternatively do not necessarily contain an oxide semiconductor. Although an example in which a global shutter system is employed is described as one embodiment of the present invention, one embodiment of the present invention is not limited thereto. Depending on circumstances or conditions, another system such as a rolling shutter system may be employed in one embodiment of the present invention, or alternatively a global shutter system is not necessarily employed.

The structure and method described in this embodiment can be implemented by being combined as appropriate with any of the other structures and methods described in the other embodiments.

Embodiment 4

In this embodiment, an OS transistor that can be used in one embodiment of the present invention will be described with reference to drawings. In the drawings in this embodiment, some components are enlarged, reduced in size, or omitted for easy understanding.

Figure 21A:
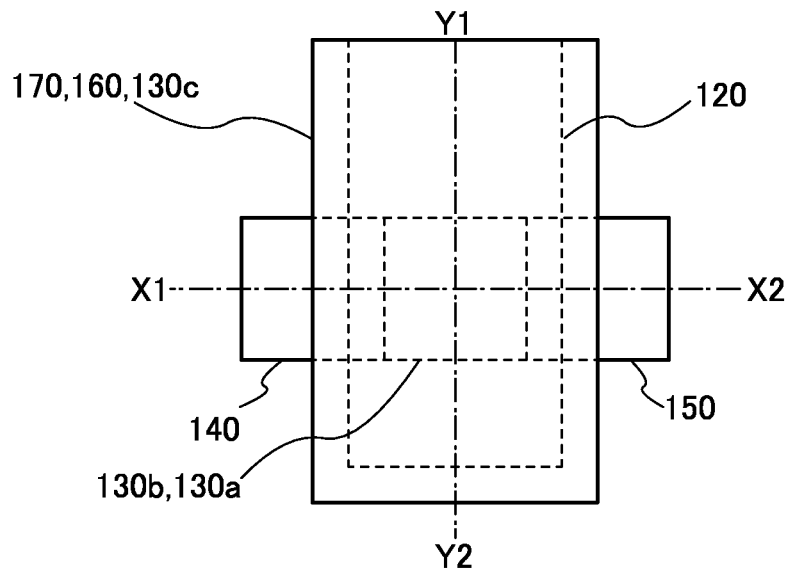
FIG. 21A is a top view of a transistor.
Figure 21B:
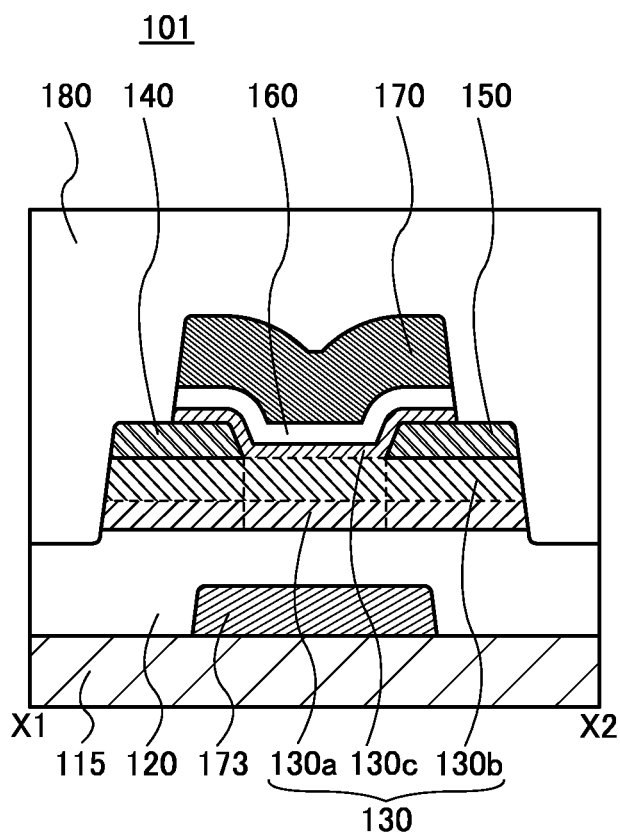
FIGS. 21B and 21C are cross-sectional views thereof.
Figure 21C:
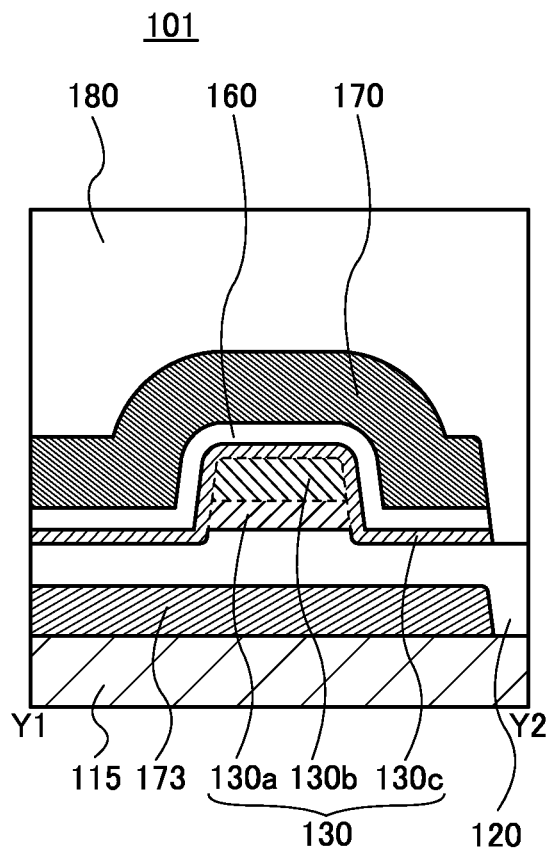

FIGS. 21A to 21C are a top view and cross-sectional views of a transistor 101 of one embodiment of the present invention. FIG. 21A is the top view. FIG. 21B shows a cross section along the dashed-dotted line X1-X2 in FIG. 21A. FIG. 21C shows a cross section along the dashed-dotted line Y1-Y2 in FIG. 21A.

In the drawings explained in this embodiment, the direction of the dashed-dotted line X1-X2 is referred to as channel length direction, and the direction of the dashed-dotted line Y1-Y2 is referred to as channel width direction.

The transistor 101 includes an insulating layer 120 in contact with the substrate 115, the conductive layer 173 in contact with the insulating layer 120, the oxide semiconductor layer 130 in contact with the insulating layer 120, the conductive layers 140 and 150 electrically connected to the oxide semiconductor layer 130, the insulating layer 160 in contact with the oxide semiconductor layer 130 and the conductive layers 140 and 150, and the conductive layer 170 in contact with the insulating layer 160.

Over the transistor 101, an insulating layer 180 in contact with the oxide semiconductor layer 130, the conductive layers 140 and 150, the insulating layer 160, and the conductive layer 170 may be provided as necessary.

The oxide semiconductor layer 130 can have a three-layer structure of oxide semiconductor layers 130a, 130b, and 130c, for example.

The conductive layers 140 and 150 can function as a source electrode layer and a drain electrode layer. The insulating layer 160 and the conductive layer 170 can function as a gate insulating film and a gate electrode layer, respectively.

Using the conductive layer 173 as a second gate electrode layer (back gate) enables the increase in on-state current and control of the threshold voltage. Note that the conductive layer 173 can also serve as a light-blocking layer.

In order to increase the on-state current, for example, the conductive layers 170 and 173 are made to have the same potential, and the transistor is driven as a double-gate transistor. Furthermore, in order to control the threshold voltage, a fixed potential that is different from the potential of the conductive layer 170 is supplied to the conductive layer 173.

In the oxide semiconductor layer 130, a region in contact with the conductive layer 140 and a region in contact with the conductive layer 150 can function as a source region and a drain region.

Since the oxide semiconductor layer 130 is in contact with the conductive layers 140 and 150, an oxygen vacancy is generated in the oxide semiconductor layer 130, and the regions become n-type low-resistance regions owing to interaction between the oxygen vacancy and hydrogen that remains in the oxide semiconductor layer 130 or diffuses into the oxide 30 semiconductor layer 130 from the outside.

Note that functions of a "source" and a "drain" of a transistor are sometimes replaced with each other when a transistor of opposite polarity is used or when the direction of current flow is changed in circuit operation, for example. Therefore, the terms "source" and "drain" can be interchanged with each other in this specification. In addition, the term "electrode layer" can be replaced with the term "wiring".

The conductive layers 140 and 150 are in contact with a top surface of the oxide semiconductor layer 130 and are not in contact with side surfaces of the oxide semiconductor layer 130. This structure facilitates compensation for oxygen vacancies in the oxide semiconductor layer 130 with oxygen included in the insulating layer 120.

Figure 22A:
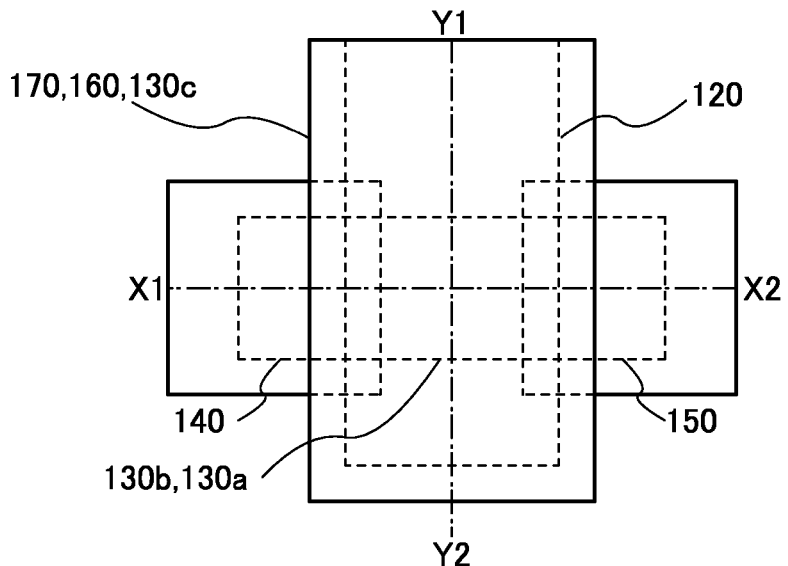
FIG. 22A is a top view of a transistor.
Figure 22B:
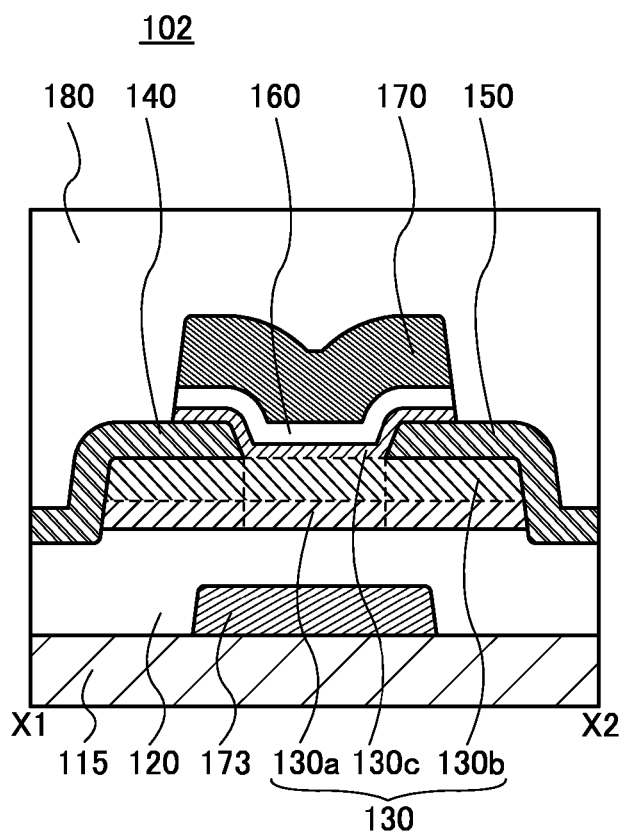
FIGS. 22B and 22C are cross-sectional views thereof.
Figure 22C:
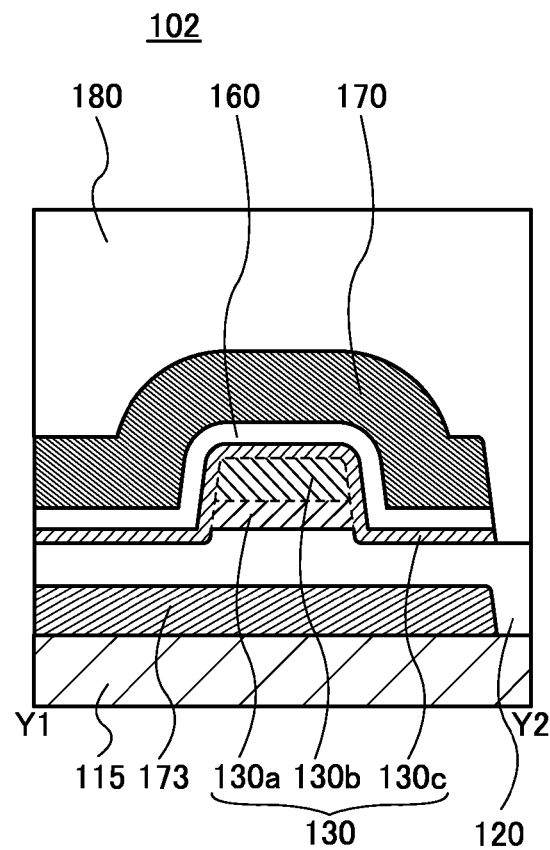

The transistor in one embodiment of the present invention may have a structure illustrated in FIGS. 22A to 22C. FIG. 22A is a top view of a transistor 102. FIG. 22B shows a cross section along the dashed-dotted line X1-X2 in FIG. 22A. FIG. 22C shows a cross section along the dashed-dotted line Y1-Y2 in FIG. 22A.

The transistor 102 has the same structure as the transistor 101 except that the conductive layers 140 and 150 are in contact with the insulating layer 120, and that the conductive layers 140 and 150 are in contact with side surfaces of the oxide semiconductor layer 130.

Figure 23A:
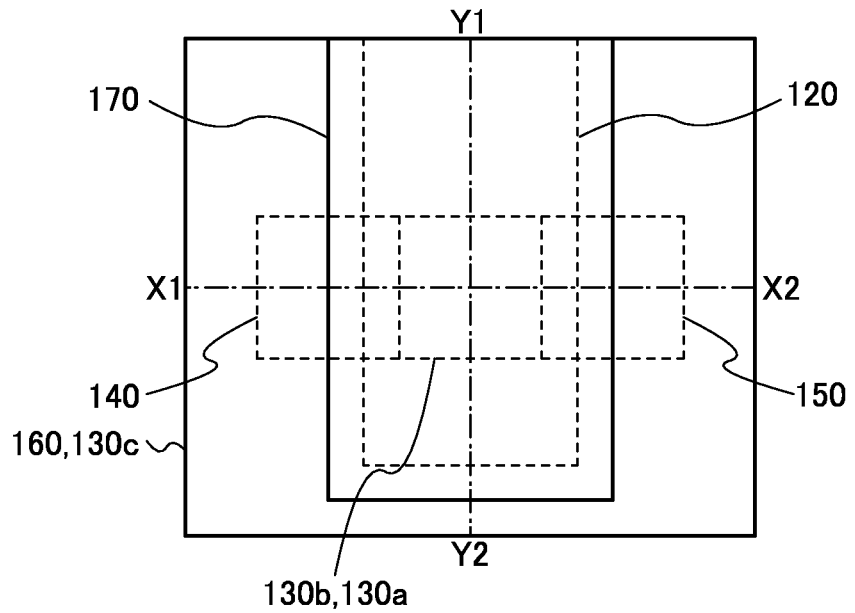
FIG. 23A is a top view of a transistor.
Figure 23B:
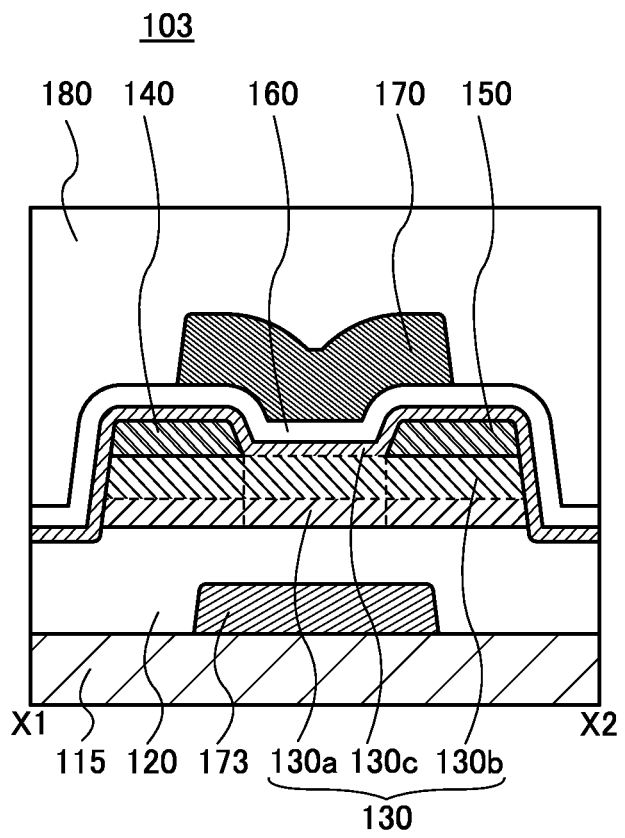
FIGS. 23B and 23C are cross-sectional views thereof.
Figure 23C:
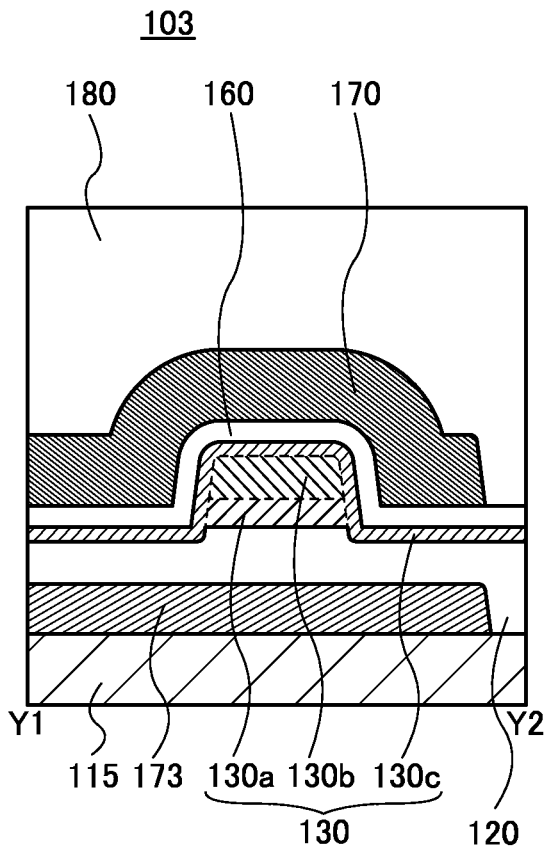

The transistor in one embodiment of the present invention may have a structure illustrated in FIGS. 23A to 23C. FIG. 23A is a top view of a transistor 103. FIG. 23B shows a cross section along the dashed-dotted line X1-X2 in FIG. 23A. FIG. 23C shows a cross section along the dashed-dotted line Y1-Y2 in FIG. 23A.

The transistor 103 has the same structure as the transistor 101 except that the oxide semiconductor layers 130a and 130b and the conductive layers 140 and 150 are covered with the oxide semiconductor layer 130c and the insulating layer 160.

When the oxide semiconductor layer 130c covers the oxide semiconductor layers 130a and 130b, the effect of compensating for oxygen to the oxide semiconductor layers 130a and 130b and the insulating layer 120 can be enhanced. Moreover, oxidation of the conductive layers 140 and 150 by the insulating layer 180 can be suppressed with the oxide semiconductor layer 130c placed therebetween.

Figure 24A:
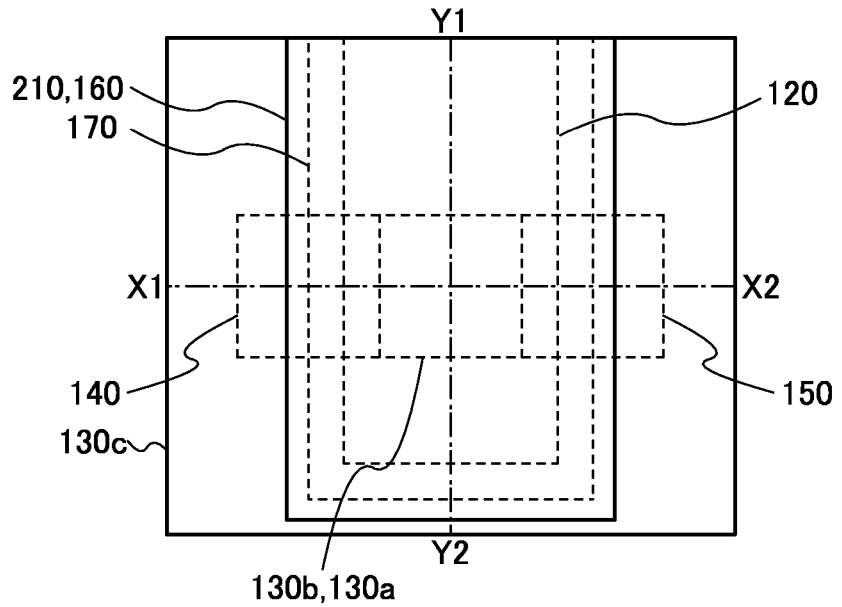
FIG. 24A is a top view of a transistor.
Figure 24B:
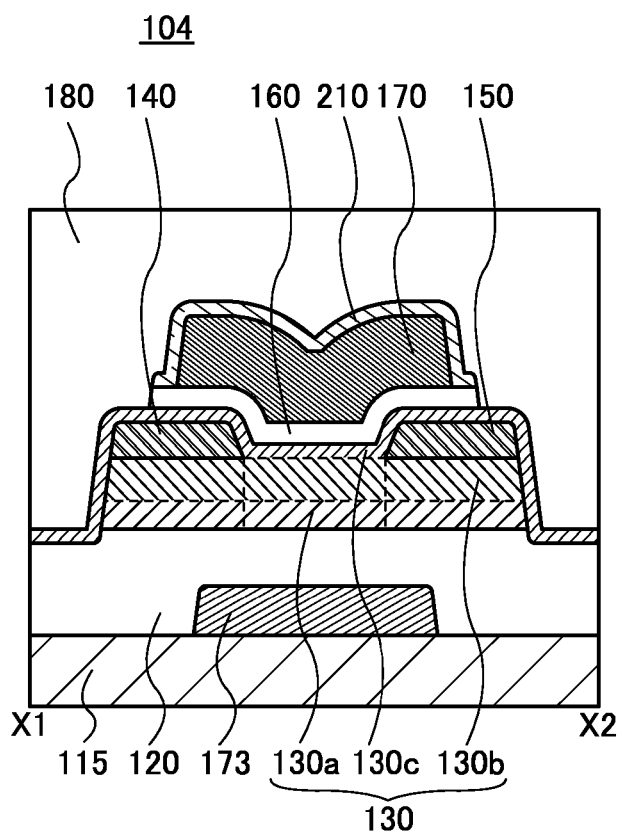
FIGS. 24B and 24C are cross-sectional views thereof.
Figure 24C:
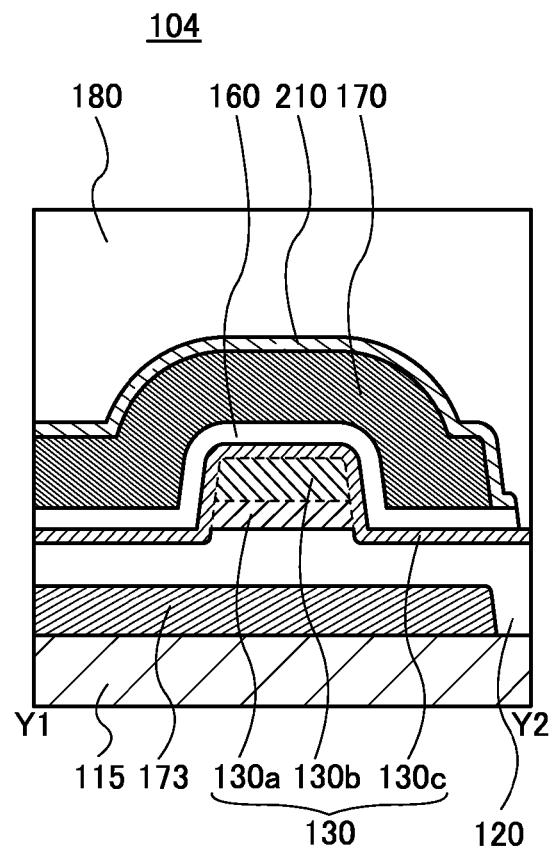

The transistor in one embodiment of the present invention may have a structure illustrated in FIGS. 24A to 24C. FIG. 24A is a top view of a transistor 104. FIG. 24B shows a cross section along the dashed-dotted line X1-X2 in FIG. 24A. FIG. 24C shows a cross section along the dashed-dotted line Y1-Y2 in FIG. 24A.

The transistor 104 has the same structure as the transistor 101 except that the oxide semiconductor layers 130a and 130b and the conductive layers 140 and 150 are covered with the oxide semiconductor layer 130c, and that the insulating layer 170 is covered with an insulating layer 210.

The insulating layer 210 can be formed using a material with a blocking property against oxygen, for example, metal oxide such as aluminum oxide. Oxidation of the conductive layer 170 by the insulating layer 180 can be suppressed with the insulating layer 210 placed therebetween.

The transistors 101 to 104 each have a top-gate structure including a region where the conductive layer 170 overlaps the conductive layers 140 and 150. To reduce parasitic capacitance, the width of the region in the channel length direction is preferably greater than or equal to 3 nm and less than 300 nm. Since an offset region is not formed in the oxide semiconductor layer 130 in this structure, a transistor with a large on-state current can be easily formed.

Figure 25C:
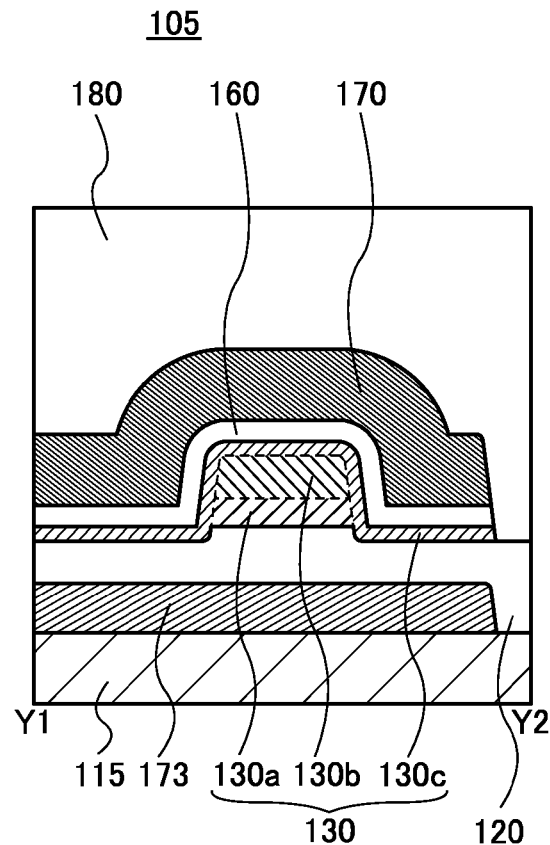

The transistor in one embodiment of the present invention may have a structure illustrated in FIGS. 25A to 25C. FIG. 25A is a top view of a transistor 105. FIG. 25B shows a cross section along the dashed-dotted line X1-X2 in FIG. 25A. FIG. 25C shows a cross section along the dashed-dotted line Y1-Y2 in FIG. 25A.

The transistor 105 includes the insulating layer 120 in contact with the substrate 115, the conductive layer 173 in contact with the insulating layer 120, the oxide semiconductor layer 130 in contact with the insulating layer 120, the insulating layer 160 in contact with the oxide semiconductor layer 130, and the conductive layer 170 in contact with the insulating layer 160.

In the insulating layer 180 serving as an interlayer insulating film, a conductor 200 in 30 contact with a region 231 of the oxide semiconductor layer 130 and a conductor 201 in contact with a region 232 of the oxide semiconductor layer 130 are provided. The conductors 200 and 201 can function as part of the source electrode layer and part of the drain electrode layer.

An impurity for forming an oxygen vacancy to increase conductivity is preferably added to the regions 231 and 232 in the transistor 105. As an impurity for forming an oxygen vacancy in an oxide semiconductor layer, one or more of the following can be used, for example: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor layer, a bond between a metal element and oxygen in the oxide semiconductor layer is cut, so that an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor that has become a conductor.

The transistor 105 has a self-aligned structure that does not include a region where the conductive layer 170 overlaps the conductive layers 140 and 150. A transistor with a self-aligned structure, which has extremely low parasitic capacitance between a gate electrode layer and source and drain electrode layers, is suitable for applications that require high-speed operation.

Figure 26A:
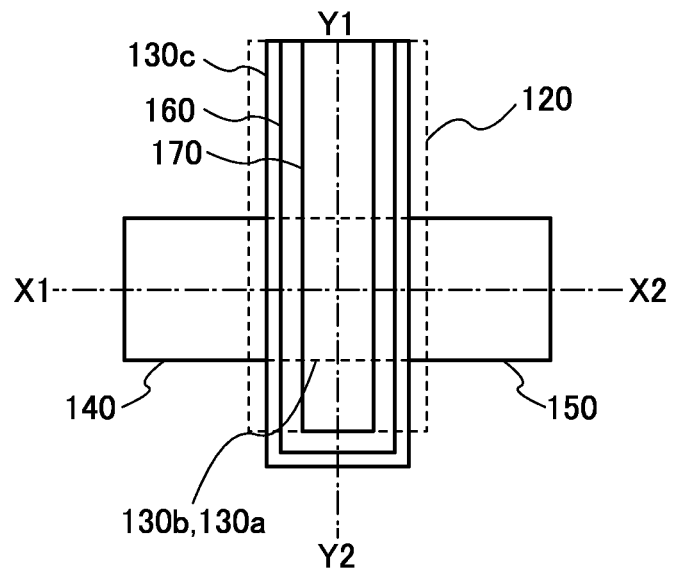
FIG. 26A is a top view of a transistor.
Figure 26B:
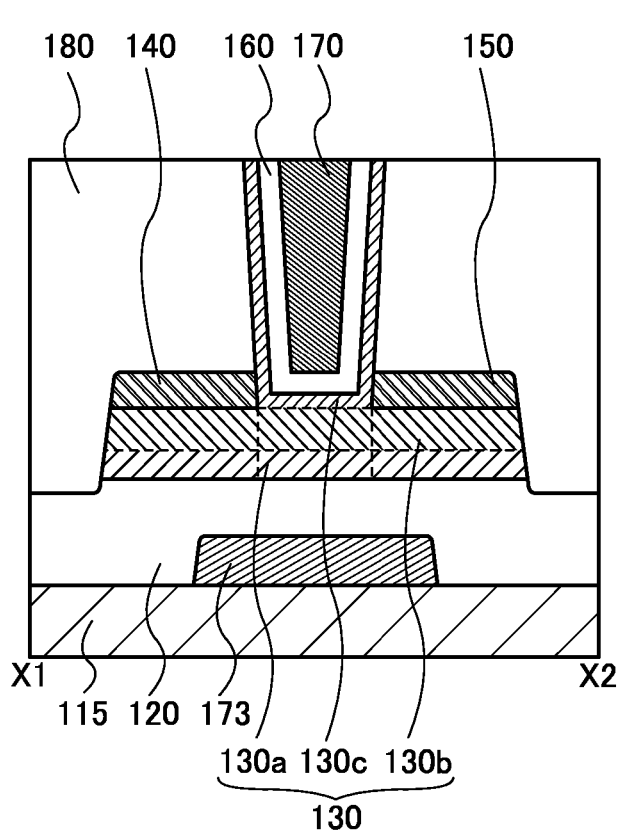
FIGS. 26B and 26C are cross-sectional views thereof.
Figure 26C:
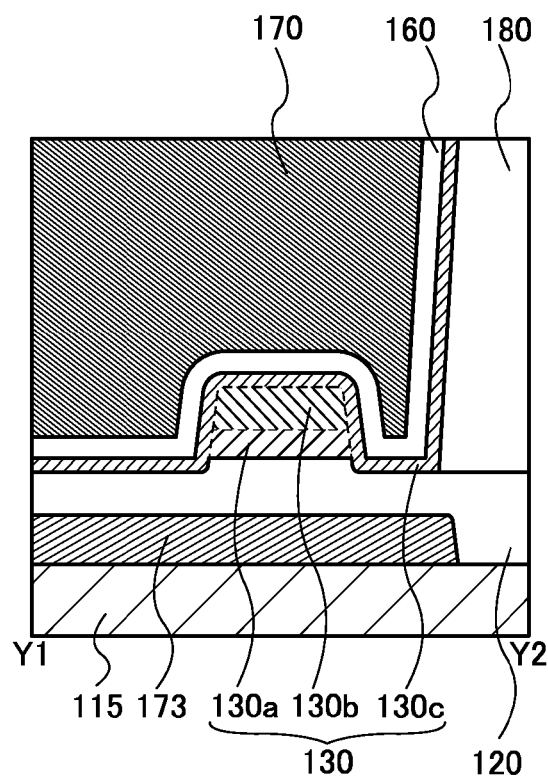

The transistor in one embodiment of the present invention may have a structure illustrated in FIGS. 26A to 26C. FIG. 26A is a top view of a transistor 106. FIG. 26B shows a cross section along the dashed-dotted line X1-X2 in FIG. 26A. FIG. 26C shows a cross section along the dashed-dotted line Y1-Y2 in FIG. 26A.

The transistor 106 includes the substrate 115, the insulating layer 120 over the substrate 115, the conductive layer 173 in contact with the insulating layer 120, the oxide semiconductor layer 130 (the oxide semiconductor layers 130a, 130b, and 130c) over the insulating layer 120, the conductive layers 140 and 150 that are in contact with the oxide semiconductor layer 130 and are apart from each other, the insulating layer 160 in contact with the oxide semiconductor layer 130c, and the conductive layer 170 in contact with the insulating layer 160.

Note that the oxide semiconductor layer 130c, the insulating layer 160, and the conductive layer 170 are provided in an opening that is provided in the insulating layer 180 over the transistor 106 and reaches the oxide semiconductor layers 130a and 130b and the insulating layer 120.

Figure 27A:
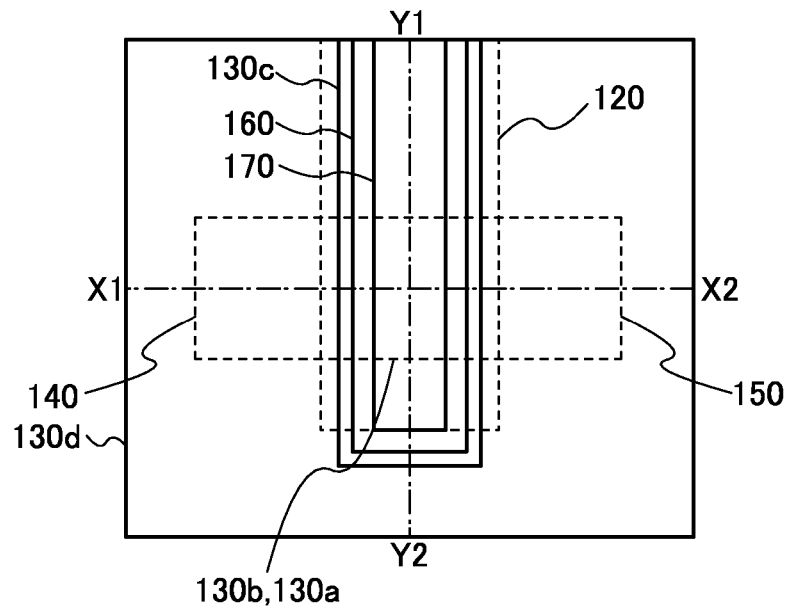
FIG. 27A is a top view of a transistor.
Figure 27B:
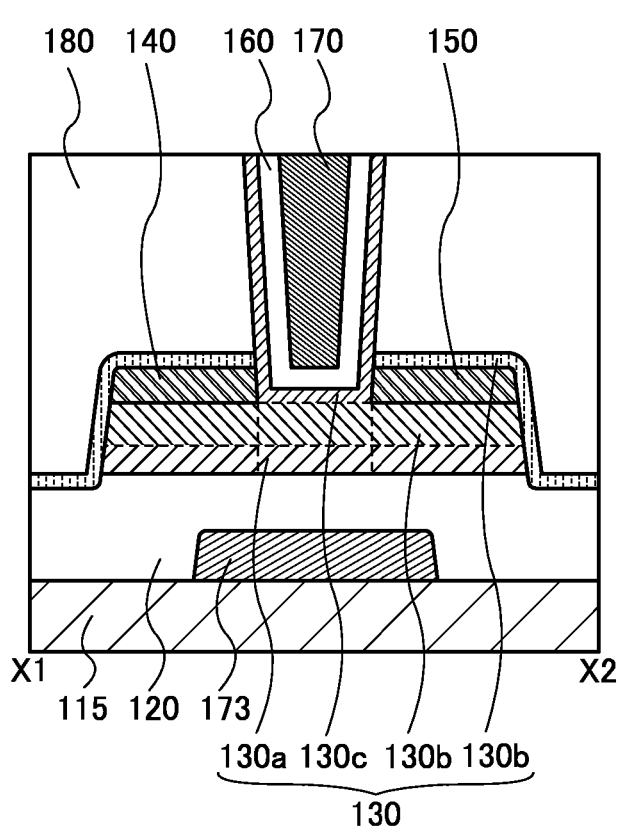
FIGS. 27B and 27C are cross-sectional views thereof.
Figure 27C:
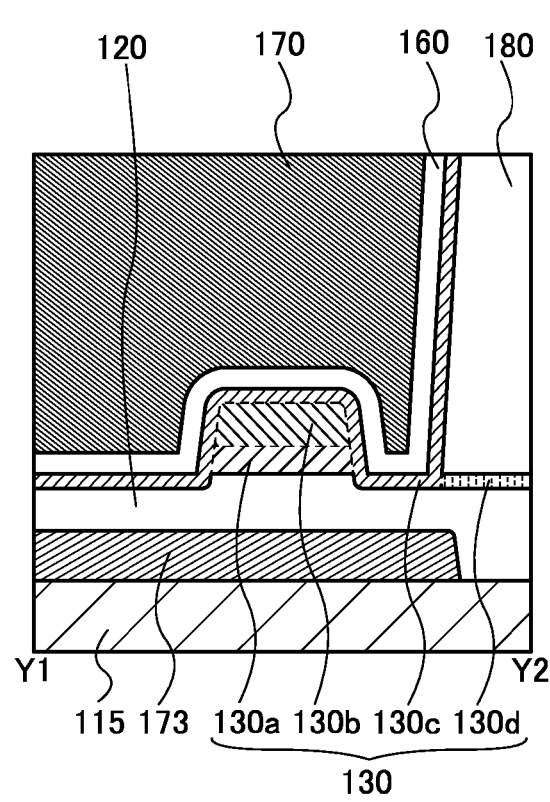

The transistor in one embodiment of the present invention may have a structure illustrated in FIGS. 27A to 27C. FIG. 27A is a top view of a transistor 107. FIG. 27B shows a cross section along the dashed-dotted line X1-X2 in FIG. 27A. FIG. 27C shows a cross section along the dashed-dotted line Y1-Y2 in FIG. 27A.

The transistor 107 has the same structure as the transistor 106 except that the oxide semiconductor layers 130a and 130b and the conductive layers 140 and 150 are covered with the oxide semiconductor layer 130c and an oxide semiconductor layer 130d. The oxide semiconductor layer 130d can be formed using the same material as the oxide semiconductor layer 130c.

When the oxide semiconductor layers 130c and 130d cover the oxide semiconductor layers 130a and 130b, the effect of compensating for oxygen to the oxide semiconductor layers 130a and 130b and the insulating layer 120 can be enhanced. Moreover, oxidation of the conductive layers 140 and 150 by the insulating layer 180 can be suppressed with the oxide semiconductor layer 130d placed therebetween.

The transistors 106 and 107 each have a smaller region in which a conductor serving as a source or a drain overlaps with a conductor serving as a gate electrode; thus, parasitic capacitance in the transistors 106 and 107 can be reduced. Consequently, the transistors 106 and 107 are suitable for components of a circuit that requires high-speed operation.

Figure 28A:
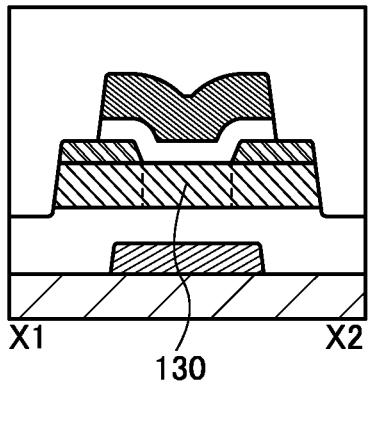
FIGS. 28A to 28H are cross-sectional views and top views of transistors.
Figure 28B:
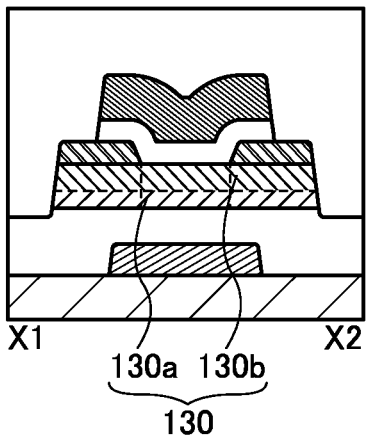

In the transistor of one embodiment of the present invention, the oxide semiconductor layer 130 may be a single layer as illustrated in FIG. 28A, or may be formed of two layers as illustrated in FIG. 28B.

Figure 28C:
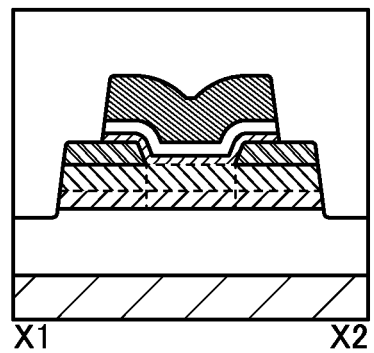

The transistor of one embodiment of the present invention may be configured not to include the conductive layer 173 as illustrated in FIG. 28C.

Figure 28D:
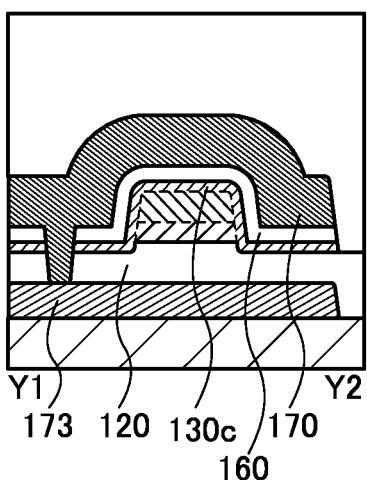

To electrically connect the conductive layer 170 to the conductive layer 173 in the transistor of one embodiment of the present invention, for example, an opening is formed in the insulating layer 120, the oxide semiconductor layer 130c, and the insulating layer 160 to reach the conductive layer 173, and the conductive layer 170 is formed to cover the opening as illustrated in FIG. 28D.

Figure 28E:
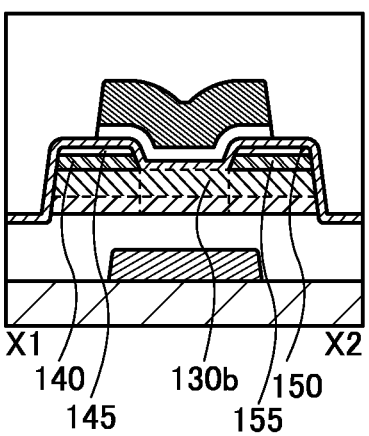

The transistor of one embodiment of the present invention may be provided with an insulating layer 145 and an insulating layer 155 that are in contact with the conductive layer 140 and the conductive layer 150, respectively, as illustrated in FIG. 28E. The insulating layers 145 and 155 can prevent oxidation of the conductive layers 140 and 150.

The insulating layers 145 and 155 can be formed using a material with a blocking property against oxygen, for example, metal oxide such as aluminum oxide.

Figure 28F:
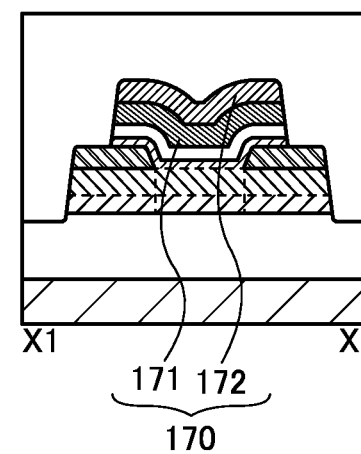

In the transistor of one embodiment of the present invention, the conductive layer 170 may be a stack including a conductive layer 171 and a conductive layer 172, as illustrated in FIG. 28F.

Figure 28G:
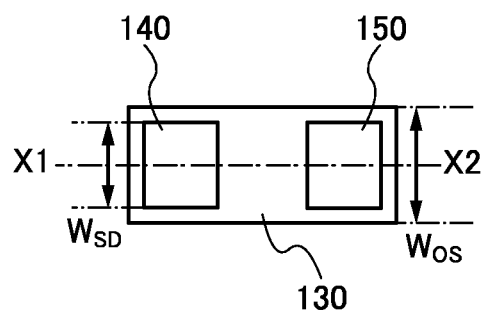
Figure 28H:
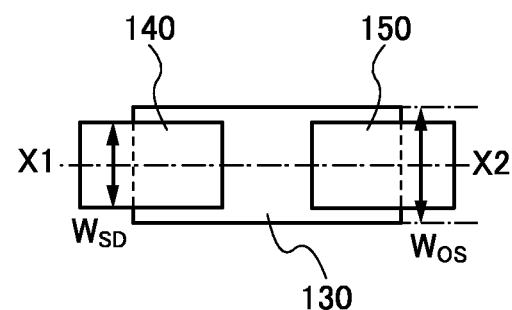

In the transistor of one embodiment of the present invention, in which the conductive layers 140 and 150 are provided over the oxide semiconductor layer 130, the width ($W_{SD}$) of the conductive layers 140 and 150 may be smaller than the width ($W_{OS}$) of the oxide semiconductor layer 130 as shown in top views of FIGS. 28G and 28H (that only show the oxide semiconductor layer 130 and the conductive layers 140 and 150). When $W_{OS} \geq W_{SD}$ is satisfied ($W_{SD}$ is smaller than or equal to $W_{OS}$), a gate electric field is easily applied to the entire channel formation region, so that electrical characteristics of the transistor can be improved.

FIGS. 28A to 28F illustrate variation examples of the transistor 101; these examples can also be applied to the other transistors described in this embodiment.

In the transistor with any of the above structures in one embodiment of the present invention, the conductive layer 170 (and the conductive layer 173) serving as a gate electrode layer electrically surrounds the oxide semiconductor layer 130 in the channel width direction with the insulating layer therebetween. Such a structure can increase the on-state current and is referred to as a surrounded channel (s-channel) structure.

In the transistor including the oxide semiconductor layers 130a and 130b and the transistor including the oxide semiconductor layers 130a, 130b, and 130c, selecting appropriate materials for the two or three layers forming the oxide semiconductor layer 130 allows current to flow in the oxide semiconductor layer 130b. Since current flows through the oxide semiconductor layer 130b, the current is hardly influenced by interface scattering, leading to a large on-state current.

A semiconductor device including the transistor with any of the above structures can have favorable electrical characteristics.

The structure described in this embodiment can be used in appropriate combination with the structure described in any of the other embodiments.

Embodiment 5

In this embodiment, components of the transistors shown in Embodiment 3 will be described in detail.

As the substrate 115, a glass substrate, a quartz substrate, a semiconductor substrate, a ceramic substrate, a metal substrate with an insulated surface, or the like can be used. Other examples are a silicon substrate provided with a transistor and/or a photodiode; and a silicon substrate over which an insulating layer, a wiring, a conductor functioning as a contact plug, and the like are provided together with a transistor and/or a photodiode. When a p-channel transistor is formed on a silicon substrate, a silicon substrate with n⁻-type conductivity is preferably used. Alternatively, an SOI substrate including an n⁻-type or i-type silicon layer may be used. Moreover, when a p-channel transistor is formed on a silicon substrate, a surface of the silicon substrate where the transistor is formed preferably has a (110) plane orientation, in which case the mobility can be increased.

The insulating layer 120 can have a function of supplying oxygen to the oxide semiconductor layer 130 as well as a function of preventing diffusion of impurities from a component of the substrate 115. For this reason, the insulating layer 120 preferably contains oxygen and more preferably has an oxygen content higher than that in the stoichiometric composition. The insulating layer 120 is a film in which the amount of released oxygen when converted into oxygen atoms is preferably greater than or equal to $1.0 \times 10^{19}$ atoms/cm³ in TDS analysis. In the TDS analysis, heat treatment is performed such that the film surface temperature ranges from 100° C. to 700° C., preferably from 100° C. to 500° C. When the substrate 115 is provided with another device, the insulating layer 120 also functions as an interlayer insulating film. In that case, the insulating layer 120 is preferably subjected to planarization treatment such as CMP treatment so as to have a flat surface.

As the conductive layer 173 functioning as a back gate electrode layer, a conductive film formed using Al, Ti, Cr, Co, Ni, Cu, Y, Zr, Mo, Ru, Ag, Mn, Nd, Sc, Ta, or W can be used, for example. It is also possible to use an alloy or a conductive nitride of any of the above materials, or a stack including a plurality of materials selected from these materials, alloys of these materials, and conductive nitrides of these materials.

For example, the insulating layer 120 can be formed using an oxide insulating film containing aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film containing silicon nitride, silicon nitride oxide, aluminum nitride, aluminum nitride oxide, or the like; or a mixed material of any of these. The insulating layer 120 may be a stack of any of the above materials.

The oxide semiconductor layer 130 can have a three-layer structure in which the oxide semiconductor layers 130a, 130b, and 130c are stacked in this order from the insulating layer 120 side.

Note that when the oxide semiconductor layer 130 is a single layer, a layer corresponding to the oxide semiconductor layer 130b described in this embodiment is used.

In the case of employing a two-layer structure, the oxide semiconductor layer 130 can be a stack in which a layer corresponding to the oxide semiconductor layer 130a and a layer corresponding to the oxide semiconductor layer 130b are stacked in this order from the insulating layer 120 side. In this structure, the positions of the oxide semiconductor layers 130a and 130b can be interchanged.

For the oxide semiconductor layer 130b, an oxide semiconductor whose electron affinity (energy difference between the vacuum level and the conduction band minimum) is higher than those of the oxide semiconductor layers 130a and 130c is used, for example.

In such a structure, when a voltage is applied to the conductive layer 170, a channel is formed in the oxide semiconductor layer 130b whose conduction band minimum is the lowest in the oxide semiconductor layer 130. Therefore, the oxide semiconductor layer 130b can be regarded as having a region serving as a semiconductor, while the oxide semiconductor layer 130a and the oxide semiconductor layer 130c can be regarded as having a region serving as an insulator or a semi-insulator.

An oxide semiconductor that can be used for each of the oxide semiconductor layers 130a, 130b, and 130c preferably contains at least one of In and Zn, or both In and Zn. In order to reduce variations in electrical characteristics of the transistor including the oxide semiconductor, the oxide semiconductor preferably contains a stabilizer such as Al, Ga, Y, or Sn in addition to In and/or Zn.

For the oxide semiconductor layers 130a and 130c, In—Ga—Zn oxide with an atomic ratio of In to Ga and Zn (In:Ga:Zn) of 1:3:2, 1:3:3, 1:3:4, 1:3:6, 1:4:5, 1:6:4, or 1:9:6 or close to these ratios can be used, for example. For the oxide semiconductor layer 130b, In—Ga—Zn oxide with an atomic ratio In:Ga:Zn of 1:1:1, 2:1:3, 5:5:6, 3:1:2, 3:1:4, 5:1:6, or 4:2:3 or close to these ratios can be used, for example.

The oxide semiconductor layers 130a, 130b, and 130c may include crystal parts. For example, when crystals with c-axis alignment are used, the transistor can have stable electrical characteristics. Moreover, crystals with c-axis alignment are resistant to bending; thus, using such crystals can improve the reliability of a semiconductor device using a flexible substrate.

The conductive layer 140 functioning as a source electrode and the conductive layer 150 functioning as a drain electrode can be formed with a single layer or a stacked layer using a material selected from Al, Cr, Cu, Ta, Ti, Mo, W, Ni, Mn, Nd, and Sc and alloys or conductive nitrides of any of these metal materials, for example. Using tantalum nitride, which is a conductive nitride, can prevent oxidation of the conductive layers 140 and 150. It is also possible to use a stack of any of the above materials and Cu or an alloy such as Cu—Mn, which has low resistance.

The above materials are capable of extracting oxygen from an oxide semiconductor layer. Thus, in a region of the oxide semiconductor layer that is in contact with any of the above materials, oxygen is released from the oxide semiconductor layer and an oxygen vacancy is formed. Hydrogen slightly contained in the oxide semiconductor layer and the oxygen vacancy are bonded to each other, so that the region is markedly changed to an n-type region. Accordingly, the n-type region can serve as a source or a drain of the transistor.

The insulating layer 160 functioning as a gate insulating film can be an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 160 may be a stack including any of the above materials.

As the insulating layers 120 and 160 in contact with the oxide semiconductor layer 130, a film that releases less nitrogen oxide is preferably used. When the oxide semiconductor is in contact with an insulating layer that releases a large amount of nitrogen oxide, the density of states caused by nitrogen oxide becomes high in some cases.

By using the above insulating film as the insulating layers 120 and 160, a shift in the threshold voltage of the transistor can be reduced, which leads to reduced fluctuations in the electrical characteristics of the transistor.

As the conductive layer 170 functioning as a gate electrode layer, a conductive film of Al, Ti, Cr, Co, Ni, Cu, Y, Zr, Mo, Ru, Ag, Mn, Nd, Sc, Ta, or W can be used, for example. An alloy or a conductive nitride of any of these materials can also be used. A stack containing a plurality of materials selected from the above materials, alloys of these materials, and conductive nitrides of these materials can also be used. As a typical example, tungsten, a stack of tungsten and titanium nitride, or a stack of tungsten and tantalum nitride can be used. Alternatively, Cu or an alloy such as Cu—Mn, which has low resistance, or a stack of any of the above materials and Cu or an alloy such as Cu—Mn may be used. For example, titanium nitride can be used for the conductive layer 171 and tungsten can be used for the conductive layer 172 to form the conductive layer 170.

As the conductive layer 170, an oxide conductive layer of In—Ga—Zn oxide, zinc oxide, indium oxide, tin oxide, indium tin oxide, or the like may be used. When the oxide conductive layer is provided in contact with the insulating layer 160, oxygen can be supplied from the oxide conductive layer to the oxide semiconductor layer 130.

The insulating layer 180 can be an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 180 may be a stack of any of the above materials.

Here, like the insulating layer 120, the insulating layer 180 preferably contains oxygen more than that in the stoichiometric composition. Oxygen released from the insulating layer 180 can be diffused into the channel formation region in the oxide semiconductor layer 130 through the insulating layer 160, so that oxygen vacancies formed in the channel formation region can be filled with oxygen. In this manner, stable electrical characteristics of the transistor can be achieved.

A film having an effect of blocking impurities is preferably provided over the transistor or the insulating layer 180. The blocking film can be a silicon nitride film, an aluminum nitride film, an aluminum oxide film, or the like.

A nitride insulating film has a function of blocking moisture and the like and can improve the reliability of the transistor. An aluminum oxide film has a high blocking effect of preventing penetration of both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 130, preventing release of oxygen from the oxide semiconductor layer, and preventing unnecessary release of oxygen from the insulating layer 120.

High integration of a semiconductor device requires transistor miniaturization. However, miniaturization of a transistor tends to cause deterioration of electrical characteristics of the transistor. For example, a decrease in channel width causes a reduction in on-state current.

In the transistor of one embodiment of the present invention, the oxide semiconductor layer 130c can cover the oxide semiconductor layer 130b in which the channel is formed. In this structure, the channel formation layer is not in contact with the gate insulating film; thus, scattering of carriers formed at the interface between the channel formation layer and the gate insulating film can be reduced, and the on-state current of the transistor can be increased.

In the transistor of one embodiment of the present invention, as described above, the gate electrode layer (the conductive layer 170) is formed to electrically surround the oxide semiconductor layer 130 in the channel width direction. Accordingly, a gate electric field is applied to the oxide semiconductor layer 130 in a direction perpendicular to its side surface in addition to a direction perpendicular to its top surface. In other words, a gate electric field is applied to the entire channel formation layer and effective channel width is increased, leading to a further increase in the on-state current.

Although the variety of films such as the metal films, the semiconductor films, and the inorganic insulating films described in this embodiment can be formed typically by a sputtering method or a plasma-enhanced CVD method, such films may be formed by another method such as a thermal CVD method. Examples of a thermal CVD method include a metal organic chemical vapor deposition (MOCVD) method and an atomic layer deposition (ALD) method.

Since plasma is not used for deposition, a thermal CVD method has an advantage that no defect due to plasma damage is generated.

Deposition by a thermal CVD method may be performed in such a manner that a source gas and an oxidizer are supplied to a chamber at a time, the pressure in the chamber is set to an atmospheric pressure or a reduced pressure, and reaction is caused in the vicinity of the substrate or over the substrate.

Deposition by an ALD method is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas together with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of an inert gas, and then the second source gas may be introduced. The first source gas is adsorbed on the surface of the substrate and reacted to form a first layer, and then, the second source gas introduced is adsorbed on the first layer and reacted. As a result, a second layer is stacked over the first layer, so that a thin film is formed. The sequence of the gas introduction is controlled and repeated more than once until a desired thickness is obtained, whereby a thin film with excellent step coverage can be formed. The thickness of the thin film can be adjusted by the number of repetitions of the sequence of gas introduction; therefore, ALD makes it possible to accurately adjust a film thickness and thus is suitable for manufacturing a minute FET.

A facing-target-type sputtering apparatus can be used to form an oxide semiconductor layer. Deposition using a facing-target-type sputtering apparatus can be referred to as vapor deposition sputtering (VDSP).

When an oxide semiconductor layer is deposited using a facing-target-type sputtering apparatus, plasma damage to the oxide semiconductor layer at the time of deposition can be reduced. Thus, oxygen vacancies in the layer can be reduced. In addition, the use of the facing-target-type sputtering apparatus enables low-pressure deposition. Accordingly, the concentration of impurities (e.g., hydrogen, a rare gas such as argon, and water) in a deposited oxide semiconductor layer can be lowered.

The structure described in this embodiment can be used in appropriate combination with the structure described in any of the other embodiments.

Embodiment 6

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in a semiconductor layer of a transistor is called an oxide semiconductor in some cases. That is to say, a metal oxide that has at least one of an amplifying function, a rectifying function, and a switching function can be called a metal oxide semiconductor, or OS for short. In addition, an OS transistor is a transistor including a metal oxide or an oxide semiconductor.

In this specification and the like, a metal oxide including nitrogen is also called a metal oxide in some cases. Moreover, a metal oxide including nitrogen may be called a metal oxynitride.

In this specification and the like, "c-axis aligned crystal (CAAC)" or "cloud-aligned composite (CAC)" may be stated in some cases. CAAC refers to an example of a crystal structure, and CAC refers to an example of a function or a material composition.

In this specification and the like, a CAC-OS or a CAC metal oxide has a conducting function in part of the material and has an insulating function in another part of the material; as a whole, the CAC-OS or the CAC metal oxide has a function of a semiconductor. In the case where the CAC-OS or the CAC metal oxide is used in a semiconductor layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel region of a transistor, high current drive capability in the on state of the transistor, that is, a large on-state current and a high field-effect mobility, can be obtained.

In other words, a CAC-OS or a CAC metal oxide can be called a matrix composite or a metal matrix composite.

<Composition of CAC-OS>

Described below is the composition of a CAC-OS, which can be used for the transistor disclosed in one embodiment of the present invention.

The CAC-OS has, for example, a composition in which elements included in an oxide semiconductor are unevenly distributed. Materials including unevenly distributed elements each have a size greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region including $GaO_{X3}$ as a Main Component and a Region Including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated intentionally, for example. In the case of forming the CAC-OS by a sputtering method, one or more selected from an inert gas (typically, argon), an oxygen gas, and a nitrogen gas may be used as a deposition gas. The flow rate of an oxygen gas to the total flow rate of the deposition gas at the time of deposition is preferably as low as possible, and for example, the flow rate of an oxygen gas is preferably higher than or equal to 0% and lower than 30%, more preferably higher than or equal to 0% and lower than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which the region including $GaO_{X3}$ as a main component and the region including $In_{X2}Zn_{Y2}O_{X2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{X2}$ or $InO_{X1}$ as a main component are separated to form a mosaic pattern.

The conductivity of the region including $In_{X2}Zn_{Y2}O_{X2}$ or $InO_{X1}$ as a main component is higher than that of the region including $GaO_{X3}$ or the like as a main component. In other words, when carriers flow through the region including $In_{X2}Zn_{Y2}O_{X2}$ or $InO_{X1}$ as a main component, the conductivity of an oxide semiconductor is exhibited. Accordingly, when the regions including $In_{X2}Zn_{Y2}O_{X2}$ or $InO_{X1}$ as a main component are distributed in the oxide semiconductor like a cloud, a high field-effect mobility (μ) can be achieved.

In contrast, the insulating property of the region including $GaO_{X3}$ or the like as a main component is higher than that of the region including $In_{X2}Zn_{Y2}O_{X2}$ or $InO_{X1}$ as a main component. In other words, when the regions including $GaO_{X3}$ or the like as a main component are distributed in the oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{X2}$ or $InO_{X1}$ complement each other, whereby a large on-state current ($I_{on}$) and a high field-effect mobility (μ) can be achieved.

A semiconductor element including a CAC-OS has a high reliability. Thus, the CAC-OS is suitably used in a variety of semiconductor devices typified by a display.

At least part of this embodiment can be implemented in combination with any of the other embodiments described in this specification as appropriate.

Embodiment 7

In this embodiment, examples of a package and a camera module each including an image sensor chip are described. For the image sensor chip, the structure of an imaging device of one embodiment of the present invention can be used.

Figure 29A:
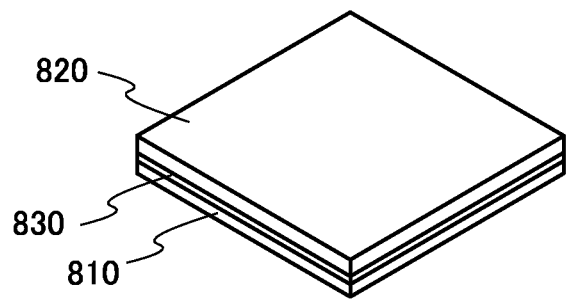
FIGS. 29A to 29D are perspective views and a cross-sectional view illustrating a package including an imaging device.

FIG. 29A is an external perspective view showing the top surface side of a package including an image sensor chip. The package includes a package substrate 810 to which an image sensor chip 850 is fixed, a cover glass 820, an adhesive 830 for bonding the package substrate 810 and the cover glass 820 to each other, and the like.

Figure 29B:
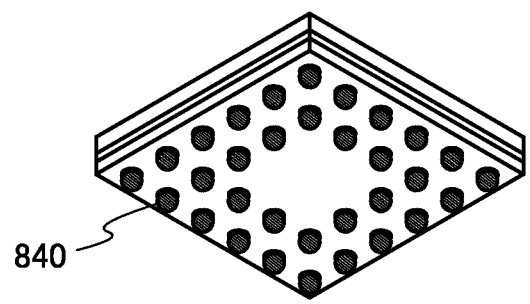

FIG. 29B is an external perspective view showing the bottom surface side of the package. On the bottom surface of the package, a ball grid array (BGA) including solder balls as bumps 840 is formed. Although the BGA is employed here, a land grid array (LGA), a pin grid array (PGA), or the like may be alternatively employed.

Figure 29C:
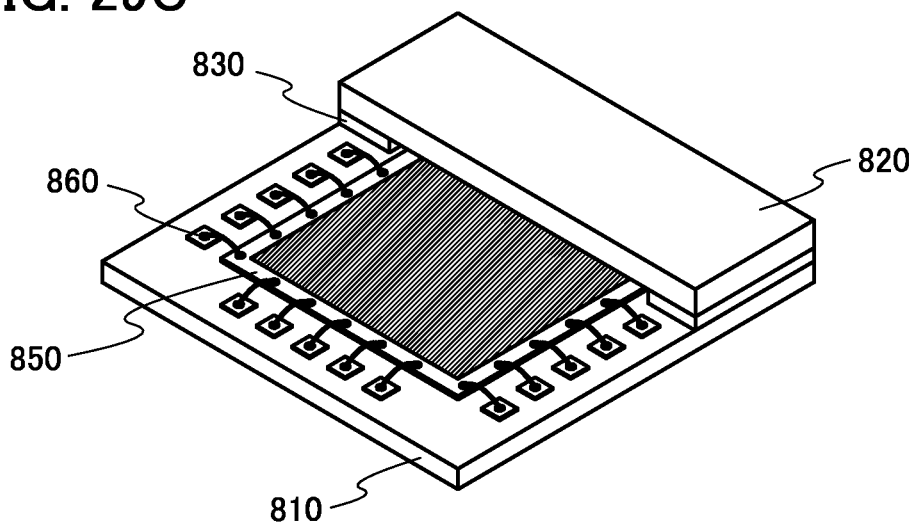
Figure 29D:
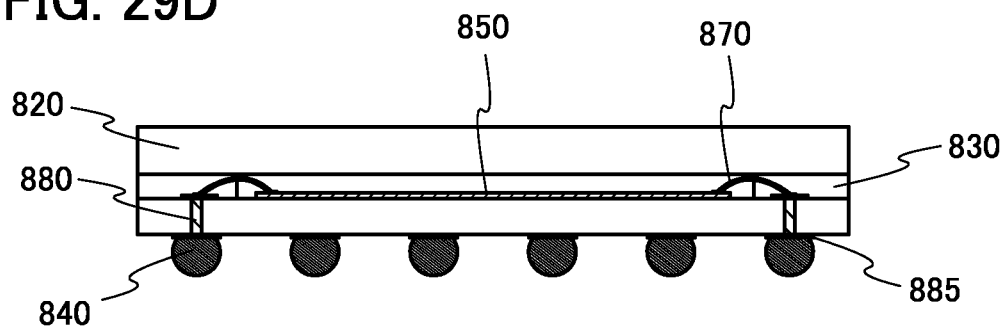

FIG. 29C is a perspective view of the package, in which the cover glass 820 and the adhesive 830 are partly illustrated. FIG. 29D is a cross-sectional view of the package. Electrode pads 860 are formed over the package substrate 810, and electrically connected to the bumps 840 through through-holes 880 and lands 885. The electrode pads 860 are electrically connected to electrodes of the image sensor chip 850 through wires 870.

Figure 30A:
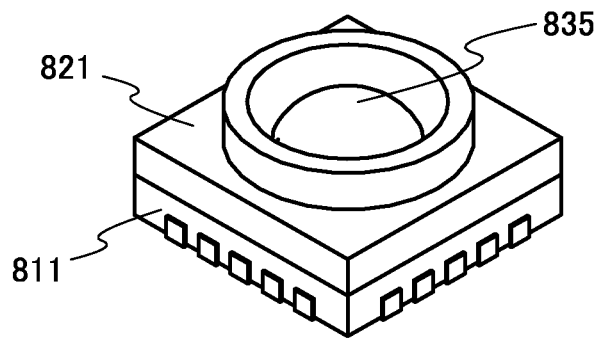
FIGS. 30A to 30D are perspective views and a cross-sectional view illustrating a package including an imaging device.

FIG. 30A is an external perspective view showing the top surface side of a camera module in which an image sensor chip is mounted on a package with a built-in lens. The camera module includes a package substrate 811 to which an image sensor chip 851 is fixed, a lens cover 821, a lens 835, and the like. Furthermore, an IC chip 890 having functions of a driver circuit, a signal conversion circuit, and the like of an imaging device is provided between the package substrate 811 and the image sensor chip 851. Thus, a system in package (SiP) is formed.

Figure 30B:
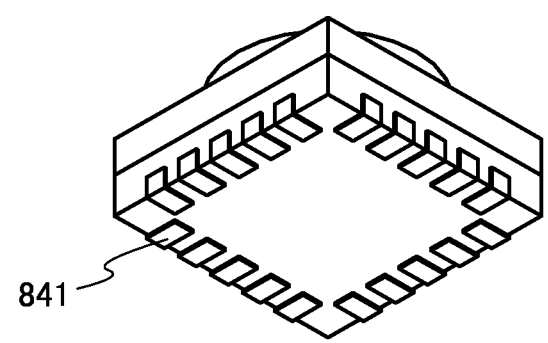

FIG. 30B is an external perspective view showing the bottom surface side of the camera module. On the bottom surface and four side surfaces of the package substrate 811, mounting lands 841 are provided; this structure can be called a quad flat no-lead package (QFN). Although QFN is employed here, a quad flat package (QFP), the above BGA, or the like may be alternatively employed.

Figure 30C:
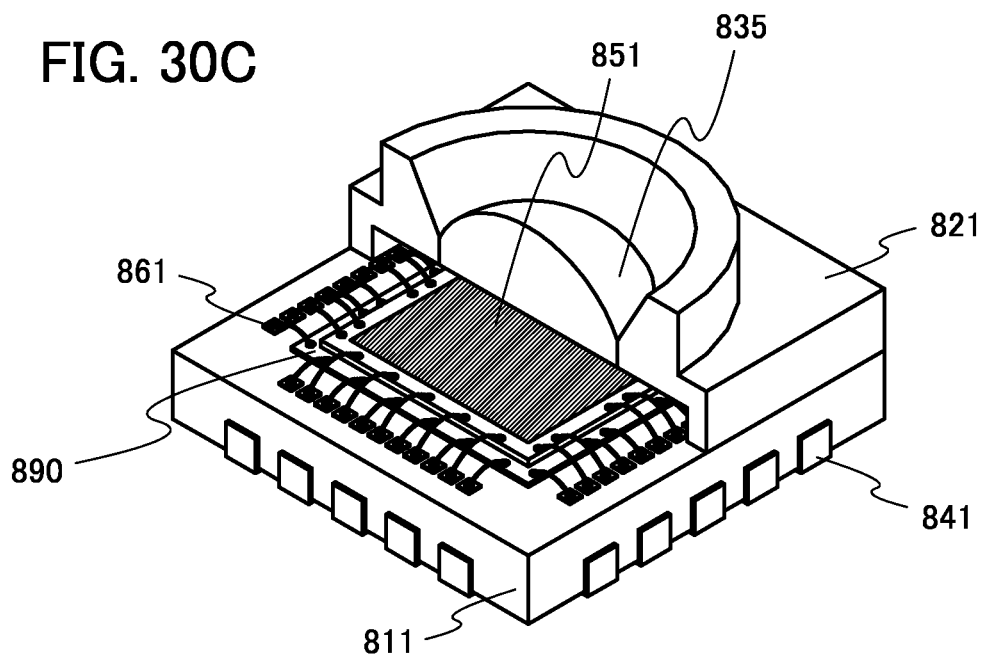
Figure 30D:
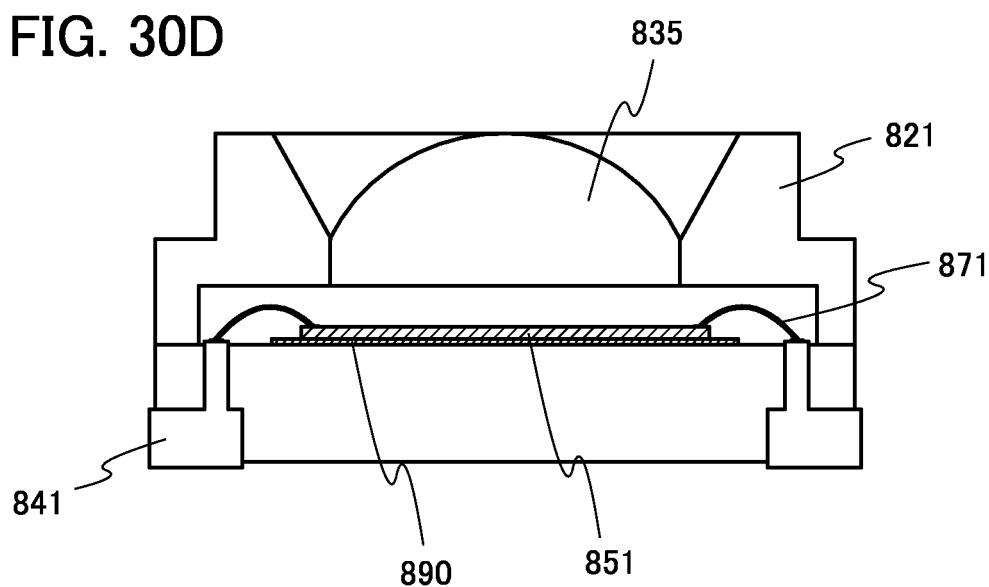

FIG. 30C is a perspective view of the module, in which the lens cover 821 and the lens 835 are partly illustrated. FIG. 30D is a cross-sectional view of the camera module. The lands 841 are partly used as electrode pads 861. The electrode pads 861 are electrically connected to electrodes of the image sensor chip 851 and the IC chip 890 through wires 871.

The image sensor chip placed in the package having the above structure can be easily mounted on and incorporated into a variety of semiconductor devices and electronic devices.

The structures described in this embodiment can be used in appropriate combination with any of the structures described in the other embodiments.

Embodiment 8

Examples of an electronic device that can use the imaging device according to one embodiment of the present invention include display devices, personal computers, image memory devices or image reproducing devices provided with storage media, mobile phones, game machines (including portable game machines), portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIGS. 31A to 31F illustrate specific examples of these electronic devices.

Figure 31A:
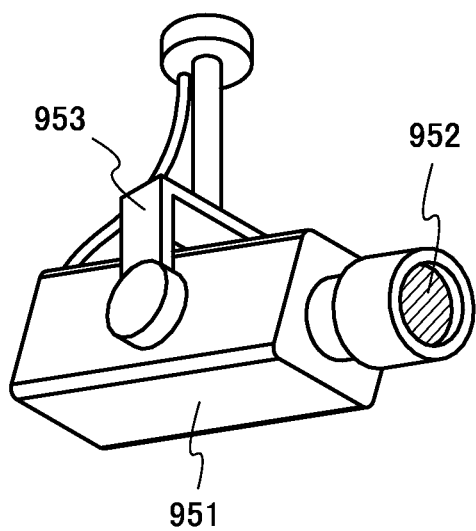
FIGS. 31A to 31F illustrate electronic devices.

FIG. 31A illustrates a monitoring camera, which includes a housing 951, a lens 952, a support portion 953, and the like. The imaging device of one embodiment of the present invention can be included as a component for obtaining an image in the monitoring camera. Note that a "monitoring camera" is a common name and does not limit the uses. For example, a device that has a function of a monitoring camera can also be called a camera or a video camera.

Figure 31B:
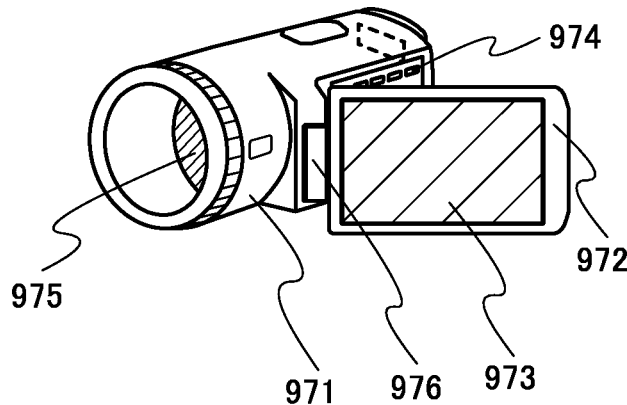

FIG. 31B illustrates a video camera, which includes a first housing 971, a second housing 972, a display portion 973, operation keys 974, a lens 975, a joint 976, and the like. The operation keys 974 and the lens 975 are provided for the first housing 971, and the display portion 973 is provided for the second housing 972. The imaging device of one embodiment of the present invention can be included as a component for obtaining an image in the video camera.

Figure 31C:
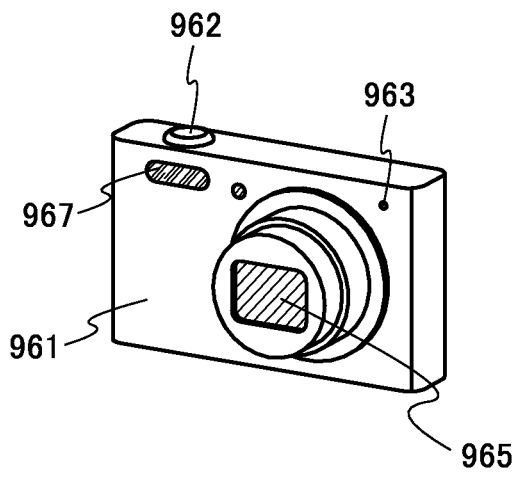

FIG. 31C illustrates a digital camera, which includes a housing 961, a shutter button 962, a microphone 963, a light-emitting portion 967, a lens 965, and the like. The imaging device of one embodiment of the present invention can be included as a component for obtaining an image in the digital camera.

Figure 31D:
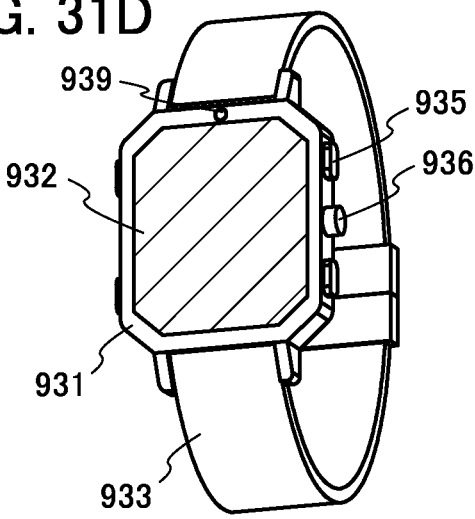

FIG. 31D illustrates a wrist-watch-type information terminal, which includes a housing 931, a display portion 932, a wristband 933, operation buttons 935, a winder 936, a camera 939, and the like. The display portion 932 may be a touch panel. The imaging device of one embodiment of the present invention can be included as a component for obtaining an image in the information terminal.

Figure 31E:
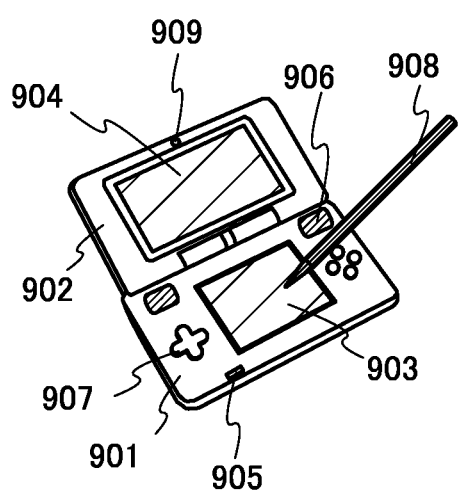

FIG. 31E illustrates a portable game machine, which includes housings 901 and 902, display portions 903 and 904, a microphone 905, speakers 906, an operation key 907, a stylus 908, a camera 909, and the like. Although the portable game machine in FIG. 31E has the two display portions 903 and 904, the number of display portions included in a portable game machine is not limited to this. The imaging device of one embodiment of the present invention can be included as one component for obtaining an image in the portable game machine.

Figure 31F:
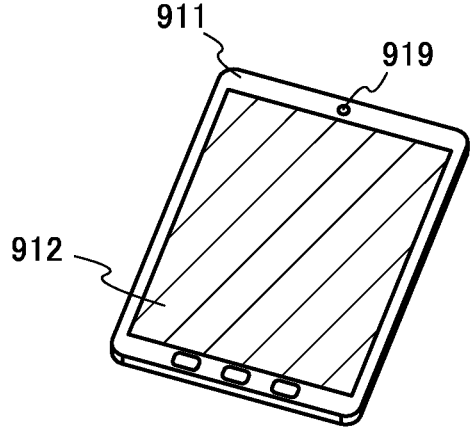

FIG. 31F illustrates a portable data terminal, which includes a housing 911, a display portion 912, a camera 919, and the like. A touch panel function of the display portion 912 enables input and output of information. The imaging device of one embodiment of the present invention can be included as one component for obtaining an image in the portable data terminal.

REFERENCE NUMERALS a1: output signal, a2: output signal, b1: output signal, c1: output signal, C1: capacitor, C2: capacitor, C3: capacitor, CN1: counter circuit, CN2: counter circuit, cnt1: output signal, Fn1: floating node, G1: scan line, G2: scan line, OUT1: signal line, R1: resistor, Vbias2: terminal, Wd1: signal line, Wd2: signal line, 10: imaging element, 12: circuit, 20: pixel, 20*a*: determination circuit, 20A: pixel, 20B: pixel, 20C: pixel, 21: light-receiving circuit, 21*a*: light-receiving circuit, 22: amplifier circuit, 22*a*: amplifier circuit, 22*b*: memory circuit, 22*c*: adder circuit, 23: memory circuit, 26: A/D converter circuit, 26*a*: comparator, 26*b*: counter circuit, 27: decoder circuit, 28: selector circuit, 29: control portion, 30: feature extraction circuit, 30*a*: operational amplifier, 30N: synapse circuit, 31: determination output circuit, 31*a*: arithmetic circuit, 31*b*: memory circuit, 31N: activation function circuit, 32: feature extraction circuit, 32*a*: input selection circuit, 32*b*: inverter, 32*c*: counter circuit, 32N: synapse circuit, 33: output circuit, 33*a*: determination circuit, 33*b*: circuit, 33*c*: memory circuit, 37: terminal, 38: terminal, 41: transistor, 42: transistor, 43: transistor, 44: transistor, 44*a*: transistor, 44*b*: transistor, 45*a*: transistor, 45*b*: transistor, 46: transistor, 47: transistor, 48: transistor, 49: transistor, 69: wiring, 80: insulating layer, 81: insulating layer, 81*a*: insulating layer, 81*b*: insulating layer, 81e: insulating layer, 81g: insulating layer, 81h: insulating layer, 82: conductor, 82a: conductor, 82b: conductor, 93: wiring, 100: imaging device, 101: transistor, 102: transistor, 103: transistor, 104: transistor, 105: transistor, 106: transistor, 107: transistor, 115: substrate, 120: insulating layer, 130: oxide semiconductor layer, 130a: oxide semiconductor layer, 130b: oxide semiconductor layer, 130c: oxide semiconductor layer, 130d: oxide semiconductor layer, 140: conductive layer, 145: insulating layer, 150: conductive layer, 155: insulating layer, 160: insulating layer, 170: conductive layer, 171: conductive layer, 172: conductive layer, 173: conductive layer, 180: insulating layer, 200: conductor, 201: conductor, 210: insulating layer, 231: region, 232: region, 300: amplifier circuit, 301: input selection circuit, 302: A/D converter circuit, 303: determination circuit, 304: memory circuit, 305: selection circuit, 306: logic circuit, 310: determination output circuit, 405: metal layer, 406: metal layer, 561: photoelectric conversion layer, 562: light-transmitting conductive layer, 563: semiconductor layer, 564: semiconductor layer, 565: semiconductor layer, 566: electrode, 566a: conductive layer, 566b: conductive layer, 567: partition wall, 568: hole-injection blocking layer, 569: electron-injection blocking layer, 571: wiring, 571a: conductive layer, 571b: conductive layer, 588: wiring, 600: silicon substrate, 620: p$^+$ region, 630: p$^-$ region, 640: n-type region, 650: p$^+$ region, 660: semiconductor layer, 810: package substrate, 811: package substrate, 820: cover glass, 821: lens cover, 830: adhesive, 835: lens, 840: bump, 841: land, 850: image sensor chip, 851: image sensor chip, 860: electrode pad, 861: electrode pad, 870: wire, 871: wire, 880: through-hole, 885: land, 890: IC chip, 901: housing, 902: housing, 903: display portion, 904: display portion, 905: microphone, 906: speaker, 907: operation key, 908: stylus, 909: camera, 911: housing, 912: display portion, 919: camera, 931: housing, 932: display portion, 933: wristband, 935: button, 936: winder, 939: camera, 951: housing, 952: lens, 953: support portion, 961: housing, 962: shutter button, 963: microphone, 965: lens, 967: light-emitting portion, 971: housing, 972: housing, 973: display portion, 974: operation key, 975: lens, 976: joint, 1530: light-blocking layer, 1540: microlens array, 1550a: optical conversion layer, 1550b: optical conversion layer, and 1550c: optical conversion layer.

This application is based on Japanese Patent Application Serial No. 2016-153192 filed with Japan Patent Office on Aug. 3, 2016, and Japanese Patent Application serial No. 2016-153194 filed with Japan Patent Office on Aug. 3, 2016, the entire contents of which are hereby incorporated by reference.

The invention claimed is:

1. An imaging device comprising a plurality of circuits, wherein the plurality of circuits each comprises:
a plurality of pixels; and
a first circuit configured to perform an arithmetic operation using a plurality of first signals output from the plurality of pixels,
wherein the plurality of pixels each comprises:
a second circuit configured to generate a second signal;
a third circuit configured to retain a potential corresponding to a weight coefficient; and
an operation circuit configured to receive the potential corresponding to the weight coefficient and to multiply the second signal by the weight coefficient, so that one of the first signals is generated,
wherein the second circuit comprises a first transistor,
wherein the third circuit comprises a second transistor and a capacitor,
wherein the operation circuit comprises a third transistor, and
wherein the operation circuit is electrically connected to one of a source and a drain of the second transistor and one electrode of the capacitor.

2. The imaging device according to claim 1, wherein the second circuit further comprises a photoelectric conversion element,
wherein the first transistor is configured to control an output of the second signal in accordance with an output signal from the photoelectric conversion element, and
wherein a layer comprising the first transistor is located over a layer comprising the first circuit, and the photoelectric conversion element is located over the layer comprising the first transistor.

3. The imaging device according to claim 1, wherein the operation circuit comprises at least a part of a neural network.

4. An imaging device comprising a plurality of pixels;
wherein the plurality of pixels each comprises:
a first circuit configured to generate a first signal;
a second circuit configured to retain a potential corresponding to a weight coefficient; and
an operation circuit configured to receive the potential corresponding to the weight coefficient and to multiply the first signal by the weight coefficient, so that an output signal is generated,
wherein the first circuit comprises a first transistor,
wherein the first circuit further comprises a photoelectric conversion element,
wherein the first transistor is configured to control an output of the first signal in accordance with an output signal from the photoelectric conversion element,
wherein the second circuit comprises a second transistor and a capacitor,
wherein the operation circuit comprises a third transistor,
wherein the operation circuit is electrically connected to one of a source and a drain of the second transistor and one electrode of the capacitor, and
wherein a layer comprising the first transistor is located over a layer comprising the operation circuit, and the photoelectric conversion element is located over the layer comprising the first transistor.

5. The imaging device according to claim 4, wherein the operation circuit comprises at least a part of a neural network.

* * * * *